(12) United States Patent
Asaoka

(10) Patent No.: US 11,705,168 B2
(45) Date of Patent: Jul. 18, 2023

(54) SEMICONDUCTOR DEVICE, SYSTEM, AND OPERATION CONTROL METHOD EXECUTED BY SEMICONDUCTOR DEVICE

(71) Applicant: Kioxia Corporation, Tokyo (JP)

(72) Inventor: Norichika Asaoka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/471,302

(22) Filed: Sep. 10, 2021

(65) Prior Publication Data

US 2022/0277779 A1    Sep. 1, 2022

(30) Foreign Application Priority Data

Mar. 1, 2021  (JP) ................. 2021-031842

(51) Int. Cl.
  *G11C 7/10*    (2006.01)
  *G11C 8/06*    (2006.01)

(52) U.S. Cl.
  CPC ............ *G11C 7/1063* (2013.01); *G11C 7/109* (2013.01); *G11C 8/06* (2013.01)

(58) Field of Classification Search
  CPC .......... G11C 7/1063; G11C 7/109; G11C 8/06
  See application file for complete search history.

(56) References Cited

U.S. PATENT DOCUMENTS

| | | | |
|---|---|---|---|
| 9,799,402 B2* | 10/2017 | Kim ....................... | G11C 16/10 |
| 10,726,911 B2 | 7/2020 | Hyodo et al. | |
| 11,158,382 B2* | 10/2021 | Imamoto ................ | G11C 16/10 |
| 2018/0240515 A1* | 8/2018 | Shibata .................. | G11C 16/32 |

FOREIGN PATENT DOCUMENTS

JP    2019169205 A    10/2019

* cited by examiner

*Primary Examiner* — Han Yang
(74) *Attorney, Agent, or Firm* — Holtz, Holtz & Volek PC

(57) ABSTRACT

According to an embodiment, a semiconductor device includes a control circuit. The control circuit is configured to receive a first command and execute, based on the first command, a first operation and a second operation. The second operation is executed after the first operation. The control circuit is further configured to output a first signal from a start of the first operation to a start of the second operation. The first signal indicates that the semiconductor device is in a busy state in which the semiconductor device refrains from accepting, from an external controller, a second command for execution of the first operation and a third command for execution of the second operation.

17 Claims, 26 Drawing Sheets

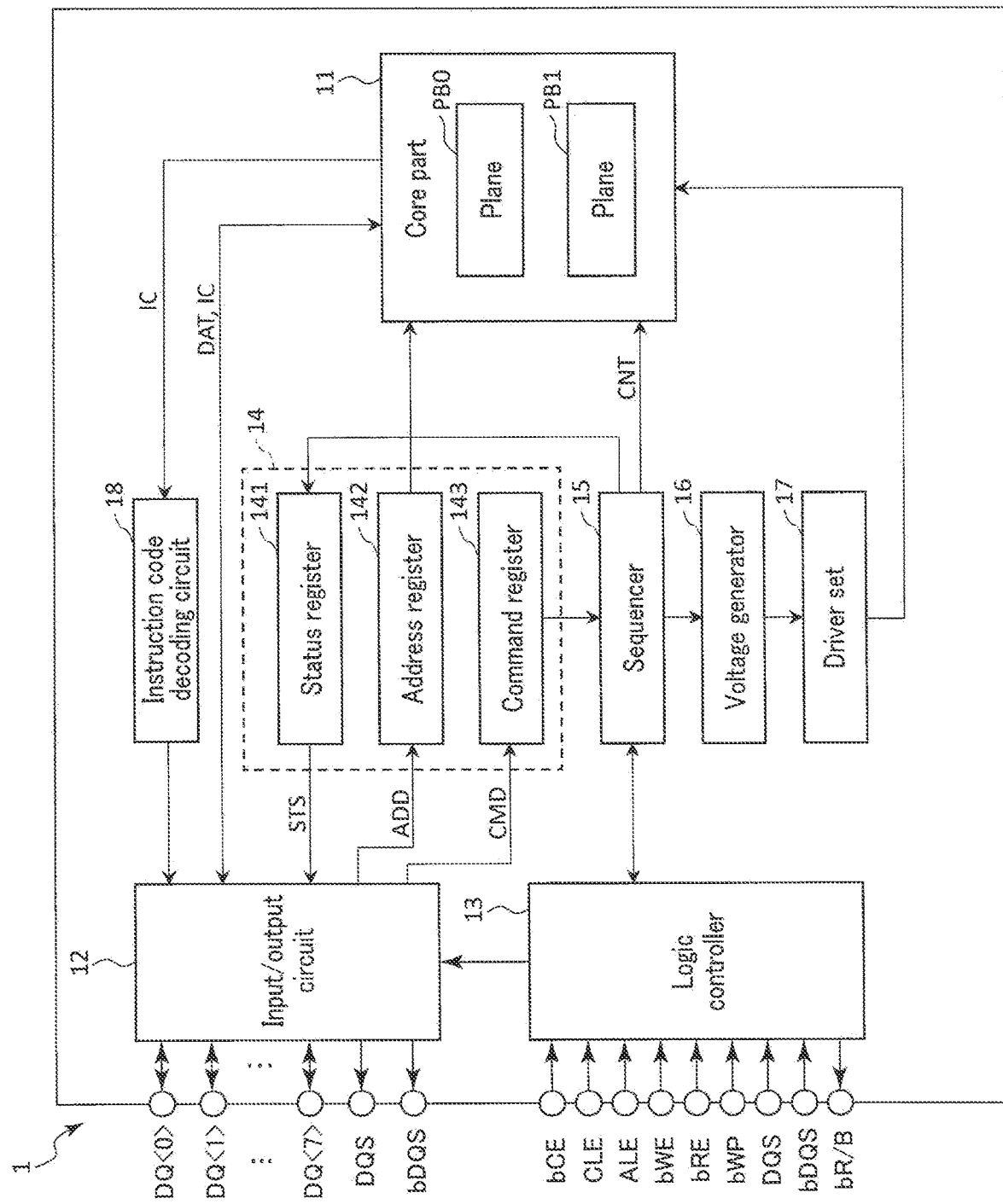
F I G. 2

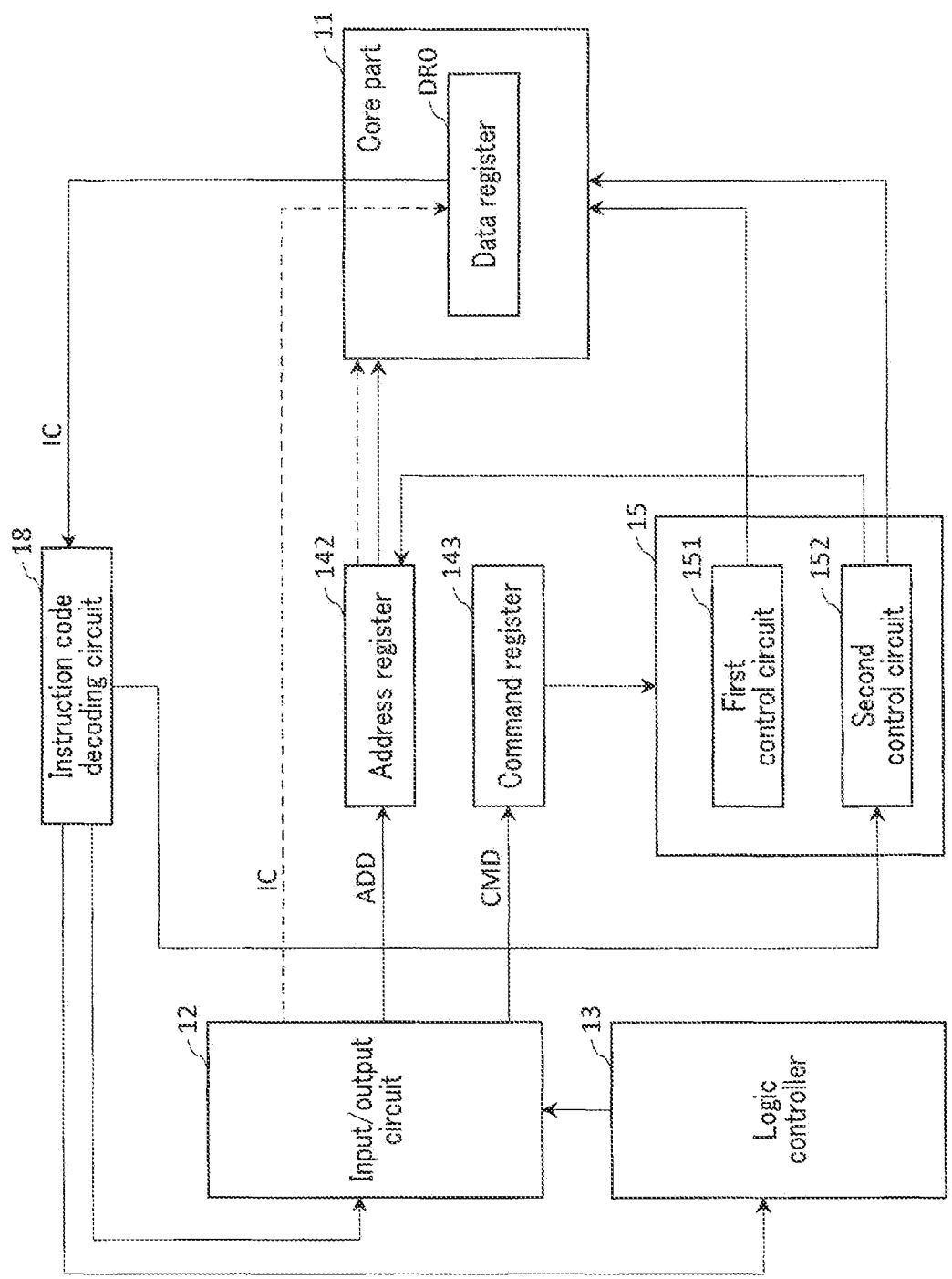
F I G. 9

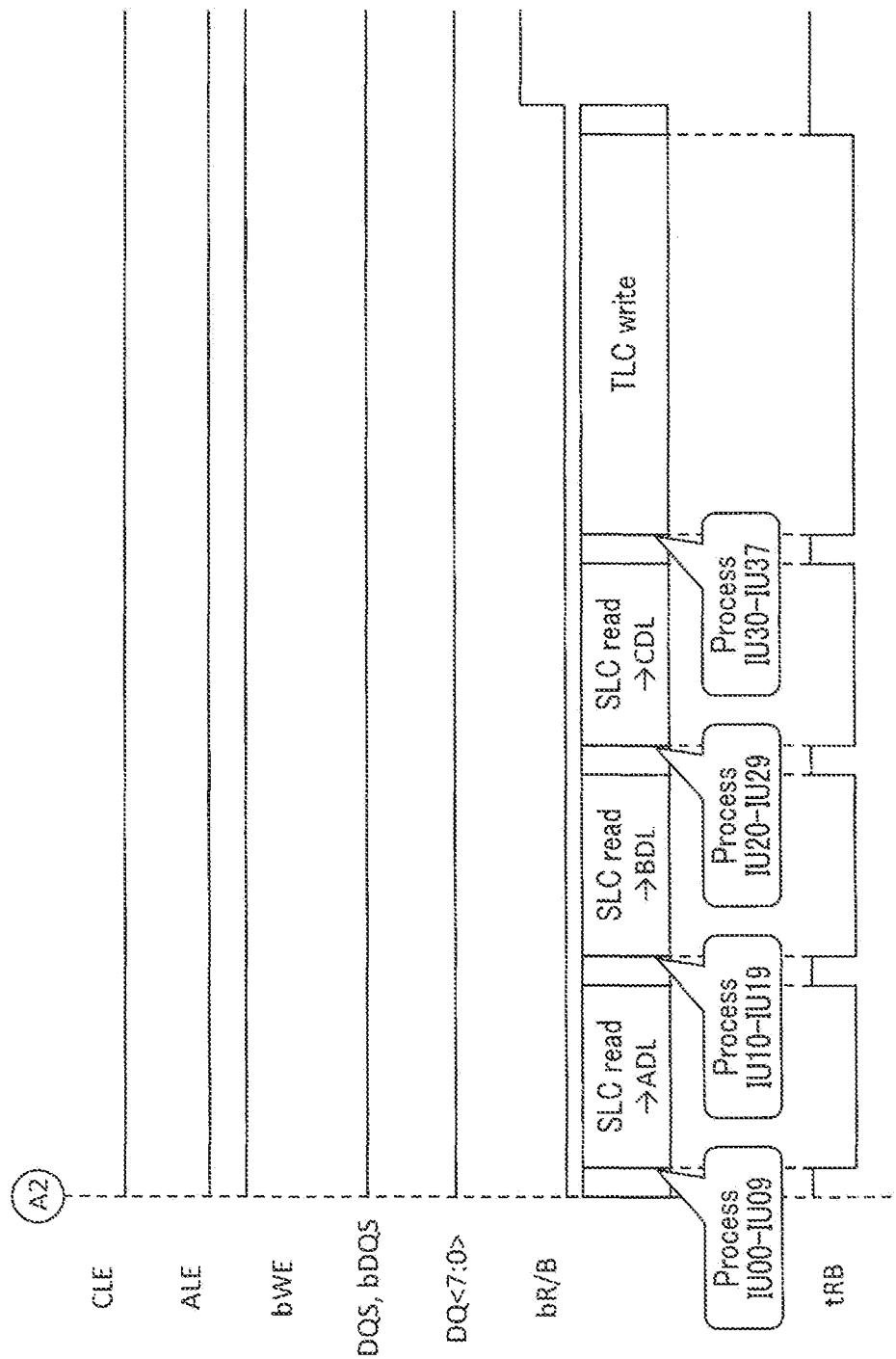
F I G. 13

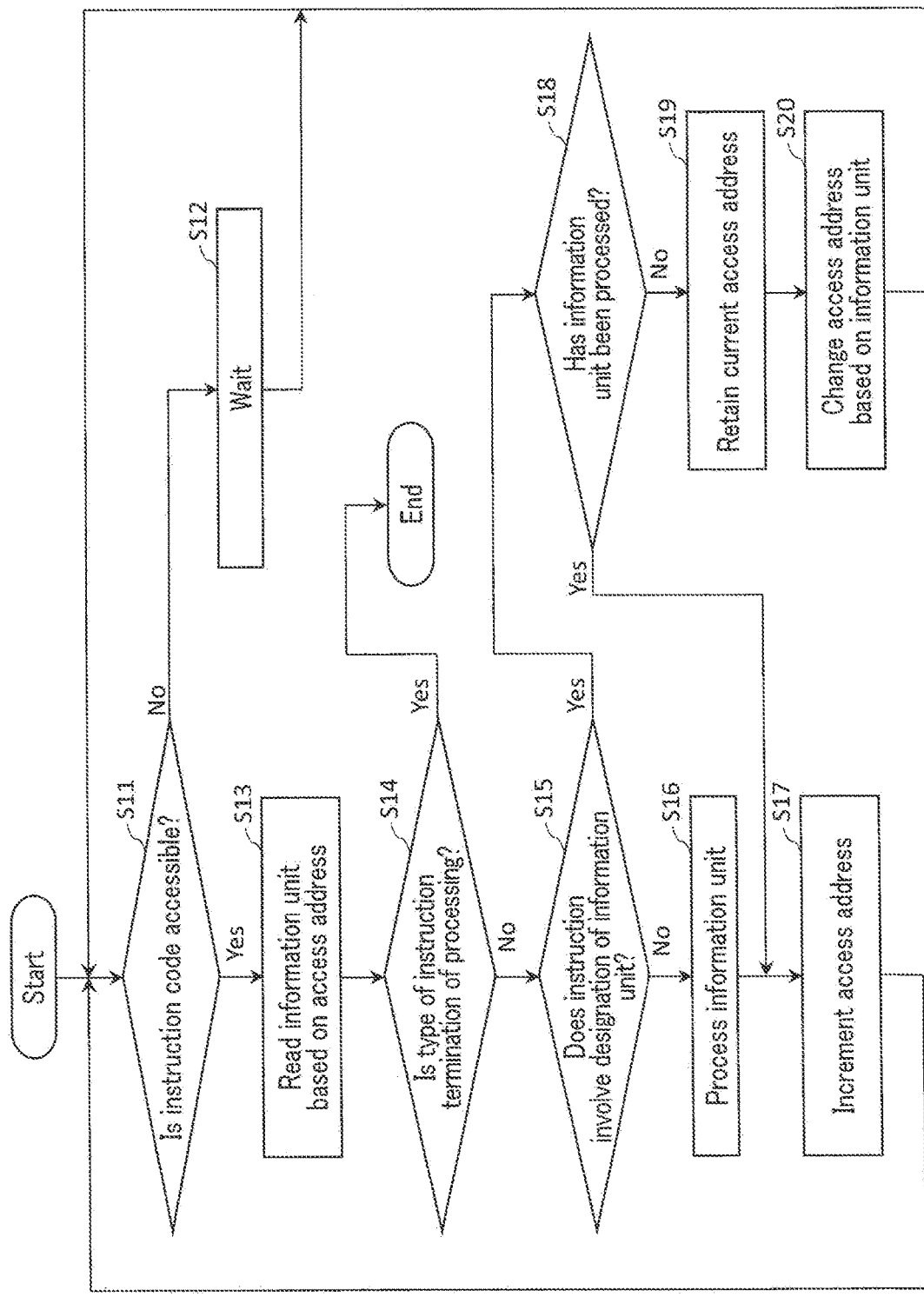
F I G. 14

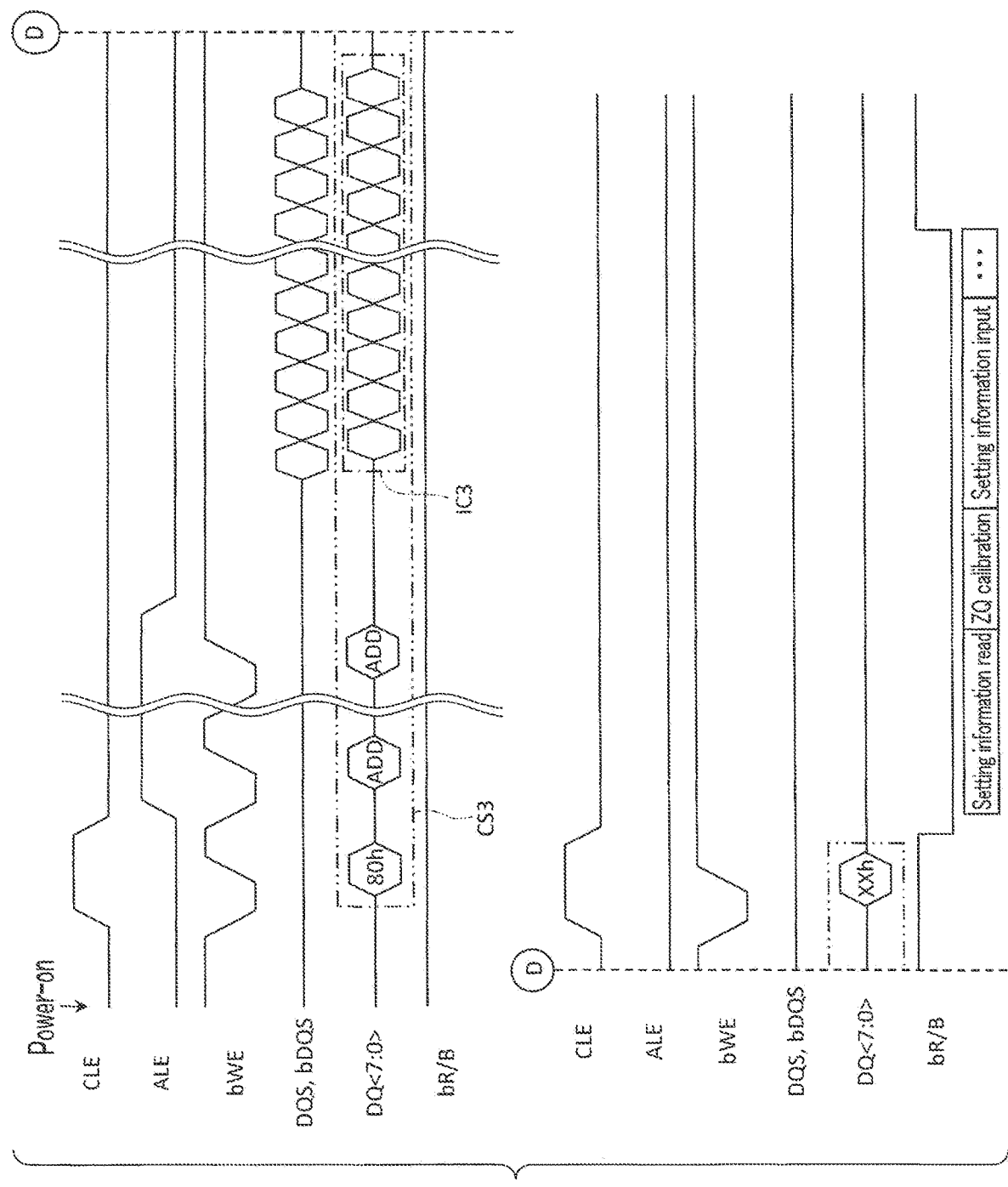
F I G. 19

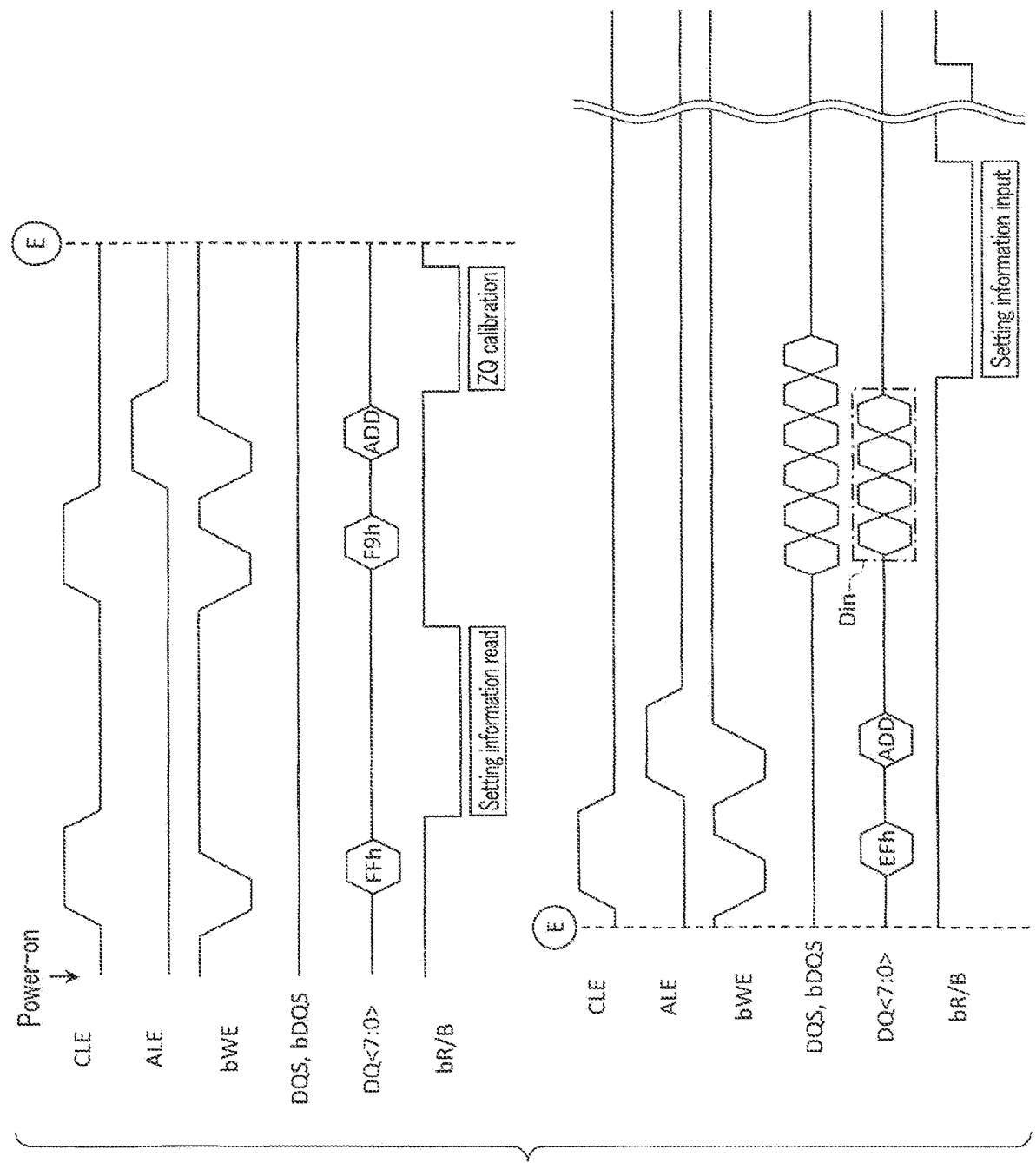
F I G. 20

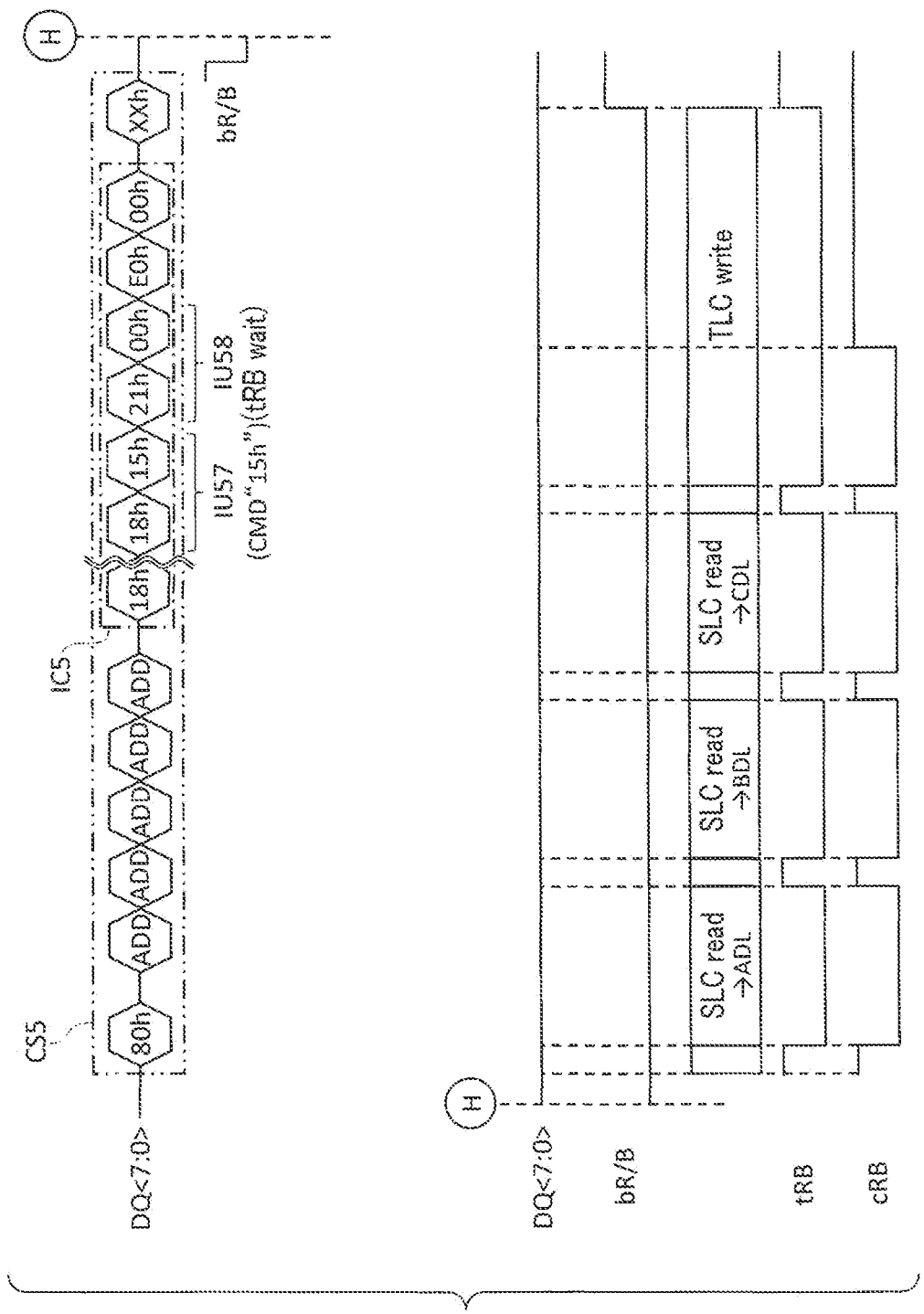
F I G. 24

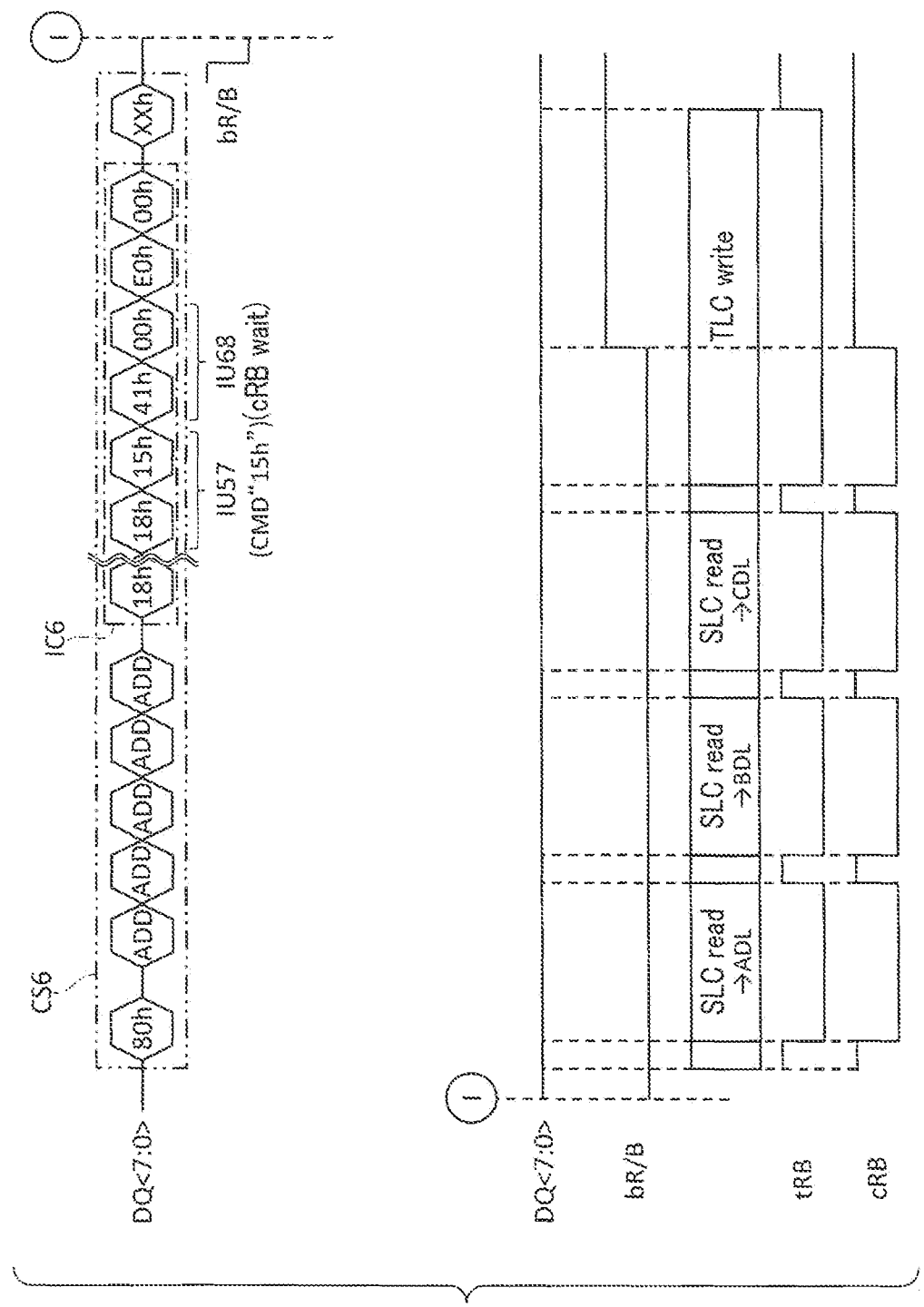
F I G. 25

SEMICONDUCTOR DEVICE, SYSTEM, AND OPERATION CONTROL METHOD EXECUTED BY SEMICONDUCTOR DEVICE

CROSS-REFERENCE TO RELATED APPLICATIONS

This application is based upon and claims the benefit of priority from Japanese Patent Application No. 2021-031842, filed Mar. 1, 2021, the entire contents of which are incorporated herein by reference.

FIELD

Embodiments generally relate to a semiconductor device, system, and operation control method executed by a semiconductor device.

BACKGROUND

As a semiconductor memory device, a NAND flash memory is known.

BRIEF DESCRIPTION OF THE DRAWINGS

FIG. 2 is a block diagram showing an example of a configuration of the semiconductor memory device according to the first embodiment.

FIG. 9 is a block diagram showing an example of a configuration relating to retaining and reading of an instruction code in the semiconductor memory device according to the first embodiment.

FIG. 13 shows an example of a timing chart showing temporal changes of various signals, which relate to the operation example in which the semiconductor memory device according to the first embodiment operates based on the instruction code.

FIG. 14 is a flow chart showing an example of an operation executed by the semiconductor memory device according to the first embodiment to achieve processing relating to each information unit by the semiconductor memory device.

FIG. 19 shows an example of a timing chart showing a command set and temporal changes of other various signals, which relate to an operation example in which a semiconductor memory device according to a first modification of the first embodiment operates based on an instruction code.

FIG. 20 shows an example of a timing chart showing a command set and temporal changes of other various signals, which relate to various operations sequentially executed by a semiconductor memory device according to a comparative example of the first modification of the first embodiment.

FIG. 24 shows an example of a timing chart showing a command set and temporal changes of other various signals, which relate to an operation example in which a semiconductor memory device according to a third modification of the first embodiment operates based on an instruction code.

FIG. 25 shows an example of a timing chart showing a command set and temporal changes of other various signals, which relate to another operation example in which the semiconductor memory device according to the third modification of the first embodiment operates based on an instruction code.

DETAILED DESCRIPTION

In general, according to an embodiment, a semiconductor device includes a control circuit. The control circuit is configured to receive a first command and execute, based on the first command, a first operation and a second operation. The second operation is executed after the first operation. The control circuit is further configured to output a first signal from a start of the first operation to a start of the second operation. The first signal indicates that the semiconductor device is in a busy state in which the semiconductor device refrains from accepting, from an external controller, a second command for execution of the first operation and a third command for execution of the second operation.

Hereinafter, embodiments will be described with reference to the accompanying drawings. In the following description, constituent elements having the same function and configuration will be assigned a common reference symbol. When multiple constituent elements with a common reference symbol need to be distinguished from one another, suffixes are added after the common reference symbol for distinction. When the constituent elements need not be particularly distinguished from one another, the constituent elements are assigned only the common reference symbol without suffixes.

Each function block can be implemented in the form of hardware, software, or a combination thereof. The function blocks are not necessarily be separated from one another as described below. For example, some functions may be executed by function blocks different from those described as an example. In addition, the function block described as an example may be divided into smaller function sub-blocks. The names of the function blocks and constituent elements in the following description are assigned for convenience, and do not limit the configurations or operations of the function blocks and constituent elements.

First Embodiment

A semiconductor memory device 1 according to a first embodiment will be described below.

Configuration Example (1) Memory System

Figure 1:
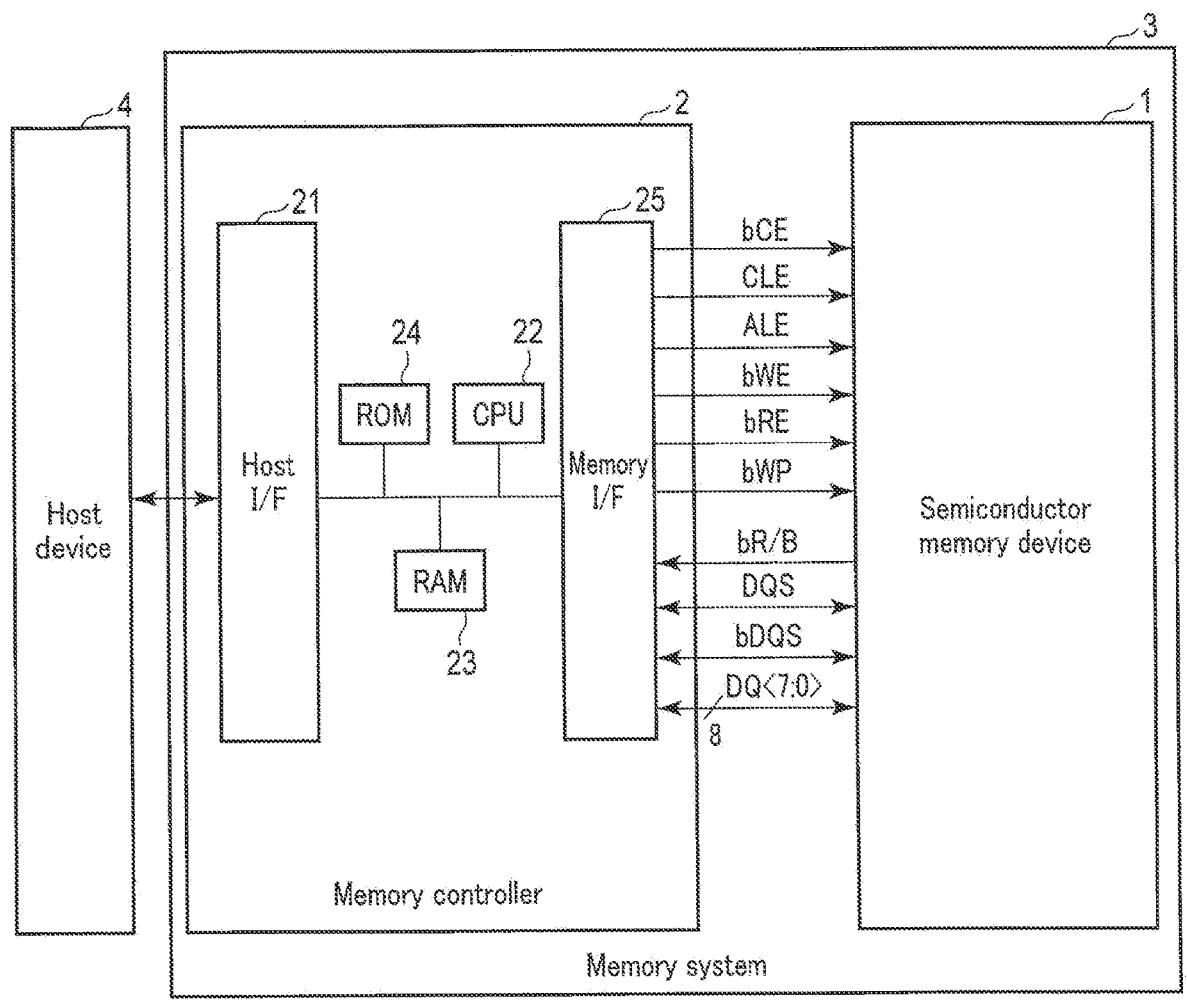
FIG. 1 is a block diagram showing an example of a configuration of a memory system including a semiconductor memory device according to a first embodiment.

FIG. 1 is a block diagram showing an example of a configuration of a memory system 3 including the semiconductor memory device 1 according to the first embodiment.

The memory system 3 includes a memory controller 2, as well as the semiconductor memory device 1, and is controlled by a host device 4. The memory system 3 is, for example, a solid state drive (SSD) or an SD™ card.

The semiconductor memory device 1 is controlled by the memory controller 2. The memory controller 2 receives a host command from the host device 4, and controls the semiconductor memory device 1 based on the host command.

The memory controller 2 includes a host interface circuit 21, a central processing unit (CPU) 22, a random access memory (RAM) 23, a read only memory (ROM) 24, and a memory interface circuit 25. The memory controller 2 is configured as, for example, a system-on-a-chip (SoC).

The ROM 24 stores firmware (a program). The RAM 23 can retain the firmware and is used as a work area of the CPU 22. The RAM 23 also temporarily retains data and functions as a buffer and a cache. The firmware stored in the ROM 24 and loaded onto the RAM 23 is executed by the CPU 22. The memory controller 2 thereby executes various operations including a write operation, a read operation, and the like, as well as some functions of the host interface circuit 21 and the memory interface circuit 25.

The host interface circuit 21 is coupled to the host device 4 via a host interface, and manages communication between the memory controller 2 and the host device 4. For example, the host interface circuit 21 receives a host command sent from the host device 4 to the memory controller 2. The memory interface circuit 25 is coupled to the semiconductor memory device 1 via a memory interface, and manages communication between the memory controller 2 and the semiconductor memory device 1. The memory interface transmits, for example, a chip enable signal bCE, a command latch enable signal CLE, an address latch enable signal ALE, a write enable signal bWE, a read enable signal bRE, a write protect signal bWP, a ready/busy signal bR/B, input/output timing control signals DQS and bDQS, and signals DQ<0> to DQ<7>. Hereinafter, the signals DQ<0> to DQ<7> will be referred to as signals DQ<7:0>.

The signals DQS and bDQS have the following relationship: while the voltage of the signal DQS is at a high (H) level, the voltage of the signal bDQS is at a low (L) level, and while the voltage of the signal DQS is at the L level, the voltage of the signal bDQS is at the H level. Hereinafter, when the term "level" is used, the "level" refers to a voltage level as in the above case, as long as there is no special description to the contrary.

The memory interface circuit 25 generates a command set based on a host command from the host device 4 for example, and transmits the command set to the semiconductor memory device 1 via the signals DQ<7:0>. The command set includes, for example, a command and address information. The command set may include data in addition to the command and address information. The data may include an instruction code. The instruction code is generated by the memory interface circuit 25 based on, for example, a host command.

The command set and/or instruction code are/is not limited to the one generated based on a host command. The instruction code is not limited to the one generated by the memory interface circuit 25, and may be generated by another constituent element included in the memory controller 2.

(2) Semiconductor Memory Device

FIG. 2 is a block diagram showing an example of a configuration of the semiconductor memory device 1 according to the first embodiment. The semiconductor memory device 1 according to the first embodiment is, for example, a NAND flash memory capable of nonvolatilely storing data.

The semiconductor memory device 1 includes, for example, a core part 11, an input/output circuit 12, a logic controller 13, a register 14, a sequencer 15, a voltage generator 16, a driver set 17, and an instruction code decoding circuit 18.

The core part 11 includes a plurality of planes PB (planes PB0 and PB1 are shown in FIG. 2). Each plane PB includes a memory cell array. In the semiconductor memory device 1, various operations are performed, such as a write operation to store write data DAT in a memory cell array of a plane, and a read operation to read read data DAT from a memory cell array of a plane.

The input/output circuit 12 controls input and output of signals DQ<7:0> from and to the memory controller 2 and controls signals DQS and bDQS. The signals DQ<7:0> include a command CMD, data DT, address information ADD, and status information STS. Examples of the command CMD include a command for causing the semiconductor memory device 1 to execute processing corresponding to a host command from the host device 4. The data DT includes write data DAT, read data DAT, or an instruction code IC. The address information ADD includes, for example, a row address and a column address. The row address includes, for example, a block address and a page address. The block address includes, for example, a plane address. Hereinafter, let us assume that the block address includes a plane address. The status information STS includes, for example, information on a result of a write operation, read operation, or the like executed in the semiconductor memory device 1. The signals DQS and bDQS, which may be controlled by the input/output circuit 12, are used for enabling input of signals DQ<7:0> by the memory interface circuit 25.

The input and output of signals DQ<7:0> by the input/output circuit 12 will be specifically described. The input/output circuit 12 receives write data DAT, a command CMD, and address information ADD from the memory controller 2, transfers the write data DAT to the core part 11, and transfers the address information ADD and command CMD to the register 14. The input/output circuit 12 receives status information STS from the register 14, and receives read data DAT from the core part 11. The input/output circuit 12 transmits the read data DAT to the memory controller 2 while toggling signals DQS and bDQS between the H level and the L level. The description of the case where the input/output circuit 12 receives write data DAT applies to the case where the input/output circuit 12 receives an instruction code IC from the memory controller 2.

The logic controller 13 receives from the memory controller 2, for example, a chip enable signal bCE, a command latch enable signal CLE, an address latch enable signal ALE, a write enable signal bWE, a read enable signal bRE, a write protect signal bWP, and signals DQS and bDQS. The logic controller 13 controls the input/output circuit 12 and the sequencer 15 based on the received signals.

The chip enable signal bCE is used for enabling the semiconductor memory device 1. The command latch enable signal CLE is used for notifying the input/output circuit 12 of a period during which a command CMD is transmitted via signals DQ<7:0> input to the semiconductor memory device 1. The address latch enable signal ALE is used for notifying the input/output circuit 12 of a period during which address information ADD is transmitted via signals DQ<7:0> input to the semiconductor memory device 1. The write enable signal bWE is used for enabling input of signals DQ<7:0> by the input/output circuit 12. The write enable signal bWE is toggled between the H level and the L level, for example while a command CMD or address information ADD is being transmitted via signals DQ<7:0>. The toggling indicates timing of transmission of a command CMD or address information ADD to the semiconductor memory device 1. The read enable signal bRE is used for enabling output of signals DQ<7:0> by the input/output circuit 12. The write protect signal bWP is used for prohibiting data writing and erasure in the semiconductor memory device 1. The signals DQS and bDQS input to the logic controller 13 are used for enabling input of signals DQ<7:0> by the input/output circuit 12. The signals DQS and bDQS are toggled between the H level and the L level by the memory controller 2, for example while write data DAT or an instruction code IC is being transmitted via signals DQ<7:0>. The toggling indicates timing of transmission of write data DAT or an instruction code IC to the semiconductor memory device 1.

The logic controller 13 generates a ready/busy signal bR/B in accordance with control by the sequencer 15, and transmits the ready/busy signal bR/B to the memory controller 2. While the semiconductor memory device 1 is in a ready state, i.e., while the semiconductor memory device 1 accepts commands from the memory controller 2, the ready/busy signal bR/B is at the H level. While the semiconductor memory device 1 is in a busy state, i.e., while the semiconductor memory device 1 does not accept commands that have exceptions from the memory controller 2, the ready/busy signal bR/B is at the L level.

Herein, it is assumed that the ready/busy signal bR/B output by the semiconductor memory device 1 is the same as the ready/busy signal bR/B received by the memory controller 2; however, the present embodiment is not limited to this. For example, the case where the memory system 3 includes a plurality of semiconductor memory devices each having a configuration equivalent to that of the semiconductor memory device 1 will be described. Each of the semiconductor memory devices including the semiconductor memory device 1 may output a ready/busy signal bR/B, which indicates which of the ready state and the busy state the semiconductor memory device is in, as described above. A ready/busy signal bR/B received by the memory controller 2 may be based on the ready/busy signals bR/B output from the respective semiconductor memory devices. In this case, the ready/busy signal bR/B received by the memory controller 2 is at the L level while at least one of the semiconductor memory devices is in the busy state, and is at the H level while all of the semiconductor memory devices are in the ready state, for example. The ready/busy signal bR/B received by the memory controller 2 in this case may be regarded as a signal indicating which of the ready state and the busy state a device comprised of the semiconductor memory devices is in. Which of the ready state and the busy state each semiconductor memory device is in can be confirmed based on, for example, the aforementioned status information STS.

The register 14 includes a status register 141, an address register 142, and a command register 143.

The status register 141 retains status information STS, and transfers the status information STS to the input/output circuit 12 based on an instruction from the sequencer 15.

The address register 142 retains address information ADD transferred from the input/output circuit 12, and transfers the address information ADD to the sequencer 15. The address register 142 transfers address information ADD to the core part 11.

The command register 143 retains a command CMD transferred from the input/output circuit 12, and transfers the command CMD to the sequencer 15.

The sequencer 15 controls the operation of the semiconductor memory device 1 based on the command CMD retained in the command register 143. The sequencer 15, for example, generates a control signal CNT based on the address information ADD retained in the address register 142, and transmits the control signal CNT to the core part 11. The control signal CNT includes, for example, a block address. The control signal CNT enables control of a target plane PB of a plurality of planes PB included in the core part 11. The sequencer 15 controls the voltage generator 16, the driver set 17, and the target plane PB to execute various operations, such as a data write operation, read operation, and erase operation, on the target plane PB.

The sequencer 15 generates status information STS and transmits the status information STS to the status register 141.

Based on the control by the sequencer 15, the voltage generator 16 generates various voltages used for, for example, a write operation, read operation, and erase operation, and supplies the generated voltages to the driver set 17.

The driver set 17 transfers, to the core part 11, various voltages used in, for example, a write operation or a read operation among the voltages supplied from the voltage generator 16 and the like.

The instruction code decoding circuit 18 receives an instruction code IC from the core part 11, and decodes the instruction code IC. The instruction code decoding circuit 18 transmits a control signal based on the decoding result to, for example, the input/output circuit 12. The input/output circuit 12 receives, for example, a command CMD and address information ADD based on the control signal. The command CMD and address information ADD are processed as described above. As a result, the sequencer 15 controls the operation of the semiconductor memory device 1 based on the command CMD and the like, as described above.

(3) Plane

Figure 3:
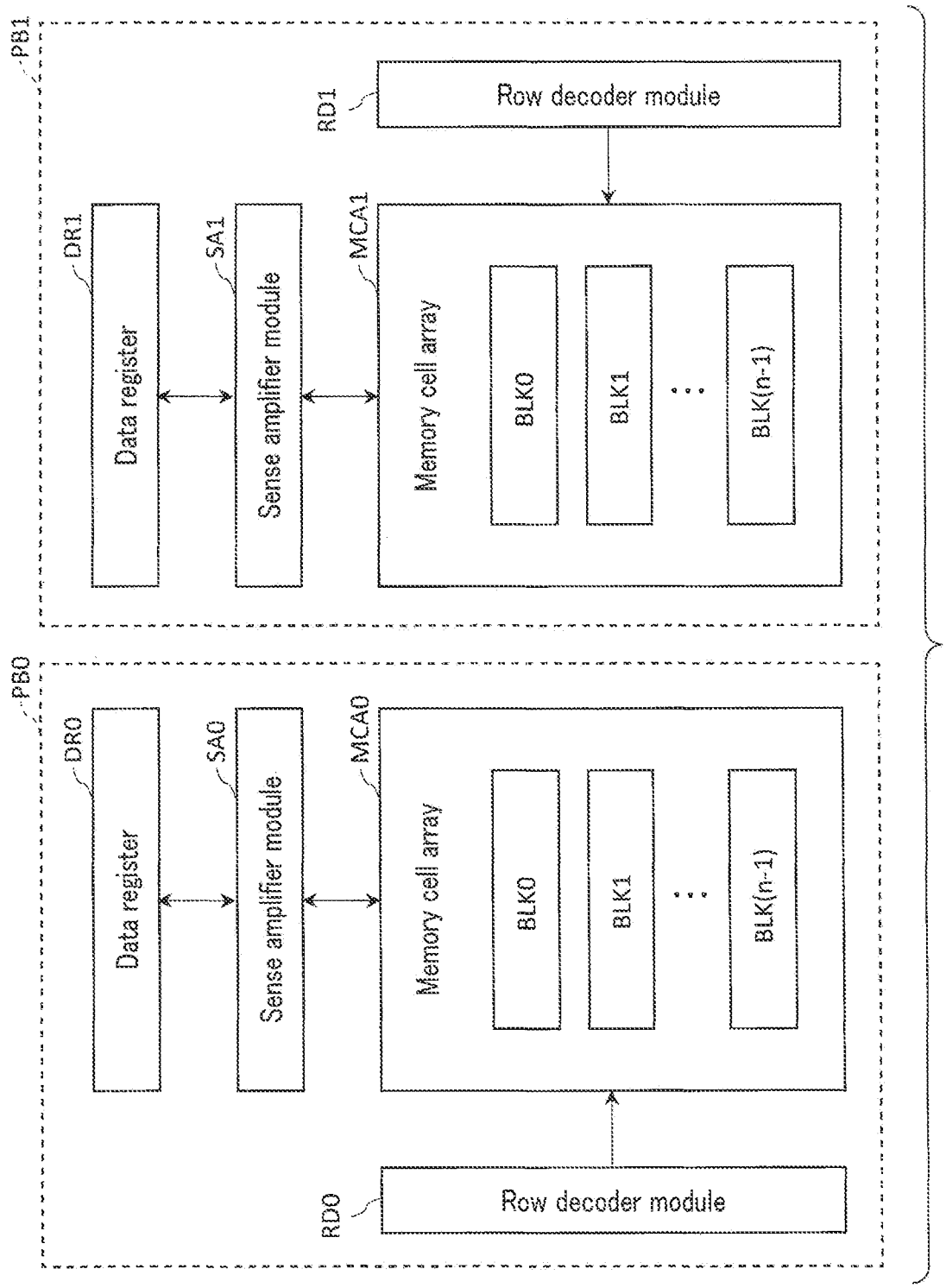
FIG. 3 is a block diagram showing an example of configurations of two planes of the semiconductor memory device according to the first embodiment.

FIG. 3 is a block diagram showing an example of configurations of the planes PB0 and PB1 of the semiconductor memory device 1 according to the first embodiment.

The plane PB0 includes a memory cell array MCA0, a row decoder module RD0, a data register DR0, and a sense amplifier module SA0.

The plane PB1 includes a memory cell array MCA1, a row decoder module RD1, a data register DR1, and a sense amplifier module SA1.

The memory cell array MCA0 includes blocks BLK0 to BLK(n−1) (where n is an integer not less than 1). Each block BLK includes a plurality of non-volatile memory cells each associated with a bit line and a word line, and corresponds to a data erase unit, for example. For example, a single-level cell (SLC) mode, multi-level cell (MLC) mode, three-level cell (TLC) mode, and quad-level cell (QLC) mode can be applied to the semiconductor memory device 1. Each memory cell retains 1-bit data in the SLC mode, 2-bit data in the MLC mode, 3-bit data in the TLC mode, and 4-bit data in the QLC mode. Each memory cell may be configured to retain 5-or-more-bit data.

The row decoder module RD0 receives a block address in the address information ADD retained in the address register 142, and selects, based on the block address, a target block BLK or the like, on which various operations, such as a read operation and a write operation, are executed. The row decoder module RD0 can transfer various voltages supplied from the driver set 17 to the selected block BLK.

The data register DR0 is coupled to the input/output circuit 12 via a data bus. The data bus consists of, for example, eight data lines, which correspond to signals DQ<7:0>, respectively. The data register DR0 includes a plurality of latch circuits. The data register DR0 receives write data DAT from the input/output circuit 12, temporarily retains the write data DAT in a plurality of latch circuits, and transfers the retained write data DAT to the sense amplifier module SA0. The data register DR0 receives read data DAT from the sense amplifier module SA0 and temporarily retains the read data DAT in a plurality of latch circuits. The data register DR0 receives, for example, a column address in address information ADD retained in the address register 142, and transfers, based on the column address, the retained read data DAT to the input/output circuit 12.

The data register DR0 receives an instruction code IC from the input/output circuit 12. The data register DR0 receives a column address in the address information ADD retained in the address register 142, and causes, based on the column address, a plurality of latch circuits to retain the instruction code IC.

The sense amplifier module SA0 receives write data DAT from the data register DR0, and transfers the write data DAT to the memory cell array MCA0. The sense amplifier module SA0 senses the threshold voltages of a plurality of memory cell transistors in the memory cell array MCA0 to generate read data DAT, and outputs the read data DAT to the data register DR0.

Descriptions similar to the above descriptions of the plane PB0 apply to the plane PB1. For example, the above descriptions apply except that the plane PB0, memory cell array MCA0, row decoder module RD0, data register DR0, and sense amplifier module SA0 are to be replaced with the plane PB1, memory cell array MCA1, row decoder module RD1, data register DR1, and sense amplifier module SA1, respectively. Similarly, each plane PB included in the core part 11 may have a configuration similar to the configuration described in connection with the plane PB0.

(4) Memory Cell Array

Details of the configuration of the memory cell array MCA0 of the plane PB0 will be described. The memory cell array MCA of each plane PB included in the core part 11 may have a configuration similar to the configuration to be described below.

Figure 4:
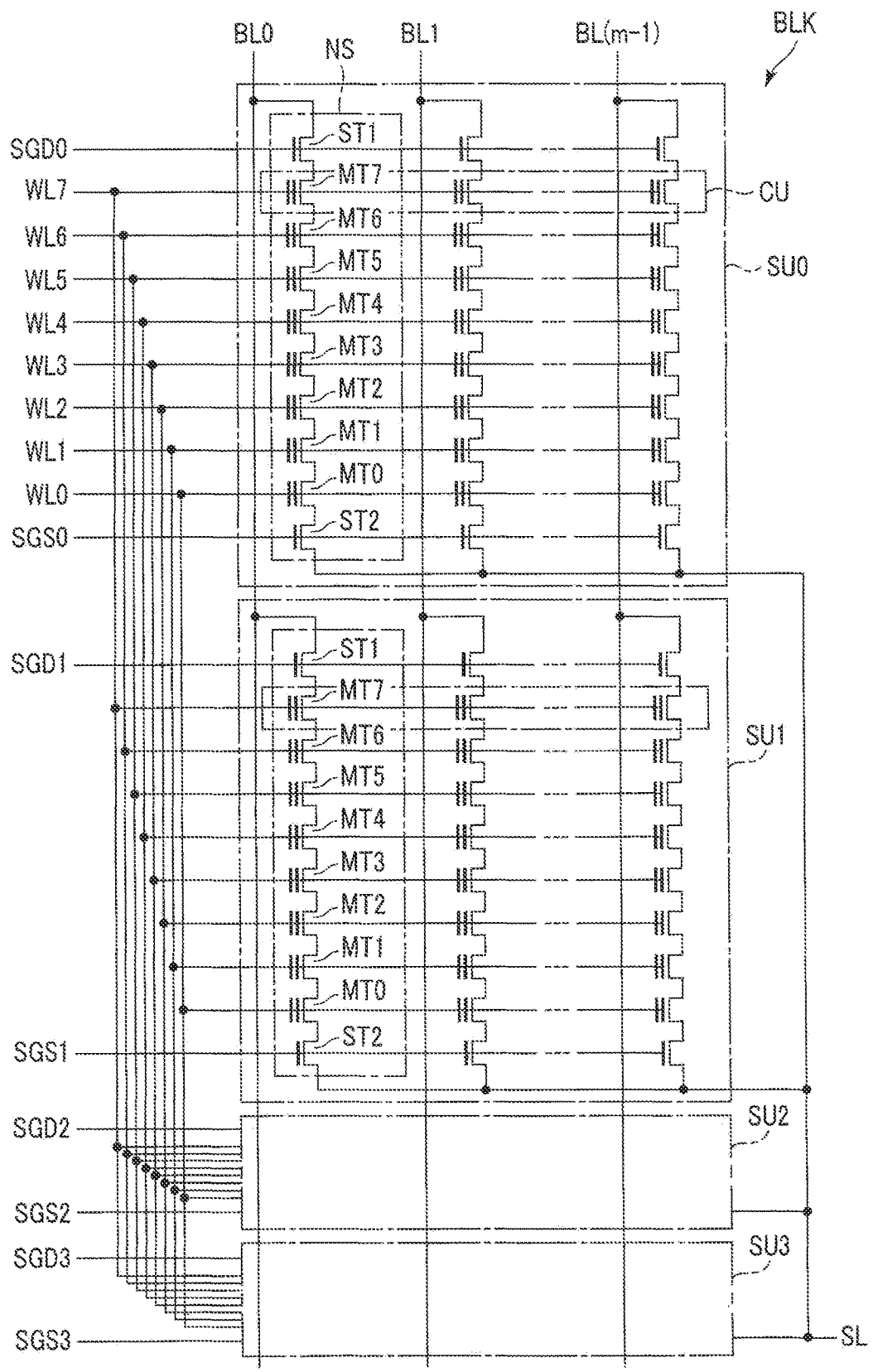
FIG. 4 shows an example of a circuit configuration of a memory cell array of the semiconductor memory device according to the first embodiment.

FIG. 4 shows an example of a circuit configuration of the memory cell array MCA0 of the semiconductor memory device 1 according to the first embodiment. As an example of the circuit configuration of the memory cell array MCA0, FIG. 4 shows an example of a circuit configuration of a block BLK included in the memory cell array MCA0. Each of the blocks BLK included in the memory cell array MCA0 may have a circuit configuration similar to that shown in FIG. 4.

The block BLK includes, for example, four string units SU0 to SU3. Each string unit SU includes a plurality of NAND strings NS. The NAND strings NS are in one-to-one correspondence with m bit lines BL0 to BL(m−1) (where m is an integer not less than 1). Each NAND string NS is coupled to a corresponding bit line BL, and includes, for example, memory cell transistors MT0 to MT7 and select transistors ST1 and ST2. Each memory cell transistor MT includes a control gate (hereinafter also referred to as a "gate") and a charge storage layer, and nonvolatilely stores data. The select transistors ST1 and ST2 are used in various operations to select a NAND string NS that includes the select transistors ST1 and ST2.

The drain of the select transistor ST1 is coupled to a bit line BL corresponding to a NAND string NS that includes the select transistor ST1. Memory cell transistors MT0 to MT7 are coupled in series between the source of the select transistor ST1 and the drain of the select transistor ST2 of the NAND string NS. The source of the select transistor ST2 is coupled to a source line SL. Interconnects coupled to the gates of the select transistors ST1 and ST2 and memory cell transistors MT0 to MT7 will be described using an integer p and an integer q.

In the example of FIG. 4, the following descriptions apply to each of the cases where p is an integer from 0 to 3, and each of the cases where q is an integer from 0 to 7. The gates of the select transistors ST1 of the NAND strings NS included in a string unit SUp are coupled in common to a select gate line SGDp. The gates of the select transistors ST2 of the NAND strings NS included in the string unit SUp are coupled in common to a select gate line SGSp. The gates of the memory cell transistors MTq of the NAND strings NS included in the same block BLK are coupled in common to a word line WLq.

Each bit line BL is coupled to the drains of the select transistors ST1 of the corresponding NAND strings NS included in the respective string units SU of the same block BLK. The source line SL is shared by a plurality of string units SU.

A set of memory cell transistors MT coupled in common to one word line WL in one string unit SU is called, for example, a "cell unit CU". A set of 1-bit data of the same order retained in the memory cell transistors MT in a cell unit CU is referred to as, for example, "1-page data". When multi-bit data is retained in each memory cell by, for example, the MLC mode, each cell unit CU may retain a plurality of "1-page data" items.

A circuit configuration of the memory cell array MCA0 is described above; however, the circuit configuration of the memory cell array MCA0 is not limited thereto. For example, the number of string units SU included in each block BLK may be any number. The number of memory cell transistors MT, the number of select transistors ST1, and the number of select transistors ST2 in each NAND string NS may also be any number. The number of word lines WL, the number of select gate lines SGD, and the number of select gate lines SGS are changed based on the number of memory cell transistors MT, the number of select transistors ST1, and the number of select transistors ST2 in each NAND string NS.

Described above is the case where one select gate line SGS is provided for each string unit SU; however, the number of select gate lines SGS is not limited to this.

Only one select gate line SGS may be provided for four string units SU included in a block BLK. In this case, the gates of the select transistors ST2 in the four string units SU0 to SU3 are electrically coupled in common to one select gate line SGS.

(5) Threshold Voltage Distribution of Memory Cell Transistors

Figure 5:
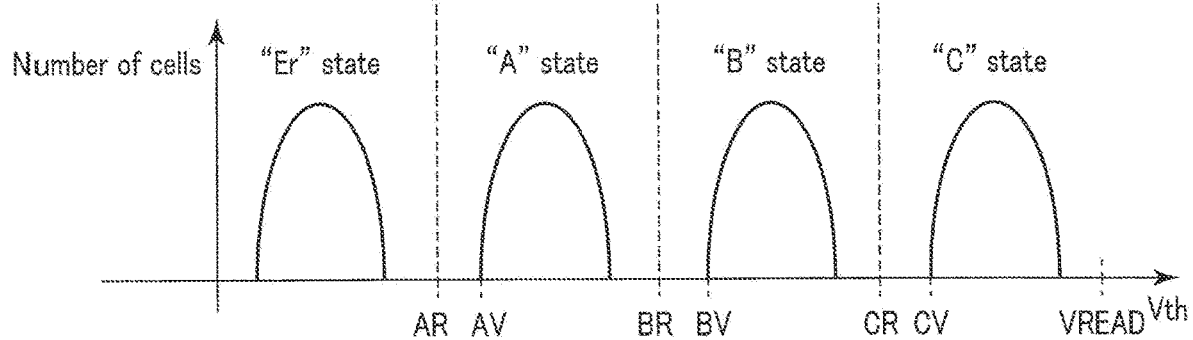
FIG. 5 shows an example of a threshold voltage distribution formed by memory cell transistors of the semiconductor memory device according to the first embodiment.

FIG. 5 shows an example of a threshold voltage distribution, data allocation, read voltages, and verify voltages in the case where each memory cell transistor MT in the memory cell array MCA0 shown in FIG. 4 retains 2-bit data. The following descriptions are applicable to the memory cell array MCA of each plane PB included in the core part 11.

The memory cell transistors MT each retain the 2-bit data based on the minimum potential difference (hereinafter referred to as a "threshold voltage") between the gate and source, which enables switching of the memory cell transistor MT from OFF to ON. In a write operation, a program operation to raise the threshold voltage of a memory cell transistor MT by injecting electrons into the charge storage layer of the memory cell transistor MT is performed.

As an example of four threshold voltage distribution lobes formed as a result of such threshold voltage control, FIG. 5 schematically shows an example of a graph in which the number of memory cell transistors MT whose threshold voltages take a particular value is plotted by using that value as a variable. The horizontal axis indicates the value of the threshold voltage of a memory cell transistor MT. The vertical axis indicates the number of memory cell transistors MT.

The four threshold voltage distribution lobes correspond to, for example, an "Er" state, "A" state, "B" state, and "C" state, respectively. A memory cell transistor MT is distinguished as being in the "Er" state, "A" state, "B" state, or "C" state in accordance with the threshold voltage of the memory cell transistor MT. The threshold voltage of the memory cell transistor MT increases in the order of the "Er" state, "A" state, "B" state, and "C" state. For example, data "11" ("high-order bit/low-order bit") is allocated to the "Er" state, data "01" is allocated to the "A" state, data "00" is allocated to the "B" state, and data "10" is allocated to the "C" state. The data allocated to each state is the data stored in a memory cell transistor MT in the state.

In a write operation, a verify operation to verify whether or not the threshold voltage of a memory cell transistor MT has exceeded a predetermined voltage is performed. Verify voltages for use in the verify operation are set. Specifically, a verify voltage AV is set for the "A" state, a verify voltage BV is set for the "B" state, and a verify voltage CV is set for the "C" state.

The case where the verify voltage AV is applied between the gate and source of a memory cell transistor MT will be described. When the memory cell transistor MT is turned on, it can be understood that the memory cell transistor MT is in the "Er" state. In contrast, when the memory cell transistor MT is OFF, it can be understood that the memory cell transistor MT is in one of the "A" state, "B" state, and "C" state. Accordingly, it can be verified whether or not the threshold voltage of a write-target memory cell transistor MT has been included in the threshold voltage distribution lobe of one of the "A" state, "B" state, and "C" state as a result of, for example, a write operation to write data "01". The same applies to the verify voltages BV and CV.

In a read operation, which state a memory cell transistor MT is in is judged. Read voltages for use in a read operation are set. Specifically, a read voltage AR is set for the "A" state, a read voltage BR is set for the "B" state, and a read voltage CR is set for the "C" state.

The case where the read voltage AR is applied between the gate and source of a memory cell transistor MT will be described. When the memory cell transistor MT is turned on, it can be understood that the memory cell transistor MT is in the "Er" state. In contrast, when the memory cell transistor MT is OFF, it can be understood that the memory cell transistor MT is in one of the "A" state, "B" state, and "C" state. Accordingly, it can be judged whether the memory cell transistor MT is in the "Er" state or in one of the "A" state, "B" state, and "C" state. The same applies to the read voltages BR and CR.

Before a read operation is executed, some of the electrons stored in the charge storage layer of a memory cell transistor MT may escape from the charge storage layer with the passage of time, causing a drop in the threshold voltage of the memory cell transistor MT. To cope with such a drop in the threshold voltage, each read voltage is set to be smaller than the verify voltage set for the same state as the read voltage. That is, the read voltage AR is smaller than the verify voltage AV, the read voltage BR is smaller than the verify voltage BV, and the read voltage CR is smaller than the verify voltage CV.

In addition, a read pass voltage VREAD is set to be always larger than the threshold voltages of the memory cell transistors MT in the "C" state, which is the highest-voltage state. When the read pass voltage VREAD is applied between the gate and source of a memory cell transistor MT, the memory cell transistor MT is turned on regardless of data stored therein.

The above-described number of bits of data stored in one memory cell transistor MT and allocation of data to the threshold voltage distribution lobes are mere examples, and the embodiment is not limited thereto.

(6) Data Register and Sense Amplifier Module

Details of the configurations of the data register DR0 and sense amplifier module SA0 of the plane PB0 will be described. The data register DR and sense amplifier module SA of each plane PB included in the core part 11 may have configurations similar to those to be described below.

Figure 6:
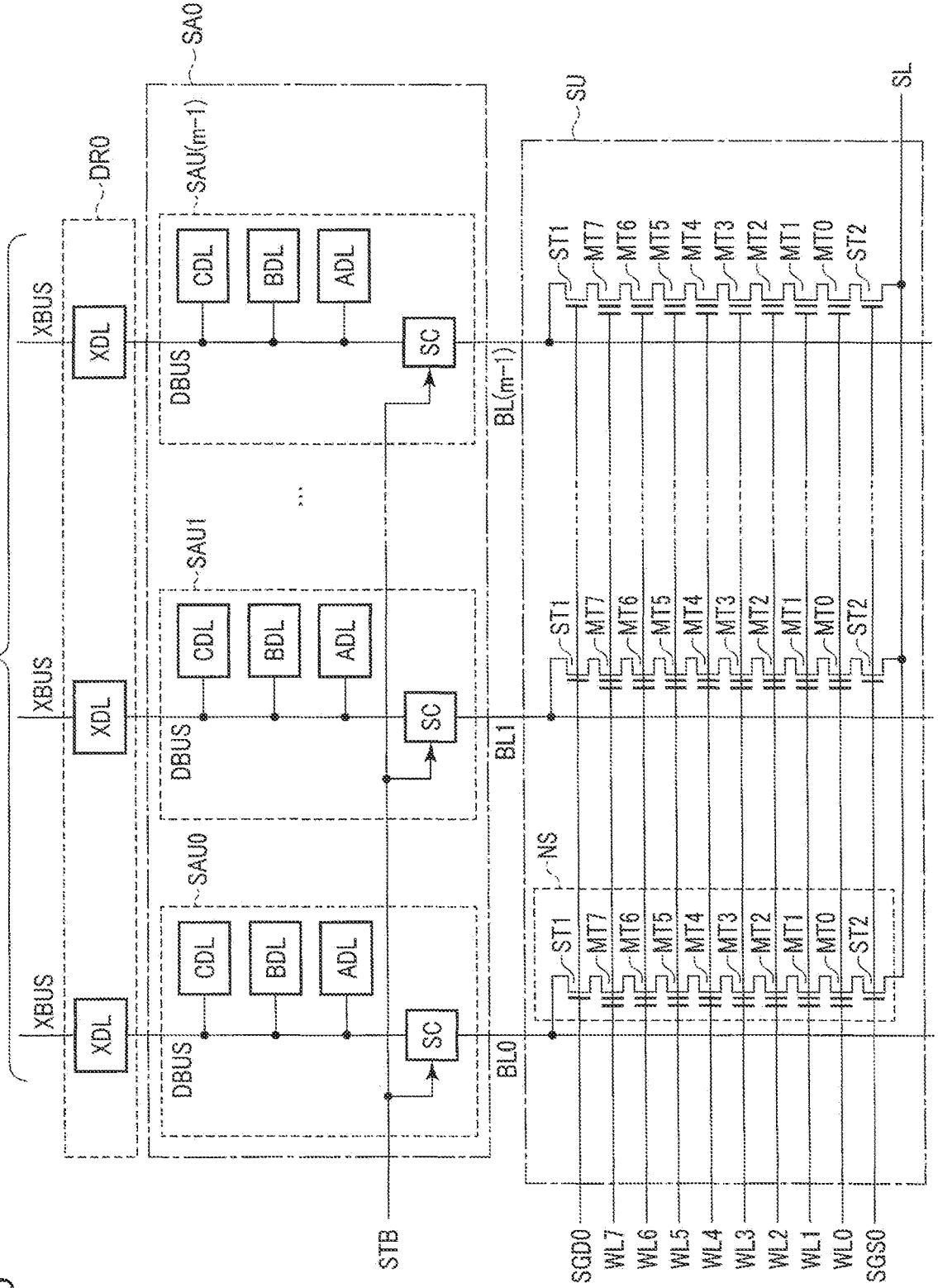
FIG. 6 is a block diagram showing an example of configurations of a data register and a sense amplifier module of the semiconductor memory device according to the first embodiment.

FIG. 6 is a block diagram showing an example of configurations of the data register DR0 and sense amplifier module SA0 of the semiconductor memory device 1 according to the first embodiment. The configurations of the data register DR0 and sense amplifier module SAG to be described in detail below are mere examples, and various configurations can be applied to the data register DR0 and sense amplifier module SA0.

First, the sense amplifier module SAG will be described.

The sense amplifier module SAG includes, for example, m sense amplifier units SAU0 to SAU(m−1). The m sense amplifier units SAU0 to SAU(m−1) are in one-to-one correspondence with, for example, m bit lines BL0 to BL(m−1).

Each sense amplifier unit SAU includes, for example, a sense amplifier circuit SC and latch circuits ADL, BDL, and CDL. The number of latch circuits included in each sense amplifier unit SAU is based on, for example, the number of bits of data retained in each memory cell transistor MT. The sense amplifier circuit SC and latch circuits ADL, BDL, and CDL will be described focusing on a given sense amplifier circuit SAU.

The sense amplifier circuit SC is coupled to a bit line BL corresponding to the sense amplifier unit SAU. The sense amplifier circuit SC and the latch circuits ADL, BDL, and CDL are coupled in common to a bus DBUS.

In a write operation, the sense amplifier circuit SC applies a voltage to the bit line BL. In a read operation, the sense amplifier circuit SC reads data by sensing the threshold voltage of a memory cell transistor MT based on the current flowing through the bit line BL or the potential of the bit line BL. In a read operation, a control signal STB is supplied to the sense amplifier circuit SC by, for example, the sequencer 15. The sense amplifier circuit SC determines the data at a time when the control signal STB is asserted, and outputs the data onto the bus DBUS.

The latch circuits ADL, BDL, and CDL, for example, receive data via the bus DBUS and temporarily retain the received data.

Next, the data register DR0 will be described.

The data register DR0 includes, for example, m latch circuits XDL. The m latch circuits XDL are, for example, a plurality of latch circuits described as being included in the data register DR0 with reference to FIG. 3. The m latch circuits XDL are in one-to-one correspondence with, for example, the m sense amplifier units SAU. Descriptions will be provided focusing on a latch circuit XDL corresponding to the sense amplifier unit SAU described above in detail. The latch circuit XDL is coupled to the bus DBUS. The latch circuit XDL is coupled to a bus XBUS. The latch circuit XDL is coupled to the input/output circuit 12 via the bus XBUS.

The latch circuit XDL enables data transmission and reception between the sense amplifier unit SAU and the input/output circuit 12. In a write operation, a bit of data received by the semiconductor memory device 1 from the memory controller 2 is first retained in the latch circuit XDL, and then transferred to the latch circuit ADL, BDL, or CDL or the sense amplifier circuit SC. In a read operation, data in the latch circuit ADL, BDL, or CDL or the sense amplifier circuit SC is first transferred to the latch circuit XDL and retained therein, and then transferred to the input/output circuit 12 and output to the outside of the semiconductor memory device 1.

As described above, the latch circuit XDL functions as a cache memory of the semiconductor memory device 1, which is coupled in series between the input/output circuit 12 and the sense amplifier circuit SC. Accordingly, when the latch circuits XDL are available (i.e., unoccupied), the semiconductor memory device 1 may enter the ready state.

(7) Ready/Busy Signal

Figure 7:
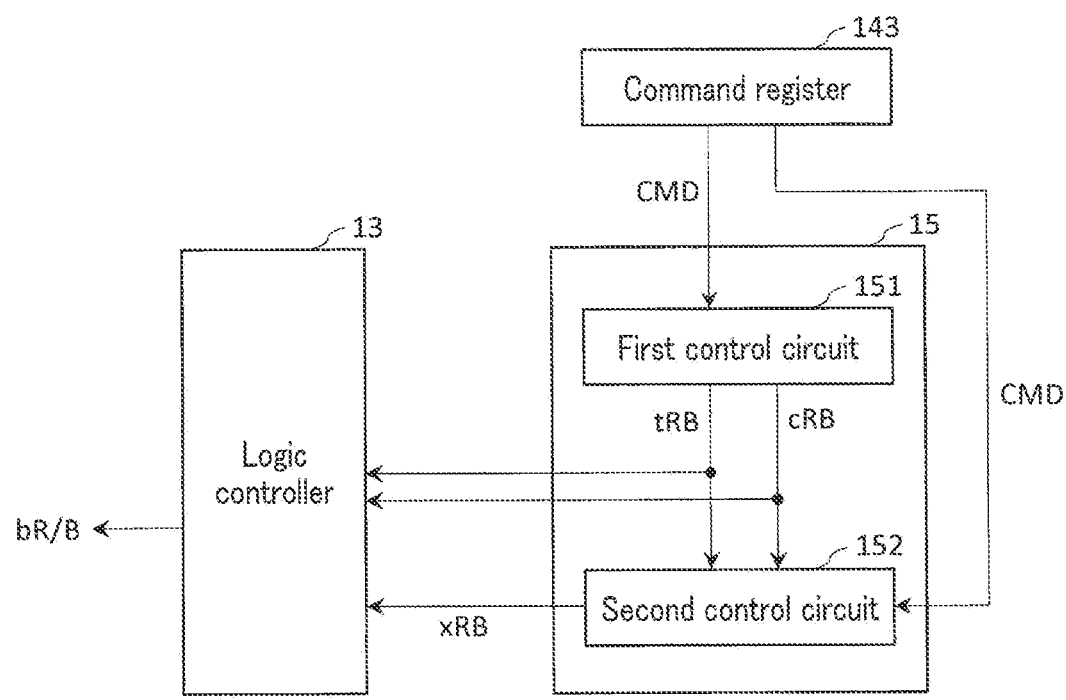
FIG. 7 is a block diagram showing an example of a configuration relating to a ready/busy signal in the semiconductor memory device according to the first embodiment.

FIG. 7 is a block diagram showing an example of a configuration relating to the ready/busy signal bR/B in the semiconductor memory device 1 according to the first embodiment.

The sequencer 15 includes, for example, a first control circuit 151 and a second control circuit 152.

The first control circuit 151 receives a command CMD from the command register 143, and controls the operation of the semiconductor memory device 1 based on the command CMD.

The first control circuit 151 generates a true ready/busy signal tRB. The true ready/busy signal tRB indicates whether or not the first control circuit 151 is performing control based on a command CMD. While the first control circuit 151 is not performing control based on a command CMD, the true ready/busy signal tRB is at the H level. While the first control circuit 151 is performing control based on a command CMD, the true ready/busy signal tRB is at the L level. Hereinafter, descriptions will be provided on the assumption that the semiconductor memory device 1 is in a true ready state while the true ready/busy signal tRB is at the H level, and is in a true busy state while the true ready/busy signal tRB is at the L level.

The first control circuit 151 transmits the true ready/busy signal tRB to the logic controller 13 and the second control circuit 152.

The first control circuit 151 generates a cache ready/busy signal cRB. The cache ready/busy signal cRB indicates whether or not the latch circuits XDL are available for an operation relating to a command CMD that may be accepted by the semiconductor memory device 1. While the latch circuits XDL are available for an operation relating to a command CMD that may be accepted by the semiconductor memory device 1, the cache ready/busy signal cRB is at the H level. While the latch circuits XDL are not available for an operation relating to a command CMD that may be accepted by the semiconductor memory device 1, the cache ready/busy signal cRB is at the L level. Hereinafter, descriptions will be provided on the assumption that the semiconductor memory device 1 is in a cache ready state while the cache ready/busy signal cRB is at the H level, and is in a cache busy state while the cache ready/busy signal cRB is at the L level.

The first control circuit 151 transmits the cache ready/busy signal cRB to the logic controller 13 and the second control circuit 152.

The second control circuit 152 receives a certain command CMD (hereinafter also referred to as an "execution command") from the command register 143, and controls the operation of the semiconductor memory device 1 based on the execution command. The control is also based on an instruction code IC retained in a data register DR. Through the control, a command CMD and the like are obtained from the instruction code IC as described above, and the operation of the semiconductor memory device 1 is controlled by the first control circuit 151 based on the command CMD and the like.

The second control circuit 152 generates a ready/busy signal xRB. The ready/busy signal xRB indicates whether or not the second control circuit 152 is performing control based on an execution command. While the second control circuit 152 is not performing control based on an execution command, the ready/busy signal xRB is at the H level. While the second control circuit 152 is performing control based on an execution command, the ready/busy signal xRB is at the L level.

The second control circuit 152 receives the true ready/busy signal tRB and the cache ready/busy signal cRB from the first control circuit 151. The second control circuit 152 may perform timing control based on the true ready/busy signal tRB and/or the cache ready/busy signal cRB in the above-described control based on an execution command.

The logic controller 13 receives the true ready/busy signal tRB and the cache ready/busy signal cRB from the first control circuit 151, and receives the ready/busy signal xRB from the second control circuit 152.

The logic controller 13 outputs the ready/busy signal bR/B based on the true ready/busy signal tRB, cache ready/busy signal cRB, and ready/busy signal xRB.

For example, while the ready/busy signal xRB is at the H level, the logic controller 13 outputs the ready/busy signal bR/B at the same level as one of the levels of the true ready/busy signal tRB and the cache ready/busy signal cRB. Which of the levels of the true ready/busy signal tRB and the cache ready/busy signal cRB is the same as the level at which the ready/busy signal bR/B is output is controlled by, for example, the first control circuit 151. For example, while the ready/busy signal xRB is at the L level, the logic controller 13 outputs the ready/busy signal bR/B at the L level.

(8) Instruction Code

An instruction code IC includes a plurality of information units IU. Each information unit IU consists of, for example, 16-bit data, and defines an instruction to the semiconductor memory device 1. The instruction code IC is decoded by the instruction code decoding circuit 18 in information units IU.

Figure 8:
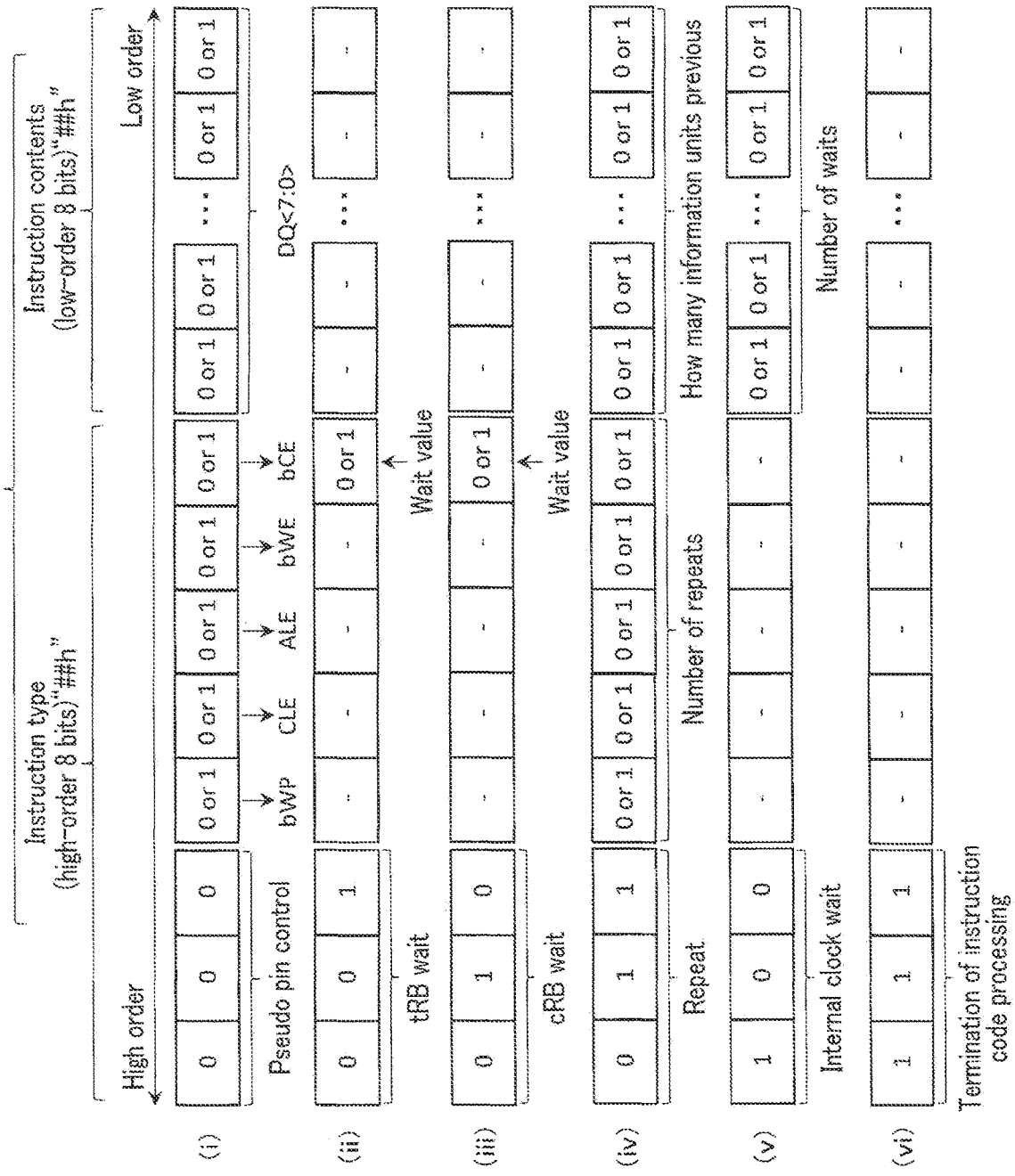
FIG. 8 is a diagram illustrating information units of an instruction code used by the semiconductor memory device according to the first embodiment.

FIG. 8 is a diagram illustrating information units IU of an instruction code IC used by the semiconductor memory device 1 according to the first embodiment. Instructions defined by information units IU are classified into, for example, six types.

For example, the high-order 8 bits of an information unit IU indicate which of the six types the instruction defined by the information unit IU is. Hereinafter, the high-order 8 bits will also be referred to as a first bit, second bit, third bit, fourth bit, fifth bit, sixth bit, seventh bit, and eighth bit in descending order. In particular, the first bit, second bit, and third bit may indicate a type of the instruction, and the fourth bit, fifth bit, sixth bit, seventh bit, and eighth bit may indicate specific contents of the instruction. For example, the low-order 8 bits of the information unit IU may indicate supplementary contents of the instruction.

Here, 4 bits may represent $2^4=16$ different numbers. 0 to F in hexadecimal notation are allocated respectively to the 16 numbers that may be represented by 4 bits in ascending order. Accordingly, #, which is one of 0 to F in hexadecimal notation, is allocated to the 4 bits from the first bit to the fourth bit, and #, which is one of 0 to F in hexadecimal notation, is also allocated to the 4 bits from the fifth bit to the eighth bit. Herein, the high-order 8-bit data of the information unit IU is represented by "##h", in which # allocated to the 4 bits from the first bit to the fourth bit and # allocated to the 4 bits from the fifth bit to the eighth bit are arranged in order. The same applies to the low-order 8 bits of the information unit IU. Herein, the same representation is used for the other 8-bit data.

(i) Information Unit Relating to Pseudo Pin Control

The case where the first bit, second bit, and third bit of an information unit IU each represent "0" data will be described. These three bits indicate, for example, that the type of the instruction defined by the information unit IU is pseudo pin control.

The fourth bit corresponds to, for example, the write protect signal bWP. The fifth bit corresponds to, for example, the command latch enable signal CLE. The sixth bit corresponds to, for example, the address latch enable signal ALE. The seventh bit corresponds to, for example, the write enable signal bWE. The eighth bit corresponds to, for example, the chip enable signal bCE.

The instruction is, for example, for causing the logic controller 13 to recognize that data represented by each of the fourth to eighth bits is being received via a signal corresponding to the bit. Descriptions will be provided on the assumption that each of the signals described so far transmits "1" data while the signal is at the H level, and transmits "0" data while the signal is at the L level.

For example, when the fourth bit, fifth bit, . . . , and eighth bit represent "1" data, "1" data, "0" data, "0" data, and "0" data, respectively, i.e., when the high-order 8-bit data of the information unit IU is data "18h", the above-described recognition by the logic controller 13 is for enabling the logic controller 13 to perform control equivalent to that performed by the logic controller 13 while the memory controller 2 is transmitting a command CMD to the semiconductor memory device 1.

For example, when the fourth bit, fifth bit, . . . , and eighth bit represent "1" data, "0" data, "1" data, "0" data, and "0" data, respectively, i.e., when the high-order 8-bit data of the information unit IU is data "14h", the above-described recognition by the logic controller 13 is for enabling the logic controller 13 to perform control equivalent to that performed by the logic controller 13 while the memory controller 2 is transmitting address information ADD to the semiconductor memory device 1.

The low-order 8 bits of the information unit IU are in one-to-one correspondence with, for example, the signals DQ<7:0>. The instruction is also for causing the input/output circuit 12 to recognize that, for example, data represented by each of the low-order 8 bits is being received via a signal corresponding to the bit.

(ii) Information Unit Relating to True Ready/Busy Wait

The case where the first bit, second bit, and third bit of an information unit IU represent "0" data, "0" data, and "1" data, respectively, will be described. These three bits indicate, for example, that the type of the instruction defined by the information unit IU is true ready/busy wait. The instruction is, for example, for causing the second control circuit 152 to wait for a given level of the true ready/busy signal tRB.

For example, the eighth bit indicates which of the H level and L level of the true ready/busy signal tRB the instruction causes the second control circuit 152 to wait for. When the eighth bit represents "1" data, the instruction is for causing the second control circuit 152 to wait until the second control circuit 152 receives the true ready/busy signal tRB at the H level. When the eighth bit represents "0" data, the instruction is for causing the second control circuit 152 to wait until the second control circuit 152 receives the true ready/busy signal tRB at the L level.

(iii) Information Unit Relating to Cache Ready/Busy Wait

The case where the first bit, second bit, and third bit of an information unit IU represent "0" data, "1" data, and "0" data, respectively, will be described. These three bits indicate, for example, that the type of the instruction defined by the information unit IU is cache ready/busy wait. The instruction is, for example, for causing the second control circuit 152 to wait for a given level of the cache ready/busy signal cRB.

For example, the eighth bit indicates which of the H level and L level of the cache ready/busy signal cRB the instruction causes the second control circuit 152 to wait for. When the eighth bit represents "1" data, the instruction is for causing the second control circuit 152 to wait until the second control circuit 152 receives the cache ready/busy signal cRB at the H level. When the eighth bit represents "0" data, the instruction is for causing the second control circuit 152 to wait until the second control circuit 152 receives the cache ready/busy signal cRB at the L level.

(iv) Information Unit Relating to Repeat

The case where the first bit, second bit, and third bit of an information unit IU represent "0" data, "1" data, and "1" data, respectively, will be described. These three bits indicate, for example, that the type of the instruction defined by the information unit IU is a repeat. For example, the semiconductor memory device 1 executes processing corresponding to instructions defined by information units IU in the order in which the information units IU were decoded. The instruction relating to a repeat is, for example, for causing the semiconductor memory device 1 to repeat the processing corresponding to the instructions defined by the information units IU from a given information unit IU to the immediately preceding information unit IU, for which the processing corresponding to the instructions defined by the information units IU has been executed.

For example, the fourth to eighth bits indicate the number of repeats represented by these five bits.

For example, the low-order 8 bits of the information unit IU indicate from which information unit IU a repeat should be started. For example, the low-order 8 bits indicate that a repeat should be started from the number of information units IU previous represented by the low-order eight bits.

(v) Information Unit Relating to Internal Clock Wait

The case where the first bit, second bit, and third bit of an information unit IU represent "1" data, "0" data, and "0" data, respectively, will be described. These three bits indicate, for example, that the type of the instruction defined by the information unit IU is an internal clock wait. The instruction is, for example, for causing the second control circuit 152 to wait until an internal clock changes to a given level several times.

For example, the low-order 8 bits of the information unit IU indicate until how many times the internal clock signal makes the change the second control circuit 152 is caused to wait. For example, the low-order 8 bits indicate causing the second control circuit 152 to wait until the internal clock signal makes the change the number of times represented by the low-order 8 bits.

(vi) Information Unit Relating to Termination of Instruction Code Processing

The case where the first bit, second bit, and third bit of an information unit IU each represent "1" data will be described. These three bits indicate, for example, that the type of the instruction defined by the information unit IU is termination of instruction code processing. The instruction is, for example, for terminating processing relating to the instruction code IC by the semiconductor memory device 1.

(9) Second Control Circuit and Instruction Code Decoding Circuit

FIG. 9 is a block diagram showing an example of a configuration relating to retaining and reading of an instruction code IC in the semiconductor memory device 1 according to the first embodiment. Herein, the case where an instruction code IC is retained in the data register DR0 will be described.

First, a configuration relating to retaining of an instruction code IC will be described. In FIG. 9, a flow of data relating to retaining of an instruction code IC is indicated by broken lines.

The input/output circuit 12 receives an instruction code IC from the memory controller 2 via signals DQ<7:0> in the order of high-order 8-bit data of an information unit IU, low-order 8-bit data of the information unit IU, high-order 8-bit data of the next information unit IU, low-order 8-bit data of said next information unit IU, . . . . The input/output circuit 12 transfers the instruction code IC to the core part 11 in the same order via the above-described eight data lines.

By a control signal CNT, for example the plane PB0 is identified as a target plane. The data register DR0 receives the instruction code IC in the same order as the above-described one. The data register DR0 receives a column address (hereinafter also referred to as an "access address") in the address information ADD retained in the address register 142 and causes, based on the access address, a plurality of latch circuits XDL in the data register DR0 to retain the instruction code IC. Details will be described below.

The access address designates, for example, eight latch circuits XDL in the data register DR0. Information of the instruction code IC is retained in a plurality of latch circuits XDL of the data register DR0 in the order of reception at the data register DR0 with the eight latch circuits XDL designated by the access address as starting points.

Next, a configuration relating to reading of an instruction code IC will be described. In FIG. 9, a flow of data relating to reading of an instruction code IC is indicated by solid lines.

The second control circuit 152 starts reading of the instruction code IC retained in the data register DR0 in response to reception of the execution command retained in the command register 143. In the reading, under the control of the second control circuit 152, the data register DR0 transfers an information unit IU of the retained instruction code IC to the instruction code decoding circuit 18, based on the access address retained in the address register 142. Details will be described below.

First, 16-bit data retained in 16 latch circuits XDL is transferred to the instruction code decoding circuit 18 with the eight latch circuits XDL designated by the access address as starting points. For example, the transfer is performed in an 8-bit batch. The 16-bit data is 16-bit data of the information unit IU first received by the input/output circuit 12 from the memory controller 2.

The instruction code decoding circuit 18 receives the information unit IU from the data register DR0. The instruction code decoding circuit 18 decodes the information unit IU, and outputs a control signal based on the decoding result. The case where the first bit, second bit, and third bit of the information unit IU indicate that the type of the instruction defined by the information unit IU is pseudo pin control will be described.

The instruction code decoding circuit 18 transmits control signals for pseudo pin control to the logic controller 13 and the input/output circuit 12, respectively. The logic controller 13 and the input/output circuit 12 receive the respective control signal. The logic controller 13 and the input/output circuit 12 execute processing corresponding to the instruction based on the respective control signals, for example under the control of the second control circuit 152. Details will be described below.

The instruction code decoding circuit 18 transmits, as the control signal, the 5-bit data from the fourth bit to the eighth bit of the high-order 8-bits of the information unit IU to the logic controller 13. Under the control of the second control circuit 152 for example, the logic controller 13 receives the 5-bit data and operates as follows. The logic controller 13 recognizes that data represented by the fourth bit is being received via the write protect signal bWP. This is achieved by having the data represented by the fourth bit transmitted to the logic controller 13 via, for example, a bus that the logic controller 13 uses to receive the write protect signal bWP. The same applies to similar descriptions below, which use the term "recognize". The logic controller 13 recognizes that data represented by the fifth bit is being received via the command latch enable signal CLE. The logic controller 13 recognizes that data represented by the sixth bit is being received via the address latch enable signal ALE. The logic controller 13 recognizes that data represented by the seventh bit is being received via the write enable signal bWE. The logic controller 13 recognizes that data represented by the eighth bit is being received via the chip enable signal bCE. The logic controller 13 controls the input/output circuit 12 based on such recognition.

For example, when the high-order 8-bit data of the information unit IU is data "18h", the control is equivalent to the control which the logic controller 13 performs based on various signals received from the memory controller 2 while the memory controller 2 is transmitting a command CMD to the semiconductor memory device 1.

For example, when the high-order 8-bit data of the information unit IU is data "14h", the control is equivalent to the control which the logic controller 13 performs based on various signals received from the memory controller 2 while the memory controller 2 is transmitting address information ADD to the semiconductor memory device 1.

The instruction code decoding circuit 18 transmits, as the control signal, low-order 8-bit data of the information unit IU to the input/output circuit 12. Under the control of the second control circuit 152 for example, the input/output circuit 12 receives the 8-bit data and recognizes that the 8-bit data is being received via signals DQ<7:0>.

Under the control of the logic controller 13, the input/output circuit 12 recognizes that the 8-bit data is, for example, a command CMD or address information ADD. For example, when the high-order 8-bit data of the information unit IU is data "18h", the input/output circuit 12 recognizes that the 8-bit data is a command CMD. For example, when the high-order 8-bit data of the information unit IU is data "14h", the input/output circuit 12 recognizes that the 8-bit data is address information ADD. The input/output circuit 12 transfers the address information ADD to the address register 142. The input/output circuit 12 transfers the command CMD to the command register 143. Based on such a command CMD and the like, for example the first control circuit 151 executes the processing described as being performed by the sequencer 15 with reference to FIG. 2.

The case where the first bit, second bit, and third bit of the information unit IU indicate that the type of the instruction defined by the information unit is a type other than pseudo pin control will be described.

The instruction code decoding circuit 18 transmits a control signal for the processing corresponding to the instruction to the second control circuit 152. The second control circuit 152 receives the control signal. Based on the control signal, the second control circuit 152 executes the processing corresponding to the instruction.

In response to, for example, completion of such processing corresponding to the instruction, the second control circuit 152 increments the access address retained in the address register 142. The incremented access address designates eight latch circuits XDL retaining high-order 8-bit data of the information unit IU received by the input/output circuit 12 from the memory controller 2 subsequently to the information unit IU decoded as described above.

In response to the incrementing of the access address, the second control circuit 152 reads the next information unit IU of the instruction code IC retained in the data register DR0. In the reading, the data register DR0 transfers, based on the access address, the information unit IU to the instruction code decoding circuit 18 as described above. Upon receipt of the information unit IU, the instruction code decoding circuit 18 processes the information unit IU as described above.

In this way, the second control circuit 152 sequentially reads the information units IU of the instruction code IC retained in the data register DR0, and the semiconductor memory device 1 sequentially processes the information units IU of the instruction code IC.

Six types of instructions defined by information units IU have been described with reference to FIG. 8. The types of instructions defined by information units IU are not limited to the above-described six types. For example, an information unit IU can define an instruction that enables the semiconductor memory device 1 to obtain data DT from the information unit IU by processing similar to that described in connection with the information unit IU relating to pseudo pin control.

Operation Example

An operation example will be described in detail, in which the memory controller 2 transmits a command set including an instruction code IC to the semiconductor memory device 1 and the semiconductor memory device 1 operates based on the instruction code IC. After an overall flow is described, details of each operation in the overall flow will be described using a command sequence and the like.

(1) Overall Flow

Figure 10:
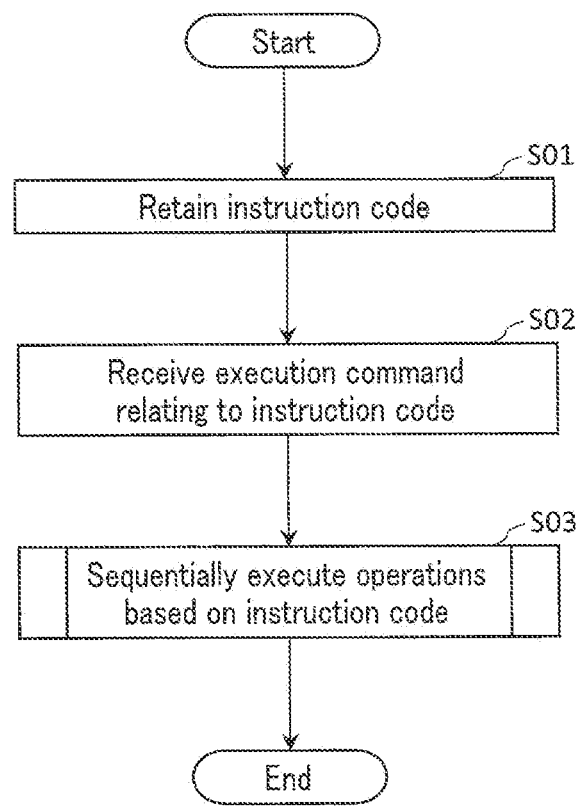
FIG. 10 is a flow chart showing an operation example in which the semiconductor memory device according to the first embodiment operates based on an instruction code.

FIG. 10 is a flow chart showing an operation example in which the semiconductor memory device 1 according to the first embodiment operates based on an instruction code IC.

The memory controller 2 generates a command set based on a host command from the host device 4, and transmits the command set to the semiconductor memory device 1. The command set includes an instruction code IC. By the transmission of the command set being started, the operation shown in the flow chart of FIG. 10 is started.

The semiconductor memory device 1 receives the instruction code IC and causes, for example, the data register DR0 to retain the instruction code IC (S01).

The command set includes an execution command subsequent to the instruction code IC. The semiconductor memory device 1 receives the execution command (S02).

Based on the execution command, the semiconductor memory device 1 sequentially executes operations based on the instruction code IC (S03).

(2) Command Sequence

Figure 11:
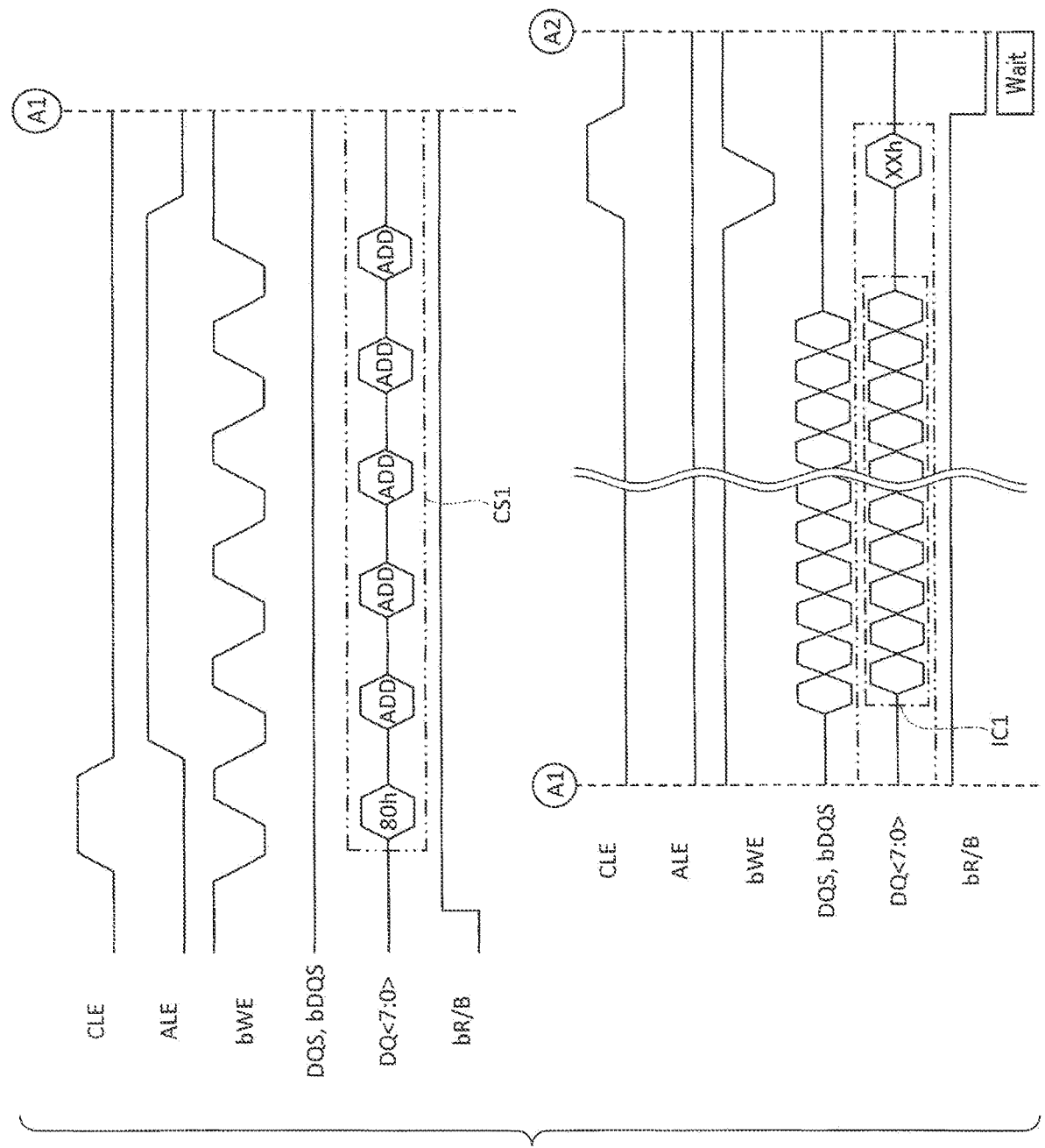
FIG. 11 shows an example of a timing chart showing a command set and temporal changes of other various signals, which relate to the operation example in which the semiconductor memory device according to the first embodiment operates based on the instruction code.

FIG. 11 shows an example of a timing chart showing a command set and temporal changes of other various signals, which relate to the operation example in which the semiconductor memory device 1 according to the first embodiment operates based on the instruction code IC.

In the following descriptions, when a signal is described as being at a level, the signal should be regarded as remaining at the described level unless control to bring the signal to another level is explicitly described thereafter.

In the following descriptions, when the command latch enable signal CLE and the address latch enable signal ALE are not described as being at the H level, the signals are assumed to be at the L level. When the write enable signal bWE and signals DQS and bDQS are not described as being toggled, the signals are assumed to be not toggled.

The first control circuit 151 causes, based on, for example, an H-level cache ready/busy signal cRB, the logic controller 13 to transmit a ready/busy signal bR/B to the memory controller 2 at the H level. By the H-level ready/busy signal bR/B, the memory controller 2 is notified that, for example, the semiconductor memory device 1 is in the cache ready state.

While the semiconductor memory device 1 is in, for example, the cache ready state, the memory controller 2 generates a command set CS1 and transmits the command set CS1 to the semiconductor memory device 1 via signals DQ<7:0>. The command set CS1 includes a command "80h", address information ADD, an instruction code IC1, and a command "XXh". The command set CS1 may be generated in response to, for example, the memory controller 2 confirming with the ready/busy signal bR/B and the like that the semiconductor memory device 1 is in the true busy state but also in the cache ready state. The memory controller 2 can transmit the command set CS1 to the semiconductor memory device 1, for example, while the semiconductor memory device 1 is in the cache ready state. The semiconductor memory device 1 receives the command set CS1, and operates as described with reference to FIG. 10. Details will be described below.

First, the memory controller 2 generates a command "80h". While toggling the write enable signal bWE and having the command latch enable signal CLE at the H level, the memory controller 2 transmits the command "80h" to the semiconductor memory device 1 via signals DQ<7:0>. The command "80h" is a command used to cause the semiconductor memory device 1 to input therein data transmitted by the memory controller 2 to the semiconductor memory device 1. Specifically, the command "80h" is a command used to cause latch circuits XDL of a data register DR to retain subsequent data based on, for example, subsequent address information ADD. Based on the toggling of the write enable signal bWE and the command latch enable signal being at the H level, the logic controller 13 enables the input/output circuit 12 to take the command "80h" therein and transfer the command "80h" to the command register 143.

Then, the memory controller 2 generates address information ADD over, for example, five cycles. While toggling the write enable signal bWE and having the address latch enable signal ALE at the H level, the memory controller 2 transmits the address information ADD to the semiconductor memory device 1 via signals DQ<7:0>. The address information ADD over five cycles includes, for example, a block address and a column address. The block address designates a target plane PB. The column address designates eight latch circuits XDL in the data register DR of the plane PB. The address information ADD is not limited to the one over five cycles, and may be one over any number of cycles. Based on the toggling of the write enable signal bWE and the address latch enable signal ALE being at the H level, the logic controller 13 enables the input/output circuit 12 to take the address information ADD therein and transfer the address information ADD to the address register 142. For example, the sequencer 15 enables control of the target plane PB0 by transmitting a control signal CNT based on the address information ADD to the core part 11.

Next, the memory controller 2 generates an instruction code IC1. While toggling the signals DQS and bDQS, the memory controller 2 transmits the instruction code IC1 to the semiconductor memory device 1 via signals DQ<7:0>. Based on the toggling of the signals DQS and bDQS, the logic controller 13 enables the input/output circuit 12 to take the instruction code IC therein and transfer the instruction code IC to the core part 11. The data register DR0 receives the instruction code IC1. The data register DR0 receives the access address in the address information ADD retained in the address register 142, and causes, based on the access address, a plurality of latch circuits XDL in the data register DR0 to retain the instruction code IC1. The operation represented by S01 in FIG. 10 (hereinafter also referred to as the operation of S01; the same applies to similar descriptions) is thereby achieved.

Next, the memory controller 2 generates a command "XXh". While toggling the write enable signal bWE and having the command latch enable signal CLE at the H level, the memory controller 2 transmits the command "XXh" to the semiconductor memory device 1 via signals DQ<7:0>. The command "XXh" is a command used for causing the semiconductor memory device 1 to execute an operation based on an instruction code IC retained in the semiconductor memory device 1. The command "XXh" is an execution command described with reference to FIG. 10. The semiconductor memory device 1 receives the command "XXh". The operation of S02 in FIG. 10 is thereby achieved. Based on the toggling of the write enable signal bWE and the command latch enable signal being at the H level, the logic controller 13 enables the input/output circuit 12 to take the command "XXh" therein and transfer the command "XXh" to the command register 143.

In response to the receipt of the command "XXh", the second control circuit 152 transmits the ready/busy signal xRB to the logic controller 13 at the L level. Based on the L-level ready/busy signal xRB, the logic controller 13 transmits the ready/busy signal bR/B to the memory controller 2 at the L level. By the L-level ready/busy signal bR/B, the memory controller 2 is notified that, for example, the semiconductor memory device 1 is in the busy state.

The second control circuit 152 determines, based on the command "XXh", whether or not the semiconductor memory device 1 is in the true ready state. For the determination, for example, the true ready/busy signal tRB is used. When it is determined that the semiconductor memory device 1 is in the true busy state, the second control circuit 152 waits until the semiconductor memory device 1 enters the true ready state. The case where the second control circuit 152 waits in this manner will be described. Note, however, that when the second control circuit 152 determines that the semiconductor memory device 1 is in the true ready state at the time of receiving the command "XXh", the second control circuit 152 does not have to wait.

Figure 12:
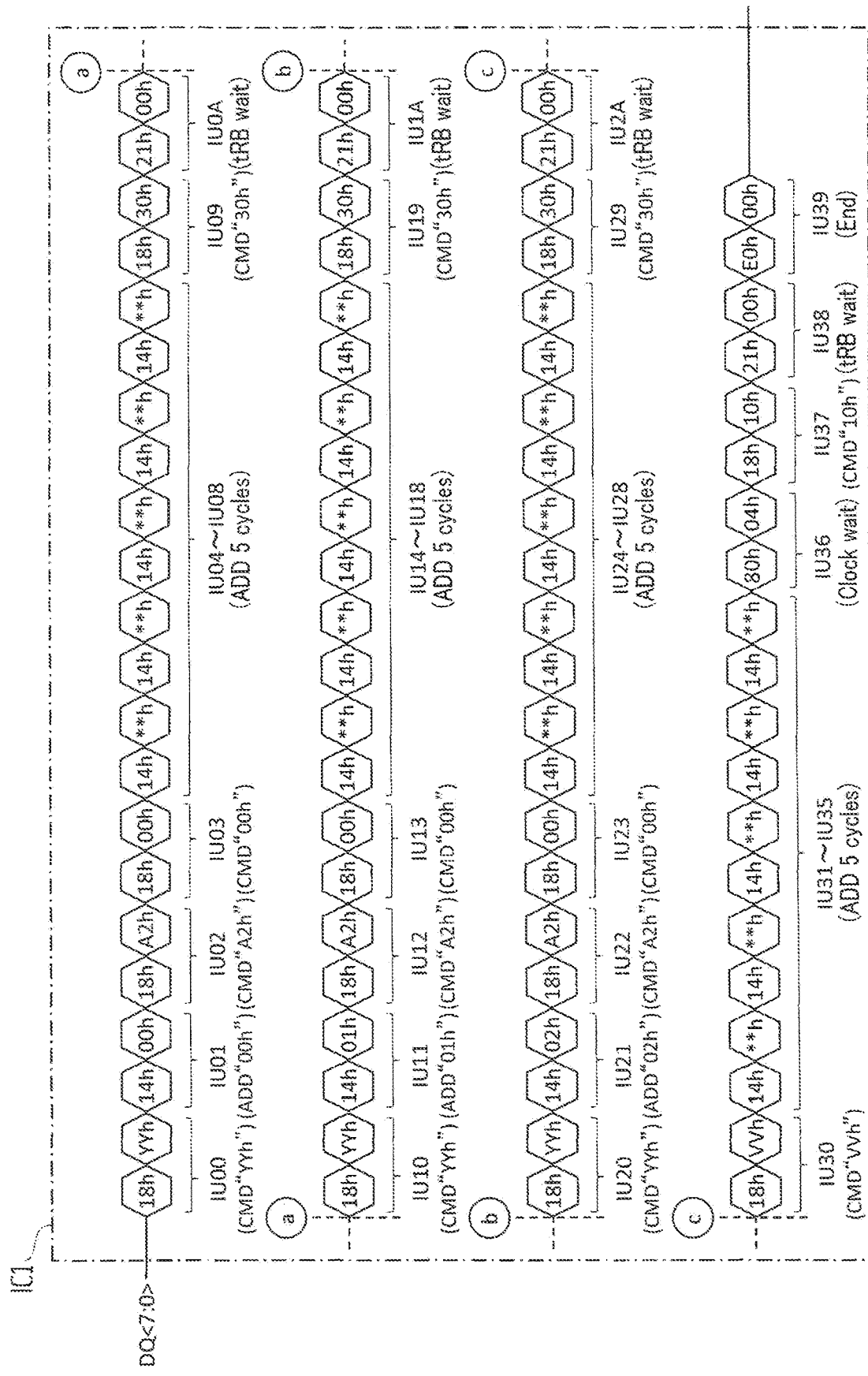
FIG. 12 shows an example of details of the instruction code used by the semiconductor memory device according to the first embodiment.

FIG. 12 shows an example of details of the instruction code IC1 shown in FIG. 11. The memory controller 2 transmits the instruction code IC1 to the semiconductor memory device 1 via signals DQ<7:0> in the order of high-order 8-bit data of an information unit IU, low-order 8-bit data of the information unit IU, high-order 8-bit data of the next information unit IU, lower-order 8-bit data of the next information unit IU, . . . . Such 8-bit data will be described in the order of being transmitted from the memory controller 2.

First, transmission of information units IU00 to IU0A will be described. In FIG. 12, supplementary explanations are provided in brackets for information units IU; however, they will be referred to later with reference to subsequent drawings.

Data "18h" is transmitted, followed by data "YYh". The data "18h" and data "YYh" are high-order 8-bit data and low-order 8-bit data of the information unit IU00, respectively. Data "14h" is transmitted, followed by data "00h". The data "14h" and data "00h" are high-order 8-bit data and low-order 8-bit data of the information unit IU01, respectively. Data "18h" is transmitted, followed by data "A2h". The data "18h" and data "A2h" are high-order 8-bit data and low-order 8-bit data of the information unit IU02, respectively. Data "18h" is transmitted, followed by data "00h". The data "18h" and data "00h" are high-order 8-bit data and low-order 8-bit data of the information unit IU03, respectively.

Transmission of data "14h" followed by some kind of data "**h" is repeated for, for example, five cycles. Data transmitted in this manner is, in transmission order, high-order 8-bit data and low-order 8-bit data of the information unit IU04, high-order 8-bit data and low-order 8-bit data of the information unit IU05, high-order 8-bit data and low-order 8-bit data of the information unit IU06, high-order 8-bit data and low-order 8-bit data of the information unit IU07, and high-order 8-bit data and low-order 8-bit data of the information unit IU08.

Data "18h" is transmitted, followed by data "30h". The data "18h" and data "30h" are high-order 8-bit data and low-order 8-bit data of the information unit IU09, respectively. Data "21h" is transmitted, followed by data "00h". The data "21h" and data "00h" are high-order 8-bit data and low-order 8-bit data of the information unit IU0A, respectively.

Second, transmission of information units IU10 to IU1A will be described.

Data "18h" is transmitted, followed by data "YYh". The data "18h" and data "YYh" are high-order 8-bit data and low-order 8-bit data of the information unit IU10, respectively. Data "14h" is transmitted, followed by data "01h". The data "14h" and data "01h" are high-order 8-bit data and low-order 8-bit data of the information unit IU11, respectively. Data "18h" is transmitted, followed by data "A2h". The data "18h" and data "A2h" are high-order 8-bit data and low-order 8-bit data of the information unit IU12, respectively. Data "18h" is transmitted, followed by data "00h". The data "18h" and data "00h" are high-order 8-bit data and low-order 8-bit data of the information unit IU13, respectively.

Transmission of data "14h" followed by some kind of data "**h" is repeated for, for example, five cycles. Data transmitted in this manner is, in transmission order, high-order 8-bit data and low-order 8-bit data of the information unit IU14, high-order 8-bit data and low-order 8-bit data of the information unit IU15, high-order 8-bit data and low-order 8-bit data of the information unit IU16, high-order 8-bit data and low-order 8-bit data of the information unit IU17, and high-order 8-bit data and low-order 8-bit data of the information unit IU18.

Data "18h" is transmitted, followed by data "30h". The data "18h" and data "30h" are high-order 8-bit data and low-order 8-bit data of the information unit IU19, respectively. Data "21h" is transmitted, followed by data "00h". The data "21h" and data "00h" are high-order 8-bit data and low-order 8-bit data of the information unit IU1A, respectively.

Third, transmission of information units IU20 to IU2A will be described.

Data "18h" is transmitted, followed by data "YYh". The data "18h" and data "YYh" are high-order 8-bit data and low-order 8-bit data of the information unit IU20, respectively. Data "14h" is transmitted, followed by data "02h". The data "14h" and data "02h" are high-order 8-bit data and low-order 8-bit data of the information unit IU21, respectively. Data "18h" is transmitted, followed by data "A2h". The data "18h" and data "A2h" are high-order 8-bit data and low-order 8-bit data of the information unit IU22, respectively. Data "18h" is transmitted, followed by data "00h". The data "18h" and data "00h" are high-order 8-bit data and low-order 8-bit data of the information unit IU23, respectively.

Transmission of data "14h" followed by some kind of data "**h" is repeated for, for example, five cycles. Data transmitted in this manner is, in transmission order, high-order 8-bit data and low-order 8-bit data of the information unit IU24, high-order 8-bit data and low-order 8-bit data of the information unit IU25, high-order 8-bit data and low-order 8-bit data of the information unit IU26, high-order 8-bit data and low-order 8-bit data of the information unit IU27, and high-order 8-bit data and low-order 8-bit data of the information unit IU28.

Data "18h" is transmitted, followed by data "30h". The data "18h" and data "30h" are high-order 8-bit data and low-order 8-bit data of the information unit IU29, respectively. Data "21h" is transmitted, followed by data "00h". The data "21h" and data "00h" are high-order 8-bit data and low-order 8-bit data of the information unit IU2A, respectively.

Lastly, transmission of information units IU30 to IU39 will be described.

Data "18h" is transmitted, followed by data "VVh". The data "18h" and data "VVh" are high-order 8-bit data and low-order 8-bit data of the information unit IU30, respectively.

Transmission of data "14h" followed by some kind of data "**h" is repeated for, for example, five cycles. Data transmitted in this manner is, in transmission order, high-order 8-bit data and low-order 8-bit data of the information unit IU31, high-order 8-bit data and low-order 8-bit data of the information unit IU32, high-order 8-bit data and low-order 8-bit data of the information unit IU33, high-order 8-bit data and low-order 8-bit data of the information unit IU34, and high-order 8-bit data and low-order 8-bit data of the information unit IU35.

Data "80h" is transmitted, followed by data "04h". The data "80h" and data "04h" are high-order 8-bit data and low-order 8-bit data of the information unit IU36, respectively. Data "18h" is transmitted, followed by data "10h". The data "18h" and data "10h" are high-order 8-bit data and low-order 8-bit data of the information unit IU37, respectively. Data "21h" is transmitted, followed by data "00h". The data "21h" and data "00h" are high-order 8-bit data and low-order 8-bit data of the information unit IU38, respectively. Data "E0h" is transmitted, followed by data "00h".

The data "E0h" and data "00h" are high-order 8-bit data and low-order 8-bit data of the information unit IU39, respectively.

FIG. 13 is an example of a timing chart that follows in time the timing chart of FIG. 11. The operation of S03 in FIG. 10 is achieved by the operation executed by the semiconductor memory device 1 to be described below.

In response to the semiconductor memory device 1 entering the true ready state, i.e., in response to the first control circuit 151 bringing the true ready/busy signal tRB to the H level, the semiconductor memory device 1 sequentially executes, based on the command "XXh", processing relating to the information units IU of the instruction code IC1 retained in the data register DR0. The semiconductor memory device 1 thereby sequentially executes operations based on the instruction code IC1. Details will be described below.

First, the semiconductor memory device 1 reads information units IU00, IU01, IU02, . . . and IU09 from the data register DR0 in the order of appearance. The semiconductor memory device 1 decodes these information units IU in the read order, and obtains various types of commands CMD and address information ADD based on the decoding results. The semiconductor memory device 1 executes a read operation in the SLC mode based on the various types of commands CMD and address information ADD. In the read operation, bits of data read from the memory cell transistors MT in a read-target area are retained in, for example, respective latch circuits ADL. Details will be described below.

The second control circuit 152 causes the data register DR0 to transfer the information unit IU00 to the instruction code decoding circuit 18. The instruction code decoding circuit 18 receives the transferred information unit IU00. In this manner, the information unit IU00 is read from the data register DR0. The same applies to the cases where the instruction code decoding circuit 18 receives an information unit IU from the data register DR0 to be described below.

The instruction code decoding circuit 18 decodes the received information unit IU00. Since the first bit, second bit, and third bit of the information unit IU00 each represent "0" data, the type of the instruction defined by the information unit IU00 is pseudo pin control. The high-order 8-bit data of the information unit IU00 is data "18h". As described with reference to FIG. 9, the instruction code decoding circuit 18 transmits control signals for pseudo pin control to the logic controller 13 and the input/output circuit 12, respectively. As a result of processing based on the control signals by the logic controller 13 and the input/output circuit 12, the input/output circuit 12 transfers the low-order 8-bit data "YYh" of the information unit IU00 to the command register 143 as a command "YYh", as described with reference to FIG. 9. The command "YYh" is a command used to cause the semiconductor memory device 1 to, for example, read data stored in the SLC mode in the memory cell transistors MT in an area in a memory cell array MCA, and cause latch circuits in the sense amplifier units SAU coupled to the memory cell transistors MT to store the data.

Then, the instruction code decoding circuit 18 receives the information unit IU01 from the data register DR0 under the control of the second control circuit 152, and decodes the information unit IU01. Since the first bit, second bit, and third bit of the information unit IU01 each represent "0" data, the type of the instruction defined by the information unit IU01 is pseudo pin control. The high-order 8-bit data of the information unit IU01 is data "14h". As described with reference to FIG. 9, the instruction code decoding circuit 18 transmits control signals for pseudo pin control to the logic controller 13 and the input/output circuit 12, respectively. As a result of processing based on the control signals by the logic controller 13 and the input/output circuit 12, the input/output circuit 12 transfers the low-order 8-bit data "Ooh" of the information unit IU01 to the address register 142 as address information "00h", as described with reference to FIG. 9. The address information ADD following the command "YYh" designates, for example, latch circuits in the respective sense amplifier unit SAU to retain the data. The address information "00h" following the command "YYh" designates, for example, latch circuits ADL.

Then, the instruction code decoding circuit 18 receives the information unit IU02 from the data register DR0 under the control of the second control circuit 152, and decodes the information unit IU02. Similarly to the above, as a result of processing by the instruction code decoding circuit 18, the logic controller 13, and the input/output circuit 12, the input/output circuit 12 transfers the low-order 8-bit data "A2h" of the information unit IU02 to the command register 143 as a command "A2h". The command "A2h" is, for example, a command used for causing the semiconductor memory device 1 to execute an operation specified by a command subsequent to the command "A2h" in the SLC mode.

Then, the instruction code decoding circuit 18 receives the information unit IU03 from the data register DR0 under the control of the second control circuit 152, and decodes the information unit IU03. Similarly to the above, as a result of processing by the instruction code decoding circuit 18, the logic controller 13, and the input/output circuit 12, the input/output circuit 12 transfers the low-order B-bit data "00h" of the information unit IU03 to the command register 143 as a command "00h". The command "00h" is a command used for causing the semiconductor memory device 1 to execute a read operation.

Then, the instruction code decoding circuit 18 receives the information unit IU04 from the data register DR0 under the control of the second control circuit 152, and decodes the information unit IU04. Similarly to the above, as a result of processing by the instruction code decoding circuit 18, the logic controller 13, and the input/output circuit 12, the input/output circuit 12 transfers the low-order 8-bit data "h" of the information unit IU04 to the address register 142 as address information "h". Similar processing is performed sequentially on the information units IU05, IU06, . . . , and IU08. Address information ADD over five cycles is retained in the address register 142 in this manner. The address information ADD over five cycles designates, for example, a read-target block BLK and a word line WL.

Then, the instruction code decoding circuit 18 receives the information unit IU09 from the data register DR0 under the control of the second control circuit 152, and decodes the information unit IU09. Similarly to the above, as a result of processing by the instruction code decoding circuit 18, the logic controller 13, and the input/output circuit 12, the input/output circuit 12 transfers the low-order 8-bit data "30h" of the information unit IU09 to the command register 143 as a command "30h". The command "30h" is a command used for causing the semiconductor memory device 1 to execute a read operation based on address information ADD received after the receipt of a command "00h".

Based on various types of commands CMD and address information ADD obtained accordingly from the information units IU00, IU01, IU02, . . . , and IU09, the first control circuit 151 starts the above-described read operation in the SLC mode. In response to the start of the control relating to the read operation, the first control circuit 151 brings the true ready/busy signal tRB to the L level, and maintains the true ready/busy signal tRB at the L level during the control, as described with reference to FIG. 7.

For example, during the control, the instruction code decoding circuit 18 receives the information unit IU0A from the data register DR0 under the control of the second control circuit 152, and decodes the information unit IU0A. Since the first bit, second bit, and third bit of the information unit IU0A represent "0" data, "0" data, and "1" data, respectively, the type of the instruction defined by the information unit IU0A is true ready/busy wait. The eighth bit of the information unit IU0A indicates that the instruction is for causing the second control circuit 152 to wait for the H level of the true ready/busy signal tRB. The instruction code decoding circuit 18 transmits a control signal for the processing corresponding to the instruction to the second control circuit 152. Based on the control signal, the second control circuit 152 waits until the first control circuit 151 brings the true ready/busy signal tRB to the H level in response to completion of the control relating to the read operation. In response to the true ready/busy signal tRB being brought to the H level and the second control circuit 152 completing the wait, the semiconductor memory device 1 operates as follows.

The semiconductor memory device 1 reads information units IU10, IU11, IU12, . . . and IU19 from the data register DR0 in the order of appearance. The semiconductor memory device 1 decodes these information units IU in the read order, and obtains various types of commands CMD and address information ADD based on the decoding results. The semiconductor memory device 1 executes a read operation in the SLC mode based on the various types of commands CMD and address information ADD. In the read operation, bits of data read from the memory cell transistors MT in a read-target area are retained in, for example, respective latch circuits BDL. Details will be described below.

The same processing as that described in connection with the information units IU00, IU01, IU02, . . . , and IU09 is sequentially performed on the information units IU10, IU11, IU12, . . . , and IU19. As a result, various types of commands CMD are transferred to the command register 143, and various types of address information ADD are transferred to the address register 142 in the following manner.

Based on the information unit IU10, a command "YYh" is transferred to the command register 143. Based on the information unit IU11, address information "01h" is transferred to the address register 142. The address information "01h" following the command "YYh" designates, for example, latch circuits BDL. Based on the information unit IU12, a command "A2h" is transferred to the command register 143. Based on the information unit IU13, a command "00h" is transferred to the command register 143. Based on the information units IU14, IU15, . . . , and IU18, address information ADD over five cycles is retained in the address register 142. The address information ADD over five cycles designates, for example, the aforementioned read-target block BLK and another word line WL. Based on the information unit IU19, a command "30h" is transferred to the command register 143.

Based on various types of commands CMD and address information ADD obtained accordingly from the information units IU10, IU11, IU12, . . . , and IU19, the first control circuit 151 starts the above-described read operation in the SLC mode. In response to the start of the control relating to the read operation, the first control circuit 151 brings the true ready/busy signal tRB to the L level, and maintains the true ready/busy signal tRB at the L level during the control.

For example, during the control, the instruction code decoding circuit 18 receives the information unit IU1A from the data register DR0 under the control of the second control circuit 152, and decodes the information unit IU1A. Since the information unit IU1A is the same 16-bit data as the information unit IU0A, the same processing as that described in connection with the information unit IU0A is performed. As a result, the second control circuit 152 waits until the first control circuit 151 brings the true ready/busy signal tRB to the H level in response to completion of the control relating to the read operation. In response to the true ready/busy signal tRB being brought to the H level and the second control circuit 152 completing the wait, the semiconductor memory device 1 operates as follows.

The semiconductor memory device 1 reads information units IU20, IU21, IU22, . . . and IU29 from the data register DR0 in the order of appearance. The semiconductor memory device 1 decodes these information units IU in the read order, and obtains various types of commands CMD and address information ADD based on the decoding results. The semiconductor memory device 1 executes a read operation in the SLC mode based on the various types of commands CMD and address information ADD. In the read operation, bits of data read from the memory cell transistors MT in a read-target area is retained in, for example, respective latch circuits CDL. Details will be described below.

The same processing as that described in connection with the information units IU00, IU01, IU02, . . . , and IU09 is sequentially performed on the information units IU20, IU21, IU22, . . . , and IU29. As a result, various types of commands CMD are transferred to the command register 143, and various types of address information ADD are transferred to the address register 142, as follows.

Based on the information unit IU20, a command "YYh" is transferred to the command register 143. Based on the information unit IU21, address information "02h" is transferred to the address register 142. The address information "02h" following the command "YYh" designates, for example, latch circuits CDL. Based on the information unit IU22, a command "A2h" is transferred to the command register 143. Based on the information unit IU23, a command "00h" is transferred to the command register 143. Based on the information units IU24, IU25, . . . , and IU28, address information ADD over five cycles is retained in the address register 142. The address information ADD over five cycles designates, for example, the aforementioned read-target block BLK and yet another word line WL. Based on the information unit IU29, a command "30h" is transferred to the command register 143.

Based on various types of commands CMD and address information ADD obtained from the information units IU20, IU21, IU22, . . . , and IU29 accordingly, the first control circuit 151 starts the above-described read operation in the SLC mode. In response to a start of control relating to the read operation, the first control circuit 151 brings the true ready/busy signal tRB to the L level, and maintains the true ready/busy signal tRB at the L level during the control.

For example, during the control, the instruction code decoding circuit 18 receives the information unit IU2A from the data register DR0 under the control of the second control circuit 152, and decodes the information unit IU2A. Since the information unit IU2A is the same 16-bit data as that of the information unit IU0A, the same processing as that described in connection with the information unit IU0A is performed. As a result, the second control circuit 152 waits until the first control circuit 151 brings the true ready/busy signal tRB to the H level in response to completion of the control relating to the read operation. In response to the true ready/busy signal tRB being brought to the H level and the second control circuit 152 completing the wait, the semiconductor memory device 1 operates as follows.

The semiconductor memory device 1 reads information units IU30, IU31, IU32, . . . and IU37 from the data register DR0 in the order of appearance. The semiconductor memory device 1 decodes these information units IU in the read order, and obtains various types of commands CMD and address information ADD based on the decoding results. The semiconductor memory device 1 executes a write operation in the TLC mode based on the various types of commands CMD and address information ADD. In the write operation, 1-page data read into the latch circuits ADL, 1-page data read into the latch circuits BDL, and 1-page data read into the latch circuits CDL, each of which is read by means of a command "YYh", are stored as 3-page data in one cell unit CU in the TLC mode. Details will be described below.

The same processing as that described in connection with the information units IU00, IU01, IU02, . . . , and IU09 is sequentially performed on the information units IU30, IU31, IU32, . . . , and IU35. As a result, various types of commands CMD are transferred to the command register 143, and various types of address information ADD are transferred to the address register 142 in the following manner.

Based on the information unit IU30, a command "VVh" is transferred to the command register 143. The command "VVh" is a command used for causing the semiconductor memory device 1 to execute a copy-back program operation. Based on the information units IU31, IU32, . . . , and IU35, address information ADD over five cycles is retained in the address register 142. The address information ADD over five cycles designates, for example, another block BLK to be a write target, and a word line WL.

Then, the instruction code decoding circuit 18 receives the information unit IU36 from the data register DR0 under the control of the second control circuit 152, and decodes the information unit IU36. Since the first bit, second bit, and third bit of the information unit IU36 represent "1" data, "0" data, and "0" data, respectively, the type of the instruction defined by the information unit IU36 is an internal clock wait. The low-order 8 bits of the information unit IU36 indicate causing the second control circuit 152 to wait until the internal clock signal changes to a given level four times. The instruction code decoding circuit 18 transmits a control signal for the processing corresponding to the instruction to the second control circuit 152. Based on the control signal, the second control circuit 152 waits until the internal clock signal changes to a given level four times.

Then, the instruction code decoding circuit 18 receives the information unit IU37 from the data register DR0 under the control of the second control circuit 152, and decodes the information unit IU37. Similarly to the above, the input/output circuit 12 transfers the low-order 8-bit data "10h" of the information unit IU37 to the command register 143 as a command "10h". The command "10h" is a command used for causing the semiconductor memory device 1 to execute a copy-back program operation based on address information ADD received after the receipt of a command "VVh".

Based on various types of commands CMD and address information ADD accordingly obtained from the information units IU30, IU31, IU32, . . . , and IU37, the first control circuit 151 starts the above-described write operation in the TLC mode. In response to the start of the control relating to the write operation, the first control circuit 151 brings the true ready/busy signal tRB to the L level, and maintains the true ready/busy signal tRB at the L level during the control.

For example, during the control, the instruction code decoding circuit 18 receives the information unit IU38 from the data register DR0 under the control of the second control circuit 152, and decodes the information unit IU38. Since the information unit IU38 is the same 16-bit data as the information unit IU0A, the same processing as that described in connection with the information unit IU0A is performed. As a result, the second control circuit 152 waits until the first control circuit 151 brings the true ready/busy signal tRB to the H level in response to completion of the control relating to the write operation. In response to the true ready/busy signal tRB being brought to the H level and the second control circuit 152 completing the wait, the semiconductor memory device 1 operates as follows.

The instruction code decoding circuit 18 receives the information unit IU39 from the data register DR0 under the control of the second control circuit 152, and decodes the information unit IU39. Since the first bit, second bit, and third bit of the information unit IU39 each represent "1" data, the type of the instruction defined by the information unit IU39 is termination of instruction code processing. The instruction code decoding circuit 18 transmits a control signal for termination of instruction code processing to the second control circuit 152. Based on the control signal, the second control circuit 152 executes processing to terminate the control based on the command "XXh". In response to the termination of the control, the second control circuit 152 brings the ready/busy signal xRB from the L level to the H level. Since the ready/busy signal xRB is at the H level, the logic controller 13 transmits the ready/busy signal bR/B to the memory controller 2 at the same level as the true ready/busy signal tRB. Namely, the logic controller 13 transmits the ready/busy signal bR/B to the memory controller 2 at the same H level as the true ready/busy signal tRB. The memory controller 2 may be thereby notified that the semiconductor memory device 1 is in the ready state.

While the semiconductor memory device 1 is sequentially executing processing relating to the information units IU of the instruction code IC1 based on the command "XXh", various signals transmitted by the memory controller 2 to the semiconductor memory device 1 are in the following states. The command latch enable signal CLE and the address latch enable signal ALE are at the L level, and the write enable signal bWE is at the H level. The signals DQS and bDQS are not toggled. Data is not transmitted via the signals DQ<7:0>.

(3) Details of Processing of Instruction Code

FIG. 14 is a flow chart showing an example of an operation executed by the semiconductor memory device 1 to achieve processing relating to information units IU by the semiconductor memory device 1, which is described with reference to FIG. 13. The operation will be described based on the example of FIG. 13.

As described with reference to FIG. 13, when the second control circuit 152 receives a command "XXh" and then the semiconductor memory device 1 enters the true ready state, the operation is started.

The second control circuit 152 determines whether or not the instruction code IC retained in the data register DR0 is accessible (S11). Details will be described below.

The second control circuit 152 determines whether or not the data bus for transferring an information unit IU from the data register DR0 to the instruction code decoding circuit 18 is in use. For example, the data bus may be used for the first control circuit 151 to access the core part 11 based on a command CMD. The second control circuit 152 determines that the instruction code IC1 is accessible when the data bus is not in use, and determines that the instruction code IC1 is not accessible when the data bus is in use.

When it is determined that the instruction code IC1 is not accessible (No in S11), the second control circuit 152 waits until, for example, a given time has passed (S12). After the wait, the second control circuit 152 performs the operation of S11 again. In this manner, the operation of S11 and the operation of S12 are alternately repeated until it is determined that the instruction code IC1 is accessible in the operation of S11.

When it is determined that the instruction code IC1 is accessible (Yes in S11), the second control circuit 152 reads an information unit IU from the data register DR0, based on the access address retained in the address register 142 (S13). Specifically, the second control circuit 152 causes the data register DR0 to transfer the information unit IU to the instruction code decoding circuit 18. In the example of FIG. 13, the information unit IU at this time is the information unit IU00.

The instruction code decoding circuit 18 receives the read information unit IU and decodes the information unit IU. Based on the first bit, second bit, and third bit of the information unit IU, the instruction code decoding circuit 18 determines whether or not the type of the instruction defined by the information unit IU is termination of instruction code processing (S14).

In the example of FIG. 13, the instruction code decoding circuit 18 determines that the type of the instruction defined by the information unit IU00 is pseudo pin control, not termination of instruction code processing. When it is determined that the type of the instruction defined by the information unit IU is not termination of instruction code processing accordingly (No in S14), the instruction code decoding circuit 18 determines whether or not the instruction involves designation of another information unit IU (S15). For example, the instruction defined by an information unit IU relating to a repeat as described with reference to FIG. 8 involves designation of an information unit IU.

According to the description of an information unit IU relating to pseudo pin control with reference to FIG. 8, the instruction defined by the information unit IU00 does not involve designation of another information unit IU. Therefore, in the example of FIG. 13, the instruction code decoding circuit 18 determines that the instruction defined by the information unit IU00 does not involve designation of another information unit IU. In this case (No in S15), the instruction code decoding circuit 18 and the second control circuit 152 process the information unit IU as described below (S16).

When the type of the instruction is pseudo pin control, the instruction code decoding circuit 18 transmits control signals for pseudo pin control to the logic controller 13 and the input/output circuit 12, respectively. As described with reference to FIG. 9, the logic controller 13 and the input/output circuit 12 execute, based on the control signals, processing corresponding to the instruction, for example under the control of the second control circuit 152. In the example of FIG. 13, the processing described in connection with the information unit IU00 with reference to FIG. 13 is performed in this way because the type of the instruction defined by the information unit IU00 is pseudo pin control.

Alternatively, when the type of the instruction is a type other than pseudo pin control, the instruction code decoding circuit 18 transmits a control signal for processing corresponding to the instruction to the second control circuit 152.

Based on the control signal, the second control circuit 152 executes the processing corresponding to the instruction.

In response to, for example, completion of the processing, the second control circuit 152 increments the access address retained in the address register 142, as described with reference to FIG. 9 (S17).

In this manner, the semiconductor memory device 1 executes a series of processing relating to the first information unit IU. Next, the semiconductor memory device 1 repeats the series of processing from the operation of S11.

In the example of FIG. 13, in the operation of S13, the information unit IU01 is read based on the incremented access address. In the operation of S16, processing corresponding to the instruction defined by the information unit IU01 is executed. Accordingly, the processing relating to the information unit IU01 described with reference to FIG. 13 is executed.

In the example of FIG. 13, the semiconductor memory device 1 repeats such a series of processing, and the processing relating to the information units IU00, IU01, IU02, . . . , and IU39 described with reference to FIG. 13 is sequentially executed. Regarding the information unit IU39, the instruction code decoding circuit 18 determines in the operation of S14 that the type of the instruction defined by the information unit IU39 is termination of instruction code processing; in this case (Yes in S14), the instruction code decoding circuit 18 transmits a control signal for termination of instruction code processing to the second control circuit 152. Based on the control signal, the second control circuit 152 executes processing to terminate the control based on the command "XXh".

The case where it is determined in the operation of S15 that the instruction defined by the information unit IU involves designation of another information unit IU (Yes in S15) will be described. For example, as described with reference to FIG. 8, when the type of the instruction is a repeat, the instruction involves designation of another information unit IU. Hereinafter, such a case where the type of the instruction is a repeat will be described. The instruction code decoding circuit 18 transmits a control signal for the processing corresponding to the instruction to the second control circuit 152.

Upon receipt of the control signal, the second control circuit 152 determines whether or not the processing corresponding to the instruction has been executed (S18). Specifically, the second control circuit 152 determines, for example, whether or not the number of repeats designated by the instruction have been completed. Information of how many repeats have been done is retained in, for example, a RAM in the sequencer 15, and is referred to by the second control circuit 152 at the time of the determination. When it is determined that the processing corresponding to the instruction has not been executed (No in S18), the second control circuit 152 causes, for example, the RAM in the sequencer 15 to retain the access address retained in the address register 142 (S19). Then, the second control circuit 152 changes the access address retained in the address register 142 to an address designating eight latch circuits XDL retaining therein the high-order 8-bit data of the information unit IU designated by the instruction (S20).

Next, the semiconductor memory device 1 repeats processing from the operation of S11. Accordingly, the semiconductor memory device 1 executes again the processing corresponding to the instructions defined by the information units IU from the designated information unit IU to the information unit IU immediately preceding the information unit IU relating to a repeat. Thereafter, in the operation of S15, it is determined again that the instruction defined by the information unit IU relating to a repeat involves designation of another information unit IU. The instruction code decoding circuit 18 transmits a control signal for the processing corresponding to the instruction to the second control circuit 152. Then, in the operation of S18, the second control circuit 152 determines again, based on the control signal, whether or not the processing corresponding to the instruction has been executed. Specifically, the second control circuit 152 determines in the above-described manner, for example, whether or not the number of repeats designated by the instruction have been completed.

When it is determined that the processing corresponding to the instruction has not been executed, the second control circuit 152 executes again the operations of S19 and S20, and the semiconductor memory device 1 repeats processing from the operation of S11 in the above-described manner.

When it is determined that the processing corresponding to the instruction has been executed (Yes in S18), the second control circuit 152 executes the operation of S17 and increments the access address retained in the address register 142. Next, the semiconductor memory device 1 repeats processing from the operation of S11.

An operation example in which the semiconductor memory device 1 sequentially executes, based on the instruction code IC1, three types of read operations in the SLC mode and a write operation in the TLC mode has been described with reference to FIGS. 11, 12, and 13. However, the operations executed by the semiconductor memory device 1 based on an instruction code IC are not limited to these. The number of operations executed based on an instruction code IC is not limited to this, and any number of operations not less than one can be executed based on an instruction code IC.

An operation example in which the semiconductor memory device 1 causes a plurality of latch circuits XDL in the data register DR0 to retain the instruction code IC1 and sequentially executes operations based on the instruction code IC1 has been described with reference to FIGS. 11, 12, and 13. In the operation example, the following control may be performed. For example, the memory controller 2 may be controlled to generate the address information ADD and instruction code IC1 in the command set CS1 so that the operations do not target the plane PB0 retaining the instruction code IC1. Alternatively, when the control is not performed and there is an operation performed on the plane PB0 retaining the instruction code IC1, the semiconductor memory device 1 performs the following control. When latch circuits XDL are used in the operation, the semiconductor memory device 1 performs control to save the instruction code IC1 in other latch circuits such as latch circuits ADL, BDL, and CDL in the data register DR0 including the latch circuits XDL while the latch circuits XDL are being used. These controls are intended to, for example, prevent corruption of the instruction code IC1 retained in latch circuits XDL.

(4) Overview of Operation

Figure 15:
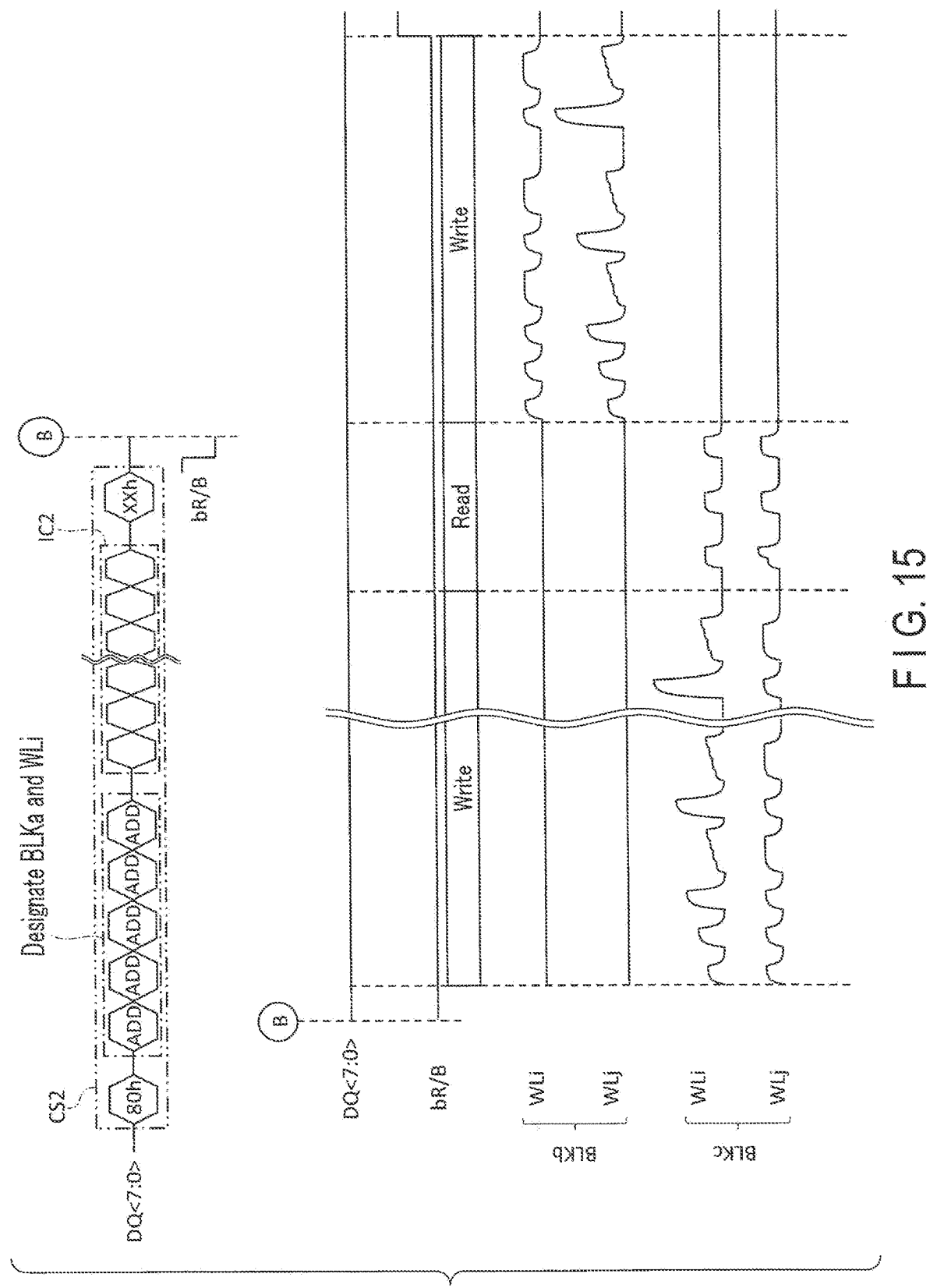
FIG. 15 shows an example of a timing chart showing a command set and temporal changes of other various signals, which relate to another operation example in which the semiconductor memory device according to the first embodiment operates based on an instruction code.

FIG. 15 shows an example of a timing chart showing a command set and temporal changes of other various signals, which relate to another operation example in which the semiconductor memory device 1 according to the first embodiment operates based on an instruction code IC.

Descriptions of FIG. 11 apply to the operation except that the command set CS1 is replaced with a command set CS2, the instruction code IC1 is replaced with an instruction code IC2, and the descriptions of the address information ADD and data register DR0 are replaced with the following descriptions.

The address information ADD over five cycles includes, for example, a block address, a page address, and a column address. The block address designates a target plane PB, and a block BLKa of the plane PB. The page address designates a word line WLi. The column address designates eight latch circuits XDL in the data register DR of the plane PB.

The data register DR of the plane PB receives the instruction code IC2. Based on the column address in the address information ADD retained in the address register 142, the data register DR causes a plurality of latch circuits XDL in the data register DR to retain the instruction code IC2.

Then, as described with reference to FIG. 13, the semiconductor memory device 1 sequentially executes, based on the command "XXh", processing relating to the information units IU of the instruction code IC2 retained in the data register DR. Accordingly, the semiconductor memory device 1 thereby sequentially executes the operations based on the instruction code IC2. Details will be described below.

As described with reference to FIG. 13, the semiconductor memory device 1 sequentially executes processing relating to information units IU from a given information unit IU to another information unit IU. The semiconductor memory device 1 thereby obtains various types of commands CMD and address information ADD based on decoding results of these information units IU. The address information ADD includes a block address and a page address. The block address designates a target block BLKc. The page address designates a target word line WLi. Based on the various types of obtained commands CMD and address information ADD, the semiconductor memory device 1 executes, for example, a write operation on the memory cell transistors MT relating to the block BLKc and word line WLi.

Subsequently, the semiconductor memory device 1 sequentially executes processing relating to information units IU from a given information unit IU to another information unit IU, as described with reference to FIG. 13. The semiconductor memory device 1 thereby obtains various types of commands CMD and address information ADD based on decoding results of these information units IU. The address information ADD includes a block address and a page address. The block address designates a target block BLKc. The page address designates a target word line WLj. Based on the various types of obtained commands CMD and address information ADD, the semiconductor memory device 1 executes, for example, a read operation on the memory cell transistors MT relating to the block BLKc and word line WLj.

Subsequently, the semiconductor memory device 1 sequentially executes processing relating to information units IU from a given information unit IU to another information unit IU, as described with reference to FIG. 13. The semiconductor memory device 1 thereby obtains various types of commands CMD and address information ADD based on decoding results of these information units IU. The address information ADD includes a block address and a page address. The block address designates a target block BLKb. The page address designates a target word line WLj. Based on the various types of obtained commands CMD and address information ADD, the semiconductor memory device 1 executes, for example, a write operation on the memory cell transistors MT relating to the block BLKb and word line WLj.

Thereafter, the semiconductor memory device 1 terminates the control based on the command "XXh" and transmits the ready/busy signal bR/B to the memory controller 2 at the H level, as described with reference to FIG. 13.

As described above, the semiconductor memory device 1 transmits the ready/busy signal bR/B to the memory controller 2 at the L level while operating based on the command "XXh" also in the example of FIG. 15. During this period, the semiconductor memory device 1 sequentially executes the first write operation, the read operation, and the second write operation, as described above. Accordingly, the semiconductor memory device 1 can execute a plurality of operations while continuing to transmit the ready/busy signal bR/B to the memory controller 2 at the L level.

Not that all of the three types of operations in the example of FIG. 15 do not target the same block BLK or the same word line WL. As in the example of FIG. 15, a plurality of operations executed by the semiconductor memory device 1 based on an instruction code IC do not necessarily target the same block BLK, or the same word line WL.

The blocks BLKc and BLKb targeted by each of the three types of operations in the example of FIG. 15 differ from the block BLKa designated by the block address of the address information ADD in the command set CS2. The word line WLj, on which each of the read operation and the second write operation is performed in the example of FIG. 15, differ from the word line WLi designated by the page address of the address information ADD in the command set CS2. Accordingly, each operation executed by the semiconductor memory device 1 based on an instruction code IC may target a block BLK different from the block BLK designated by the address information ADD in the command set CS including the instruction code IC, and may target a word line WL different from the word line WL designated by the address information ADD.

Comparative Example (1) Command Sequence

Figure 16:
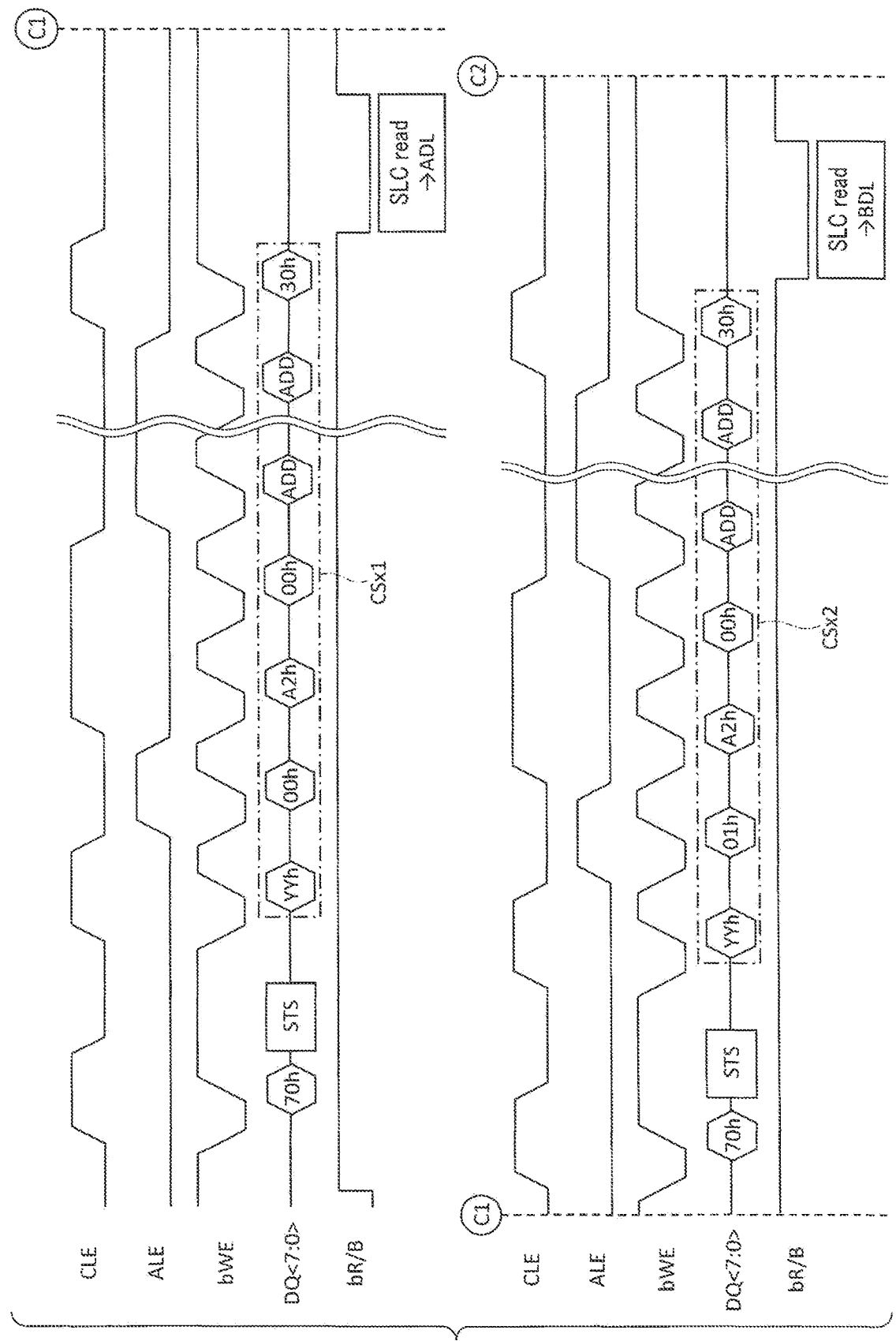
FIG. 16 shows an example of a timing chart showing a command set and temporal changes of other various signals, which relate to various operations sequentially executed by a semiconductor memory device according to a comparative example of the first embodiment.
Figure 17:
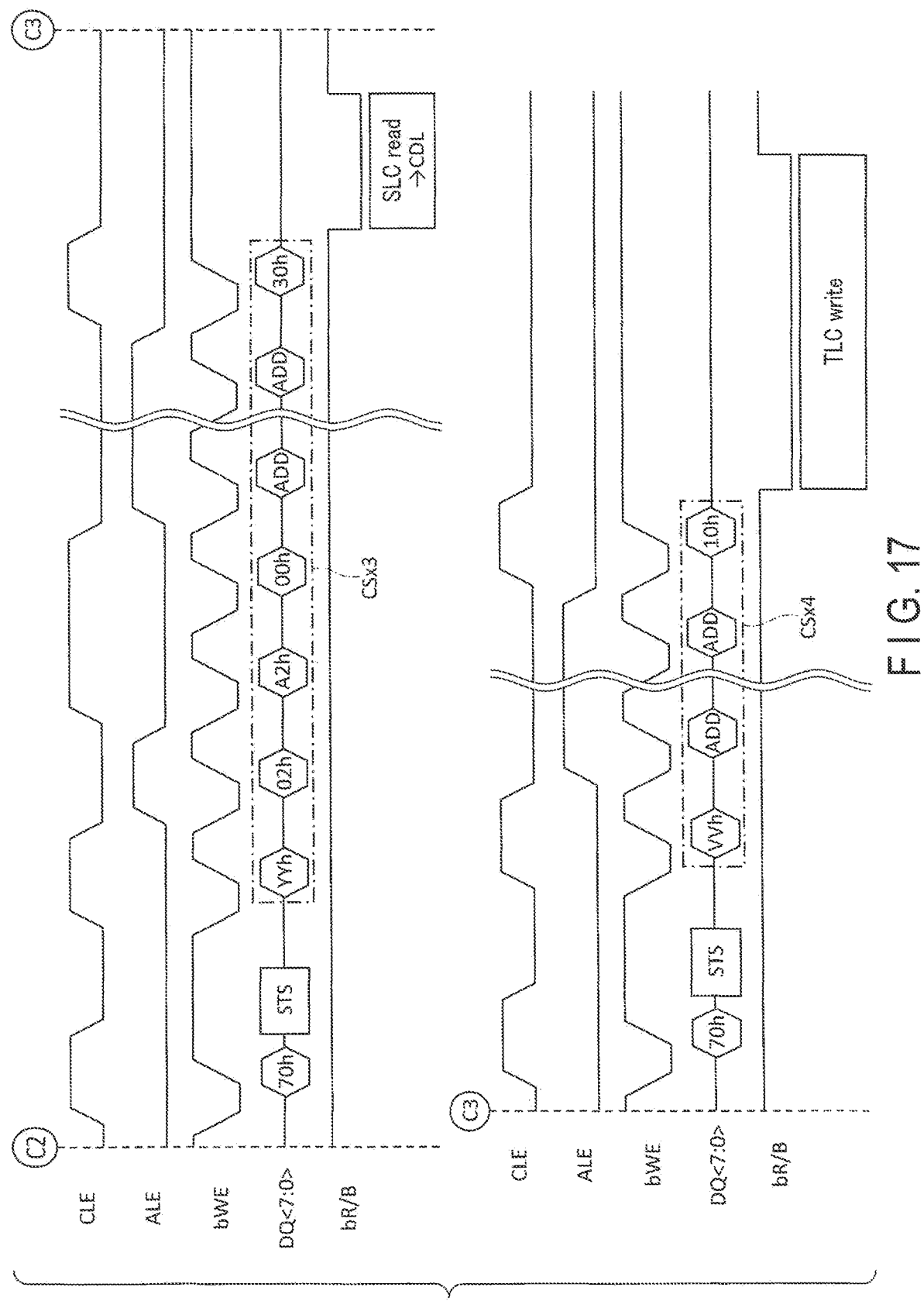
FIG. 17 shows an example of a timing chart showing a command set and temporal changes of other various signals, which relate to various operations sequentially executed by the semiconductor memory device according to the comparative example of the first embodiment.

FIGS. 16 and 17 show an example of a timing chart showing a command set and temporal changes of other various signals, which relate to various operations sequentially executed by a semiconductor memory device according to a comparative example of the first embodiment.

The timing chart shown in FIG. 16 will be first described.

First, a memory controller transmits a command set CSx1 to the semiconductor memory device, and the semiconductor memory device executes a read operation based on the command set CSx1. Details will be described below.

While toggling the write enable signal bWE and having the command latch enable signal CLE at the H level, the memory controller transmits a command "70h" to the semiconductor memory device. The command "70h" is a command used for causing the semiconductor memory device to transmit status information STS to the memory controller. In response to the receipt of the command "70h", the semiconductor memory device transmits status information STS to the memory controller.

After confirming based on the status information STS that the semiconductor memory device is in the true ready state, the memory controller transmits the command set CSx1 to the semiconductor memory device. The command set CSx1 includes a command "YYh", address information "00h", a command "A2h", a command "00h", address information ADD over five cycles, and a command "30h". In the transmission of the command set CSx1, these commands CMD and address information ADD are transmitted in the order of appearance. The memory controller transmits the commands CMD and address information ADD while toggling the write enable signal bWE. The memory controller has the command latch enable signal CLE at the H level during transmission of each of the commands CMD, and has the address latch enable signal ALE at the H level during transmission of the address information ADD. The same applies to the cases where the memory controller transmits other commands CMD and address information ADD to be described below.

In response to the receipt of the command set CSx1, the semiconductor memory device transmits the ready/busy signal bR/B to the memory controller at the L level. The semiconductor memory device executes a read operation in the SLC mode based on the command set CSx1. In the read operation, bits of data read from the memory cell transistors MT in a read-target area are retained in, for example, respective latch circuits ADL. In response to completion of the read operation, the semiconductor memory device transmits the ready/busy signal bR/B to the memory controller at the H level.

Then, the memory controller transmits a command set CSx2 to the semiconductor memory device, and the semiconductor memory device executes a read operation based on the command set CSx2. Details will be described below.

After confirming that the semiconductor memory device is in the true ready state by means of the command "70h" as described above, the memory controller transmits the command set CSx2 to the semiconductor memory device. The command set CSx2 includes a command "YYh", address information "01h", a command "A2h", a command "00h", address information ADD over five cycles, and a command "30h". In the transmission of the command set CSx2, these commands CMD and address information ADD are transmitted in the order of appearance.

In response to the receipt of the command set CSx2, the semiconductor memory device transmits the ready/busy signal bR/B to the memory controller at the L level. The semiconductor memory device executes a read operation in the SLC mode based on the command set CSx2. In the read operation, bits of data read from the memory cell transistors MT in a read-target area are retained in, for example, respective latch circuits BDL. In response to completion of the read operation, the semiconductor memory device transmits the ready/busy signal bR/B to the memory controller at the H level.

Next, the timing chart shown in FIG. 17 will be described. The timing chart is continuous in time with the timing chart of FIG. 16.

The memory controller transmits a command set CSx3 to the semiconductor memory device, and the semiconductor memory device executes a read operation based on the command set CSx3. Details will be described below.

After confirming that the semiconductor memory device is in the true ready state by means of the command "70h" as described above, the memory controller transmits the command set CSx3 to the semiconductor memory device. The command set CSx3 includes a command "YYh", address information "02h", a command "A2h", a command "00h", address information ADD over five cycles, and a command "30h". In the transmission of the command set CSx3, these commands CMD and address information ADD are transmitted in the order of appearance.

In response to the receipt of the command set CSx3, the semiconductor memory device transmits the ready/busy signal bR/B to the memory controller at the L level. The semiconductor memory device executes a read operation in the SLC mode based on the command set CSx3. In the read operation, bits of data read from the memory cell transistors MT in a read-target area are retained in, for example, respective latch circuits CDL. In response to completion of the read operation, the semiconductor memory device transmits the ready/busy signal bR/B to the memory controller at the H level.

Then, the memory controller transmits a command set CSx4 to the semiconductor memory device, and the semiconductor memory device executes a write operation based on the command set CSx4. Details will be described below.

After confirming that the semiconductor memory device is in the true ready state by means of the command "70h" as described above, the memory controller transmits the command set CSx4 to the semiconductor memory device. The command set CSx4 includes a command "VVh", address information ADD over five cycles, and a command "10h". In the transmission of the command set CSx4, these commands CMD and address information ADD are transmitted in the order of appearance.

In response to the receipt of the command set CSx4, the semiconductor memory device transmits the ready/busy signal bR/B to the memory controller at the L level. The semiconductor memory device executes a write operation in the TLC mode based on the command set CSx4. In the write operation, 1-page data read into the latch circuits ADL, 1-page data read into the latch circuits BDL, and 1-page data read into the latch circuits CDL, each of which is read by means of a command "YYh", are stored as 3-page data in one cell unit CU in the TLC mode. In response to completion of the write operation, the semiconductor memory device transmits the ready/busy signal bR/B to the memory controller at the H level.

(2) Overview of Operation

Figure 18:
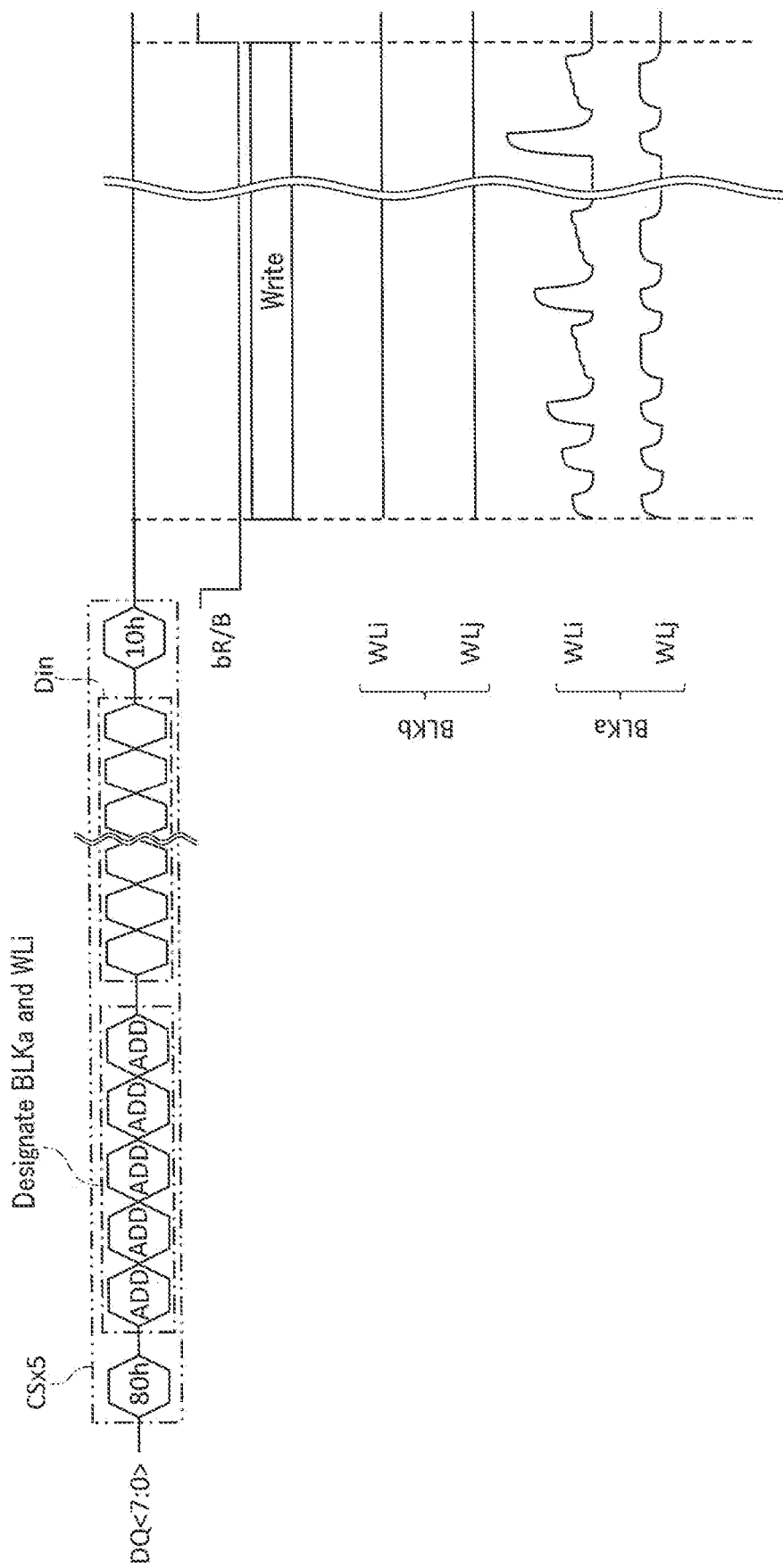
FIG. 18 shows an example of a timing chart showing a command set and temporal changes of other various signals, which relate to another operation executed by the semiconductor memory device according to the comparative example of the first embodiment.

FIG. 18 shows an example of a timing chart showing a command set and temporal changes of other various signals, which relate to another operation executed by the semiconductor memory device according to the comparative example of the first embodiment.

The memory controller transmits a command set CSx5 to the semiconductor memory device. The command set CSx5 includes a command "80h", address information ADD over five cycles, write data Din, and a command "10h". In the transmission of the command set CSx5, these commands CMD and address information ADD are transmitted in the order of appearance. The command "10h" is a command used for causing the semiconductor memory device to execute a write operation, based on address information ADD and data Din received after the receipt of a command "80h".

The address information ADD over five cycles includes, for example, a block address, a page address, and a column address. The block address designates a target plane PB, and a block BLKa of the plane PB. The page address designates a word line WLi. The column address designates eight latch circuits XDL in the data register DR of the plane PB.

In response to the receipt of the command set CSx5, the semiconductor memory device transmits the ready/busy signal bR/B to the memory controller at the L level. Based on the various types of commands CMD and address information ADD of the command set CSx5, the semiconductor memory device executes a write operation on the memory cell transistors MT relating to the block BLKa and word line WLi. In response to completion of the write operation, the semiconductor memory device transmits the ready/busy signal bR/B to the memory controller at the H level.

As described above, in the example of FIG. 18, the semiconductor memory device brings the ready/busy signal bR/B from the H level to the L level in response to the receipt of the command set CSx5. The semiconductor memory device transmits the ready/busy signal bR/B to the memory controller at the L level while executing the write operation based on the command set CSx5. In response to completion of the write operation, the semiconductor memory device transmits the ready/busy signal bR/B to the memory controller at the H level. As described above, the semiconductor memory device according to the comparative example executes an operation such as a write operation while transmitting the ready/busy signal bR/B to the memory controller at the L level, and brings the ready/busy signal bR/B from the L level to the H level upon completion of the operation.

The write operation in the example of FIG. 18 targets the block BLKa designated by the block address of the address information ADD in the command set CSx5, and the word line WLi designated by the page address of the address information ADD. Accordingly, when the semiconductor memory device according to the comparative example receives a command set CSx and operates based on the command set CSx, the operation targets a block BLK and word line WL designated by address information ADD in the command set.

Advantageous Effects

The semiconductor memory device 1 according to the first embodiment performs the next operation while being in, for example, the cache ready state. Namely, the semiconductor memory device 1 receives the command set CS1 including the instruction code IC1 from the memory controller 2, and causes a plurality of latch circuits XDL in the data register DR to retain the instruction code IC1. In response to, for example, entering the true ready state, the semiconductor memory device 1 obtains from the instruction code IC1 various types of commands CMD and address information ADD which are the same as those included in the command set CSx1 of the comparative example under the control of the instruction code decoding circuit 18, the second control circuit 152, and the like. The semiconductor memory device 1 executes a read operation based on the various types of commands CMD and address information ADD. The read operation is equivalent to the read operation executed based on the command set CSx1 in the case of the comparative example. Then, the semiconductor memory device 1 obtains from the instruction code IC1 various types of commands CMD and address information ADD which are the same as those included in the command set CSx2 of the comparative example, and executes a read operation equivalent to that in the case of the comparative example. Then, the semiconductor memory device 1 obtains from the instruction code IC1 various types of commands CMD and address information ADD which are the same as those included in the command set CSx3 of the comparative example, and executes a read operation equivalent to that in the case of the comparative example. Then, the semiconductor memory device 1 obtains from the instruction code IC1 various types of commands CMD and address information ADD which are the same as those included in the command set CSx4 of the comparative example, and executes a write operation equivalent to that in the case of the comparative example.

In the example of FIGS. 16 and 17, the memory controller confirms that the semiconductor memory device is in the true ready state before transmitting each of the command sets CSx1, CSx2, CSx3, and CSx4 to the semiconductor memory device according to the comparative example. Specifically, the memory controller transmits a command "70h" to the semiconductor memory device and confirms that the semiconductor memory device is in the true ready state based on status information STS transmitted from the semiconductor memory device in response to the command "70h". Making such a confirmation is preferable, for example, when the memory controller transmits a command that cannot be accepted unless the semiconductor memory device is in the true ready state.

In contrast, according to the first embodiment, when the semiconductor memory device 1 is in the cache ready state, the memory controller 2 transmits a command set CS to the semiconductor memory device 1 without confirming that the semiconductor memory device 1 is in the true ready state. This is because the semiconductor memory device 1 can receive the command set CS and retain the instruction code IC while being in the cache ready state, as described above. In response to entering the true ready state, the semiconductor memory device 1 can sequentially execute the operations based on the instruction code IC. Such operations include an operation executed based on a command that cannot be accepted unless the semiconductor memory device 1 enters the true ready state.

Therefore, according to the first embodiment, the memory controller 2 can transmit a command set for executing operations equivalent to those in the case of the comparative example to the semiconductor memory device 1 earlier than in the case of the comparative example. In addition, the semiconductor memory device 1 can reduce the frequency of occurrence of an event in which transmission and reception of the command "70h" and status information STS occupy some functions of the memory controller 2 and part of the memory interface between the memory controller 2 and the semiconductor memory device 1 while the semiconductor memory device 1 is in the ready state.

In the comparative example, while the semiconductor memory device is in the true ready state, the memory controller confirms that the semiconductor memory device is in the true ready state by means of the command "70h", and then transmits the command set CSx1 to the semiconductor memory device. The same applies to transmission of each of the command sets CSx2, CSx3, and CSx4.

In contrast, when the semiconductor memory device 1 according to the first embodiment receives and retains the instruction code IC1, for example, while being in the true busy state but also in the cache ready state, the semiconductor memory device 1 executes, based on the instruction code IC1, operations equivalent to the operations based on the command set CSx1 in the case of the comparative example in response to entering the true ready state. Then, the semiconductor memory device 1 internally judges the ready state of the semiconductor memory device 1 based on, for example, the true ready/busy signal tRB, and sequentially executes, based on the judgment, operations equivalent to those based on the command sets CSx2, CSx3, and CSx4 in the case of the comparative example. Therefore, the semiconductor memory device 1 according to the first embodiment can execute the equivalent operations earlier than in the case of the comparative example.

Furthermore, the semiconductor memory device 1 according to the first embodiment may receive, from the memory controller 2, a 16-bit information unit IU with reference to the signals DQS and bDQS in a much shorter cycle than when receiving an 8-bit command CMD or address information ADD with reference to the write enable signal bWE. The semiconductor memory device 1 can obtain an 8-bit command CMD or address information ADD from the 16-bit information unit IU. The instruction code IC generated by the memory controller 2 may include a plurality of information units IU that can be used to obtain a plurality of commands CMD and the like for execution of any number of operations, for example. Therefore, when the semiconductor memory device 1 receives an instruction code IC and operates based on the instruction code IC, the semiconductor memory device 1 can operate at a higher speed than when receiving various types of commands CMD and the like which are the same as those obtained from the instruction code IC with reference to the write enable signal bWE and executing the equivalent operations.

[Modifications]

Another operation example in which the semiconductor memory device 1 operates based on an instruction code IC will be described. Each modification will be described, focusing on the points different from the above-described operation example and advantageous effects.

(1) First Modification

FIG. 19 shows an example of a timing chart showing a command set and temporal changes of other various signals, which relate to an operation example in which the semiconductor memory device 1 according to a first modification of the first embodiment operates based on an instruction code IC.

Upon power-on of the semiconductor memory device 1, the first control circuit 151 causes the logic controller 13 to transmit the ready/busy signal bR/B to the memory controller 2 at the H level. By the H-level ready/busy signal bR/B, the memory controller 2 is notified that the semiconductor memory device 1 is in the ready state.

Descriptions of FIG. 11 apply to the operation after the memory controller 2 is notified that the semiconductor memory device 1 is in the ready state, except that the command set CS1 is replaced with a command set CS3, and the instruction code IC1 is replaced with an instruction code IC3.

Subsequently, as described with reference to FIG. 13, the semiconductor memory device 1 sequentially executes, based on the command "XXh", operations based on the instruction code IC3 retained in the data register DR0. Details will be described below.

First, the semiconductor memory device 1 executes a resetting operation. In the resetting operation, for example, setting information stored in a ROM in the semiconductor memory device 1 is read into a RAM in the sequencer 15 and used for resetting of the semiconductor memory device 1. Then, the semiconductor memory device 1 executes a ZQ calibration. Specifically, the semiconductor memory device 1 calibrates an output impedance of the semiconductor memory device 1 based on a reference resistance. Then, the semiconductor memory device 1 executes an operation to cause, for example, a RAM in the sequencer 15 to retain information used for changing setting of each of various operations of the semiconductor memory device 1. The semiconductor memory device 1 thereby sequentially executes the operations based on the instruction code IC3.

Then, in response to terminating control based on the command "XXh", the semiconductor memory device 1 causes the logic controller 13 to transmit the ready/busy signal bR/B to the memory controller 2 at the H level, as described with reference to FIG. 13. The memory controller 2 may be thereby notified that the semiconductor memory device 1 is in the ready state.

The descriptions of the case where the semiconductor memory device 1 operates based on the instruction code IC1 with reference to FIG. 13 apply to the command latch enable signal CLE, address latch enable ALE, write enable signal bWE, and signals DQS and bDQS while the semiconductor memory device 1 is sequentially executing processing relating to the information units IU of the instruction code IC3.

FIG. 20 shows an example of a timing chart showing a command set and temporal changes of other various signals, which relate to various operations sequentially executed by a semiconductor memory device according to a comparative example of the first modification of the first embodiment. In the timing chart shown in FIG. 20, confirmation of whether or not the semiconductor memory device is in the ready state, which is performed by a memory controller with the command "70h", is omitted.

First, the memory controller transmits a command "FFh" to the semiconductor memory device. The command "FFh" is a command used for causing the semiconductor memory device to execute a resetting operation.

In response to the receipt of the command "FFh", the semiconductor memory device transmits the ready/busy signal bR/B to the memory controller at the L level. The semiconductor memory device executes a resetting operation based on the command "FFh". In response to completion of the resetting operation, the semiconductor memory device transmits the ready/busy signal bR/B to the memory controller at the H level.

The memory controller then transmits a command "F9h" to the semiconductor memory device. The command "F9h" is a command used for causing the semiconductor memory device to execute a ZQ calibration. Then, the memory controller transmits address information ADD to the semiconductor memory device. The address information ADD following the command "F9h" designates a ZQ calibration target.

In response to receipt of the command "F9h" and address information ADD, the semiconductor memory device transmits the ready/busy signal bR/B to the memory controller at the L level. The semiconductor memory device executes a ZO calibration based on the command "F9h" and address information ADD. In response to completion of the operation to perform a ZQ calibration, the semiconductor memory device transmits the ready/busy signal bR/B to the memory controller at the H level.

The memory controller then transmits a command "EFh" to the semiconductor memory device. The command "EFh" is a command used for causing the semiconductor memory device to retain information used for changing setting of each of various operations of the semiconductor memory device. Then, the memory controller transmits address information ADD to the semiconductor memory device. The address information ADD following the command "EFh" designates an area in which information used for changing setting is stored in the semiconductor memory device. Subsequently, the memory controller transmits data Din including the information used for changing setting to the semiconductor memory device via the signals DQ<7:0>.

In response to receipt of the command "EFh", address information ADD, and data Din, the semiconductor memory device transmits the ready/busy signal bR/B to the memory controller at the L level. The semiconductor memory device executes an operation to retain information used for changing setting, based on the command "EFh", address information ADD, and data Din. In response to completion of the operation, the semiconductor memory device transmits the ready/busy signal bR/B to the memory controller at the H level.

The memory controller controls the write enable signal bWE, command latch enable signal CLE, and address latch enable signal ALE as described with reference to FIG. 16. The memory controller also transmits data Din while toggling the signals DQS and bDQS.

The semiconductor memory device 1 according to the first modification of the first embodiment further produces the following advantageous effects.

In the example of FIG. 19, the semiconductor memory device 1 sequentially executes, based on the instruction code IC3, a resetting operation, a ZQ calibration, and an operation to retain information used for changing setting of each of various operations. Each of these operations is an operation not involving an access to a plane PB or an operation not using latch circuits XDL even if it does involve an access to a plane PB. Therefore, these operations never cause corruption of an instruction code IC retained in latch circuits XDL. Accordingly, the semiconductor memory device 1 and/or memory controller 2 need not perform special control to prevent corruption of an instruction code IC. Namely, the semiconductor memory device 1 according to the first modification of the first embodiment may facilitate system design.

(2) Second Modification

Figure 21:
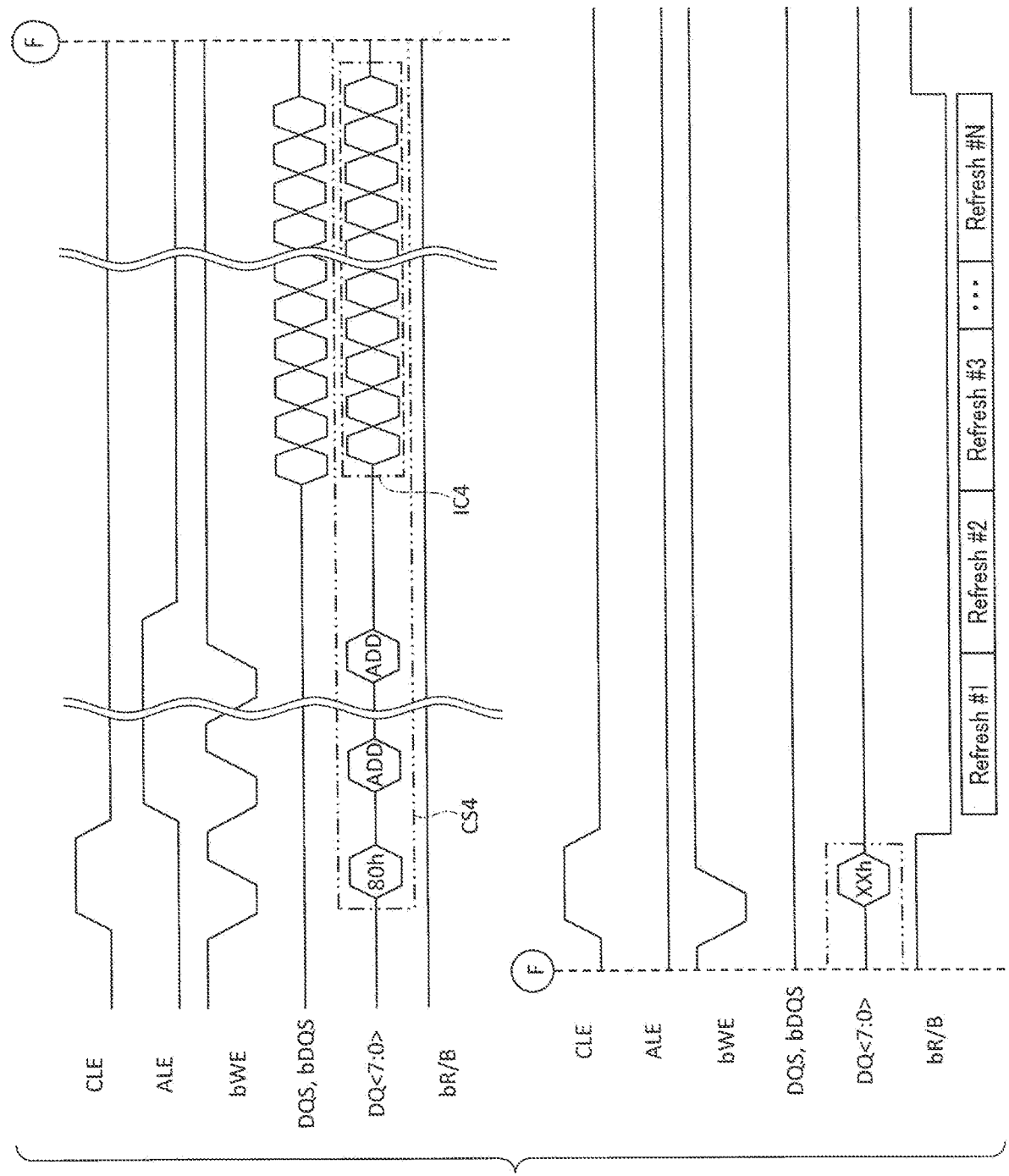
FIG. 21 shows an example of a timing chart showing a command set and temporal changes of other various signals, which relate to an operation example in which a semiconductor memory device according to a second modification of the first embodiment operates based on an instruction code.

FIG. 21 shows an example of a timing chart showing a command set and temporal changes of other various signals, which relate to an operation example in which the semiconductor memory device 1 according to a second modification of the first embodiment operates based on an instruction code IC.

Descriptions of FIG. 11 apply to the operation except that the command set CS1 is replaced with a command set CS4, and the instruction code IC1 is replaced with an instruction code IC4.

Then, as described with reference to FIG. 13, the semiconductor memory device 1 sequentially executes, based on the command "XXh", operations based on the instruction code IC4 retained in the data register DR0. Details will be described below.

First, the semiconductor memory device 1 executes a refresh operation (shown as "refresh #1" in FIG. 21) on a block BLK. The refresh operation will be described below.

With the passage of time from storage of data in a memory cell transistor MT, for example, some of the electrons stored in the charge storage layer of the memory cell transistor MT may escape from the charge storage layer, causing a drop in the threshold voltage of the memory cell transistor MT. Therefore, depending on the time elapsed from storage of the data, the semiconductor memory device 1 may not be able to correctly read the data. For example, before becoming unable to correctly read the data, the semiconductor memory device 1 applies a read pass voltage VREAD to the word line WL coupled to the gate of the memory cell transistor MT. For example, an operation to apply a read pass voltage VREAD to all word lines WL of a target block BLK is referred to as a refresh operation. The refresh operation eliminates the influence of time passage on the threshold voltages of memory cell transistors MT.

Subsequently, the semiconductor memory device 1 executes a second refresh operation (shown as "refresh #2" in FIG. 21) on the next block BLK. Then, the semiconductor memory device 1 executes a third refresh operation (shown as "refresh #3" in FIG. 21) on the further next block BLK.

The semiconductor memory device 1 repeats a refresh operation until the N-th refresh operation (shown as "refresh #N" in FIG. 21) on the N-th block BLK. Hereinafter, the case where N is 16 will be described as an example.

Subsequently, in response to terminating control based on the command "XXh", the semiconductor memory device 1 causes the logic controller 13 to transmit the ready/busy signal bR/B to the memory controller 2 at the H level, as described with reference to FIG. 13. The memory controller 2 may be thereby notified that the semiconductor memory device 1 is in the ready state.

The descriptions of the case where the semiconductor memory device 1 operates based on the instruction code IC1 with reference to FIG. 13 apply to the command latch enable signal CLE, address latch enable ALE, write enable signal bWE, and signals DQS and bDQS while the semiconductor memory device 1 is sequentially executing processing relating to the information units IU of the instruction code IC4.

Figure 22:
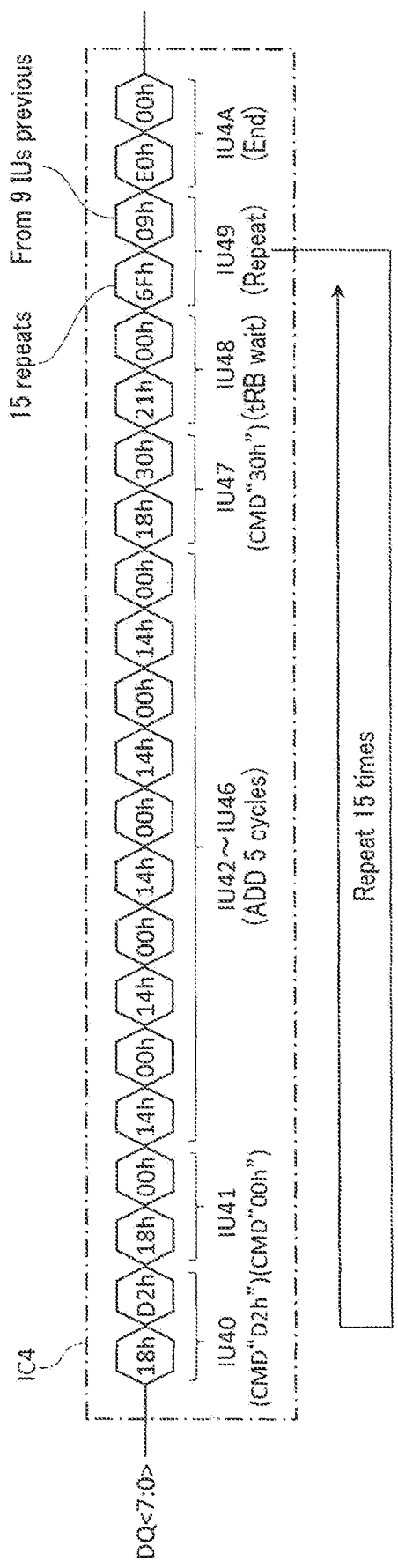
FIG. 22 shows an example of details of the instruction code used by the semiconductor memory device according to the second modification of the first embodiment.

FIG. 22 shows an example of details of the instruction code IC4 shown in the timing chart of FIG. 21. The memory controller 2 transmits the instruction code IC4 to the semiconductor memory device 1 via signals DQ<7:0> in the order of high-order 8-bit data of an information unit IU, low-order 8-bit data of the information unit IU, high-order 8-bit data of the next information unit IU, lower-order 8-bit data of the next information unit IU, . . . . Such 8-bit data will be described in the order of being transmitted from the memory controller 2.

Data "18h" is transmitted, followed by data "D2h". The data "18h" and data "D2h" are high-order 8-bit data and low-order 8-bit data of the information unit IU40, respectively. Data "18h" is transmitted, followed by data "00h". The data "18h" and data "00h" are high-order 8-bit data and low-order 8-bit data of the information unit IU41, respectively.

Transmission of data "14h" followed by data "00h" is performed for, for example, five cycles. Data transmitted in this manner is, in transmission order, high-order 8-bit data and low-order 8-bit data of the information unit IU42, high-order 8-bit data and low-order 8-bit data of the information unit IU43, high-order 8-bit data and low-order 8-bit data of the information unit IU44, high-order 8-bit data and low-order 8-bit data of the information unit IU45, and high-order 8-bit data and low-order 8-bit data of the information unit IU46.

Data "18h" is transmitted, followed by data "30h". The data "18h" and data "30h" are high-order 8-bit data and low-order 8-bit data of the information unit IU47, respectively. Data "21h" is transmitted, followed by data "00h". The data "21h" and data "00h" are high-order 8-bit data and low-order 8-bit data of the information unit IU48, respectively. Data "6Fh" is transmitted, followed by data "09h". The data "6Fh" and data "09h" are high-order 8-bit data and low-order 8-bit data of the information unit IU49, respectively.

Data "E0h" is transmitted, followed by data "00h". The data "E0h" and data "00h" are high-order 8-bit data and low-order 8-bit data of the information unit IU4A, respectively.

The semiconductor memory device 1 achieves the above-mentioned 16 refresh operations by sequentially executing processing relating to the information units IU of the instruction code IC4. Details of the processing relating to the information units IU of the instruction code IC4, which is sequentially executed by the semiconductor memory device 1, will be described.

First, the semiconductor memory device 1 reads information units IU40, IU41, IU42, . . . and IU47 from the data register DR0 in the order of appearance. The semiconductor memory device 1 decodes these information units IU in the read order, and obtains various types of commands CMD and address information ADD based on the decoding results. Based on the various types of obtained commands, the semiconductor memory device 1 executes the first refresh operation. Details will be described below.

The instruction code decoding circuit 18 receives the information unit IU40 from the data register DR0 under the control of the second control circuit 152, and decodes the information unit IU40. As a result of processing by the instruction code decoding circuit 18, the logic controller 13, and the input/output circuit 12, the input/output circuit 12 transfers the low-order 8-bit data "D2h" of the information unit IU40 to the command register 143 as a command "D2h". The command "D2h" is a command used for causing the semiconductor memory device 1 to execute a refresh operation.

Then, the instruction code decoding circuit 18 receives the information unit IU41 from the data register DR0 under the control of the second control circuit 152, and decodes the information unit IU41. As a result of processing by the instruction code decoding circuit 18, the logic controller 13, and the input/output circuit 12, the input/output circuit 12 transfers the low-order 8-bit data "00h" of the information unit IU41 to the command register 143 as a command "00h".

Then, the instruction code decoding circuit 18 receives the information unit IU42 from the data register DR0 under the control of the second control circuit 152, and decodes the information unit IU42. As a result of processing by the instruction code decoding circuit 18, the logic controller 13, and the input/output circuit 12, the input/output circuit 12 transfers the low-order 8-bit data "00h" of the information unit IU42 to the address register 142 as address information "00h". Similar processing is performed sequentially on the information units IU43, IU44, . . . , and IU46. Address information ADD over five cycles is retained in the address register 142 in this manner.

Then, the instruction code decoding circuit 18 receives the information unit IU47 from the data register DR0 under the control of the second control circuit 152, and decodes the information unit IU47. As a result of processing by the instruction code decoding circuit 18, the logic controller 13, and the input/output circuit 12, the input/output circuit 12 transfers the low-order 8-bit data "30h" of the information unit IU47 to the command register 143 as a command "30h".

Based on various types of commands CMD obtained from the information units IU40, IU41, IU42, . . . , and IU47 accordingly, the first control circuit 151 starts the above-described first refresh operation. In response to the start of the control relating to the refresh operation, the first control circuit 151 brings the true ready/busy signal tRB to the L level, and maintains the true ready/busy signal tRB at the L level during the control.

For example, during the control, the instruction code decoding circuit 18 receives the information unit IU48 from the data register DR0 under the control of the second control circuit 152, and decodes the information unit IU48. Since the information unit IU48 is the same 16-bit data as the information unit IU0A, the same processing as that described in connection with the information unit IU0A is performed. As a result, the second control circuit 152 waits until the first control circuit 151 brings the true ready/busy signal tRB to the H level in response to completion of the control relating to the refresh operation. In response to the true ready/busy signal tRB being brought to the H level and the second control circuit 152 completing the wait, the semiconductor memory device 1 operates as follows.

The instruction code decoding circuit 18 receives the information unit IU49 from the data register DR0 under the control of the second control circuit 152, and decodes the information unit IU49. Since the first bit, second bit, and third bit of the information unit IU49 represent "0" data, "1" data, and "1" data, respectively, the type of the instruction defined by the information unit IU49 is a repeat. The fourth to eighth bits of the information unit IU49 indicate 15 repeats. The low-order 8 bits indicate that the repeats start from the nine information units IU previous. The instruction code decoding circuit 18 transmits a control signal for the processing corresponding to the instruction to the second control circuit 152. Based on the control signal, the second control circuit 152 executes processing to cause the semiconductor memory device 1 to repeat 15 times the processing corresponding to the instructions defined by the information units IU from the information unit IU40, which is the nine information units previous from the information unit IU49, to the information unit IU48, as described with reference to FIG. 14.

In this manner, the first control circuit 151 repeatedly executes the refresh operation from the second refresh operation to the N-th refresh operation.

Then, the instruction code decoding circuit 18 receives the information unit IU4A from the data register DR0 under the control of the second control circuit 152, and decodes the information unit IU4A. Since the information unit IU4A is the same 16-bit data as the information unit IU39, the same processing as that described in connection with the information unit IU39 is performed. As a result, the second control circuit 152 executes processing to terminate the control based on the command "XXh".

Figure 23:
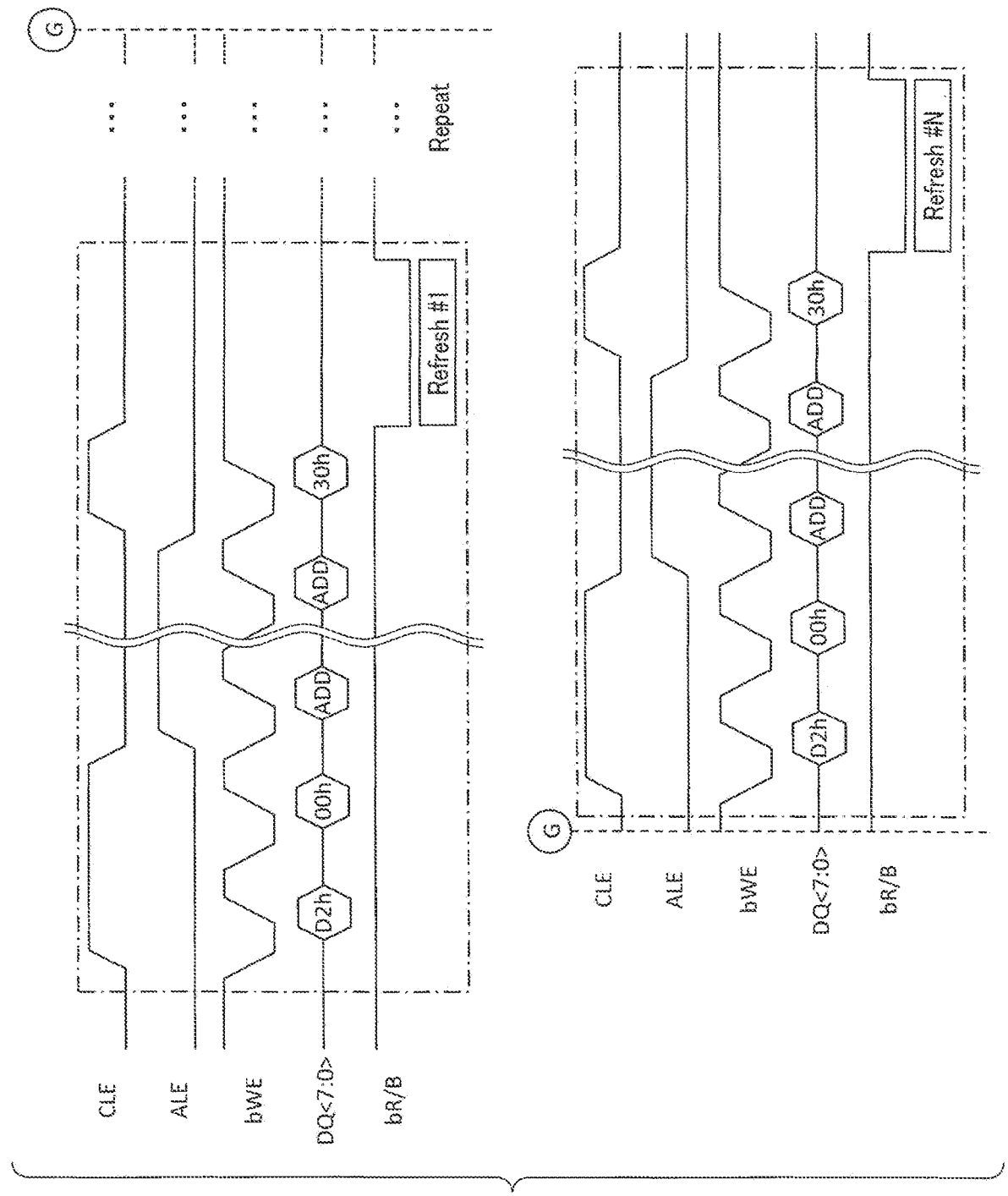
FIG. 23 shows an example of a timing chart showing a command set and temporal changes of other various signals, which relate to various operations sequentially executed by a semiconductor memory device according to a comparative example of the second modification of the first embodiment.

FIG. 23 shows an example of a timing chart showing a command set and temporal changes of other various signals, which relate to various operations sequentially executed by a semiconductor memory device according to a comparative example of the second modification of the first embodiment. In the timing chart shown in FIG. 23, confirmation of whether or not the semiconductor memory device is in the ready state, which is performed by a memory controller with the command "70h", is omitted.

First, the memory controller transmits a command "D2h", a command "00h", address information ADD over five cycles, and a command "30h" to the semiconductor memory device in the order of appearance. In response to receipt of the command "30h", the semiconductor memory device transmits the ready/busy signal bR/B to the memory controller at the L level. Based on the various types of commands CMD, the semiconductor memory device executes the first refresh operation. In response to completion of the refresh operation, the semiconductor memory device transmits the ready/busy signal bR/B to the memory controller at the H level.

Then, the memory controller transmits the same types of commands CMD and address information ADD as described above to the semiconductor memory device. Based on the various types of commands CMD, the semiconductor memory device executes the second refresh operation (not shown). The semiconductor memory device controls the ready/busy signal bR/B in the same manner as described above.

The memory controller and semiconductor memory device each repeat the same operation, and the semiconductor memory device thereby repeats the refresh operation up to the N-th refresh operation.

The memory controller controls the write enable signal bWE, command latch enable signal CLE, and address latch enable signal ALE as described with reference to FIG. 16.

The semiconductor memory device 1 according to the second modification of the first embodiment further produces the following advantageous effects.

In the example of FIGS. 21 and 22, the instruction code IC4 transmitted by the memory controller 2 to the semiconductor memory device 1 includes the information unit IU49 relating to a repeat. First, the semiconductor memory device 1 executes a refresh operation by sequentially executing processing corresponding to instructions defined by the information units IU from the information unit IU40 to the information unit IU47. Subsequently, the semiconductor memory device 1 executes the processing corresponding to the instruction defined by the information unit IU48, and then executes processing to repeat 15 times the processing corresponding to the instructions defined by the information units IU from the information unit IU40 to the information unit IU48 under control based on the information unit IU49 by the second control circuit 152. The semiconductor memory device 1 thereby executes the refresh operation 15 times more.

Use of such an instruction code IC enables the semiconductor memory device 1 to execute operations equivalent to those executed based on an instruction code IC not including an information unit IU relating to a repeat, based on an instruction code IC comprised of a fewer number of information units IU. Therefore, the semiconductor memory device 1 according to the second modification of the first embodiment can shorten the time for generation and transmission of an instruction code IC by the memory controller 2. Namely, the time during which functions of the memory controller 2 are used for an instruction code IC can be shortened. In addition, the time required for the semiconductor memory device 1 to receive an instruction code IC is also shortened; accordingly, the operation of the semiconductor memory device 1 can be sped up.

(3) Third Modification

FIG. 24 shows an example of a timing chart showing a command set and temporal changes of other various signals, which relate to an operation example in which the semiconductor memory device 1 according to a third modification of the first embodiment operates based on an instruction code IC.

In the operation, a command set CS5 is used. The command set CS5 is a command set prepared by modifying the command set CS1 to include an instruction code IC5 instead of the instruction code IC1. The instruction code IC5 is an instruction code prepared by modifying the instruction code IC1 to include information units IU57 and IU58 instead of the information units IU37 and IU38.

Descriptions of FIG. 11 apply to the operation except that the command set CS1 is replaced with the command set CS5, and the instruction code IC1 is replaced with the instruction code IC5. Descriptions of FIG. 12 also apply to the operation except that the instruction code IC1 is replaced with the instruction code IC5, the information unit IU37 is replaced with the information unit IU57, the information unit IU38 is replaced with the information unit IU58, and the descriptions of the information units IU37 and IU38 are replaced with the following descriptions. The following descriptions relate to transmission of information units IU from the memory controller 2 to the semiconductor memory device 1.

Following the information unit IU36, the information unit IU57 is transmitted. Specifically, data "18h" is transmitted, followed by data "15h". The data "18h" and data "15h" are high-order 8-bit data and low-order 8-bit data of the information unit IU57, respectively. Following the information unit IU57, the information unit IU58 is transmitted. Specifically, data "21h" is transmitted, followed by data "00h". The data "21h" and data "00h" are high-order 8-bit data and low-order 8-bit data of the information unit IU58, respectively. Following the information unit IU58, the information unit IU39 is transmitted.

Then, as described with reference to FIG. 13, the semiconductor memory device 1 sequentially executes, based on the command "XXh", processing relating to the information units IU of the instruction code IC5. The semiconductor memory device 1 thereby sequentially executes operations based on the instruction code IC5. Details will be described below.

As described with reference to FIG. 13, the semiconductor memory device 1 executes processing relating to the information units IU from the information unit IU00 to the information unit IU2A. The semiconductor memory device 1 thereby sequentially executes the three types of read operations in the SLC mode as described with reference to FIG. 13. The descriptions of the level of the true ready/busy signal tRB with reference to FIG. 13 apply until the first control circuit 151 brings the level to the H level in response to completion of the control relating to the third read operation in the SLC mode. During this period, the cache ready/busy signal cRB output by the first control circuit 151 is at the same level as the true ready/busy signal tRB.

Subsequent to the processing relating to the information unit IU2A, the semiconductor memory device 1 reads the information units IU30, IU31, IU32, . . . , IU36, and IU57 from the data register DR0 in the order of appearance. The semiconductor memory device 1 decodes these information units IU in the read order, and obtains various types of commands CMD and address information ADD based on the decoding results. The semiconductor memory device 1 executes a write operation in the same TLC mode as in the example of FIG. 13, based on the various types of commands CMD and address information ADD. Details will be described below.

The processing described with reference to FIG. 13 is performed on the information units IU30, IU31, IU32, . . . , and IU36. As a result, as described with reference to FIG. 13, the various types of commands CMD are transferred to the command register 143 and the various types of address information ADD are transferred to the address register 142, based on the information units IU30, IU31, IU32, . . . , and IU35, and the second control circuit 152 waits until the internal clock signal changes to a given level four times, based on the information unit IU36.

Then, the instruction code decoding circuit 18 receives the information unit IU57 from the data register DR0 under the control of the second control circuit 152, and decodes the information unit IU57. The input/output circuit 12 transfers the low-order 8-bit data "15h" of the information unit IU57 to the command register 143 as a command "15h". The command "15h" is a command used for causing the semiconductor memory device 1 to execute a copy-back program operation as a cache program operation, based on address information ADD received after the receipt of a command "VVh".

Based on various types of commands CMD and address information ADD accordingly obtained from the information units IU30, IU31, IU32, . . . , IU36 and IU57, the first control circuit 151 starts the above-described write operation in the TLC mode. The write operation is executed as a cache program operation. In response to the start of the control relating to the write operation, the first control circuit 151 brings the true ready/busy signal tRB and the cache ready/busy signal cRB to the L level, and maintains the true ready/busy signal tRB at the L level during the control. In response to the start of the control, the first control circuit 151 performs control to cause the logic controller 13 to output the ready/busy signal bR/B at the same level as the cache ready/busy signal cRB. The logic controller 13 is thereby enabled to output the ready/busy signal bR/B at the same level as the cache ready/busy signal cRB when the ready/busy signal xRB is brought to the H level.

For example, during the control relating to the write operation, the instruction code decoding circuit 18 receives the information unit IU58 from the data register DR0 under the control of the second control circuit 152, and decodes the information unit IU58. Since the information unit IU58 is the same 16-bit data as the information unit IU0A, the same processing as that described in connection with the information unit IU0A is performed. As a result, the second control circuit 152 waits until the first control circuit 151 brings the true ready/busy signal tRB to the H level in response to completion of the control relating to the write operation. During the wait, in response to latch circuits XDL becoming available for an operation relating to a command CMD that may be subsequently accepted by the semiconductor memory device 1, the first control circuit 151 brings the cache ready/busy signal cRB to the H level. In response to the true ready/busy signal tRB being brought to the H level and the second control circuit 152 completing the wait, the semiconductor memory device 1 operates as follows.

The same processing as that described with reference to FIG. 13 is performed on the information unit IU39. As a result, the second control circuit 152 executes processing to terminate the control based on the command "XXh", based on the control signal for termination of instruction code processing. In response to the termination of the control, the second control circuit 152 brings the ready/busy signal xRB from the L level to the H level. Since the ready/busy signal xRB is at the H level, the logic controller 13 transmits the ready/busy signal bR/B to the memory controller 2 at the same level as the cache ready/busy signal cRB under the control of the first control circuit 151. Namely, the logic controller 13 transmits the ready/busy signal bR/B to the memory controller 2 at the same H level as the cache ready/busy signal cRB. The memory controller 2 may be thereby notified that the semiconductor memory device 1 is in the ready state.

The descriptions of the case where the semiconductor memory device 1 operates based on the instruction code IC1 with reference to FIG. 13 apply to the command latch enable signal CLE, address latch enable ALE, write enable signal bWE, and signals DQS and bDQS while the semiconductor memory device 1 is sequentially executing processing relating to the information units IU of the instruction code IC5.

FIG. 25 shows an example of a timing chart showing a command set and temporal changes of other various signals, which relate to another operation example in which the semiconductor memory device 1 according to the third modification of the first embodiment operates based on an instruction code IC.

In the operation, a command set CS6 is used. The command set CS6 is a command set prepared by modifying the command set CS5 to include an instruction code IC6 instead of the instruction code IC5. The instruction code IC6 is an instruction code prepared by modifying the instruction code IC5 to include an information unit IU68 instead of the information unit IU58.

Descriptions of FIG. 24 apply to the operation except that the command set CS5 is replaced with the command set CS6, the instruction code IC5 is replaced with the instruction code IC6, the information unit IU58 is replaced with the information unit IU68, and the descriptions of the information unit IU58 are replaced with the following descriptions.

First, transmission of information units IU from the memory controller 2 to the semiconductor memory device 1 is described below.

Following the information unit IU57, the information unit IU68 is transmitted. Specifically, data "41h" is transmitted, followed by data "00h". The data "41h" and data "00h" are high-order 8-bit data and low-order 8-bit data of the information unit IU68, respectively. Following the information unit IU68, the information unit IU39 is transmitted.

Details of the processing relating to the information units IU by the semiconductor memory device 1 will be described below.

Following the information unit IU57, the instruction code decoding circuit 18 receives the information unit IU68 from the data register DR0 under the control of the second control circuit 152, and decodes the information unit IU68. Since the first bit, second bit, and third bit of the information unit IU68 represent "0" data, "1" data, and "0" data, respectively, the type of the instruction defined by the information unit IU68 is cache ready/busy wait. The eighth bit of the information unit IU68 indicates that the instruction is for causing the second control circuit 152 to wait for the H level of the cache ready/busy signal cRB. The instruction code decoding circuit 18 transmits a control signal for the processing corresponding to the instruction to the second control circuit 152. Based on the control signal, the second control circuit 152 waits until the first control circuit 151 brings the cache ready/busy signal cRB to the H level. During the control relating to the write operation in the TLC mode, in response to latch circuits XDL becoming available for an operation relating to a command CMD that may be subsequently accepted by the semiconductor memory device 1, the first control circuit 151 brings the cache ready/busy signal cRB to the H level. In response to the cache ready/busy signal cRB being brought to the H level and the second control circuit 152 completing the wait, the semiconductor memory device 1 operates as follows.

The same processing as that described with reference to FIG. 13 is performed on the information unit IU39. As a result, the second control circuit 152 executes processing to terminate the control based on the command "XXh", based on the control signal for termination of instruction code processing. In response to the termination of the control, the second control circuit 152 brings the ready/busy signal xRB from the L level to the H level. Since the ready/busy signal xRB is at the H level, the logic controller 13 transmits the ready/busy signal bR/B to the memory controller 2 at the same level as the cache ready/busy signal cRB under the control of the first control circuit 151. Namely, the logic controller 13 transmits the ready/busy signal bR/B to the memory controller 2 at the same H level as the cache ready/busy signal cRB. The memory controller 2 may be thereby notified that the semiconductor memory device 1 is in the ready state.

Thereafter, the first control circuit 151 brings the true ready/busy signal tRB to the H level in response to completion of the control relating to the write operation.

The descriptions of the case where the semiconductor memory device 1 operates based on the instruction code IC1 with reference to FIG. 13 apply to the command latch enable signal CLE, address latch enable signal ALE, write enable signal bWE, and signals DQS and bDQS while the semiconductor memory device 1 is sequentially executing processing relating to the information units IU of the instruction code IC6.

The semiconductor memory device 1 according to the third modification of the first embodiment further produces the following advantageous effects.

In the example of FIGS. 24 and 25, the semiconductor memory device 1 executes a cache program operation based on the instruction code IC5 or IC6. The instruction code IC6 in the example of FIG. 25 includes the information unit IU68 relating to cache ready/busy wait. In response to entering the cache ready state during execution of the cache program operation, the semiconductor memory device 1 executes, based on the information unit IU68, processing relating to the next information unit IU39. As a result, in response to entering the cache ready state, the semiconductor memory device 1 transmits the ready/busy signal bR/B to the memory controller 2 at the H level. The memory controller 2 may be thereby notified that the semiconductor memory device 1 is in the cache ready state even though the semiconductor memory device 1 is in the true ready state. In the cache ready state, latch circuits XDL are available for an operation relating to a command CMD that may be subsequently accepted by the semiconductor memory device 1. Therefore, according to the third modification of the first embodiment, the memory controller 2 can transmit a command set for executing the next operation to the semiconductor memory device 1 early without waiting for the semiconductor memory device 1 to enter the true ready state.

Second Embodiment

A semiconductor memory device 1*a* according to a second embodiment will be described below.

A configuration of the semiconductor memory device 1*a* according to the second embodiment will be described, focusing on differences from the configuration of the semiconductor memory device 1 according to the first embodiment.

Descriptions of FIG. 1 apply to a memory system 3*a* (not shown) including the semiconductor memory device 1*a*, except that the memory system 3 is replaced with the memory system 3*a*, and the semiconductor memory device 1 is replaced with the semiconductor memory device 1*a*.

Figure 26:
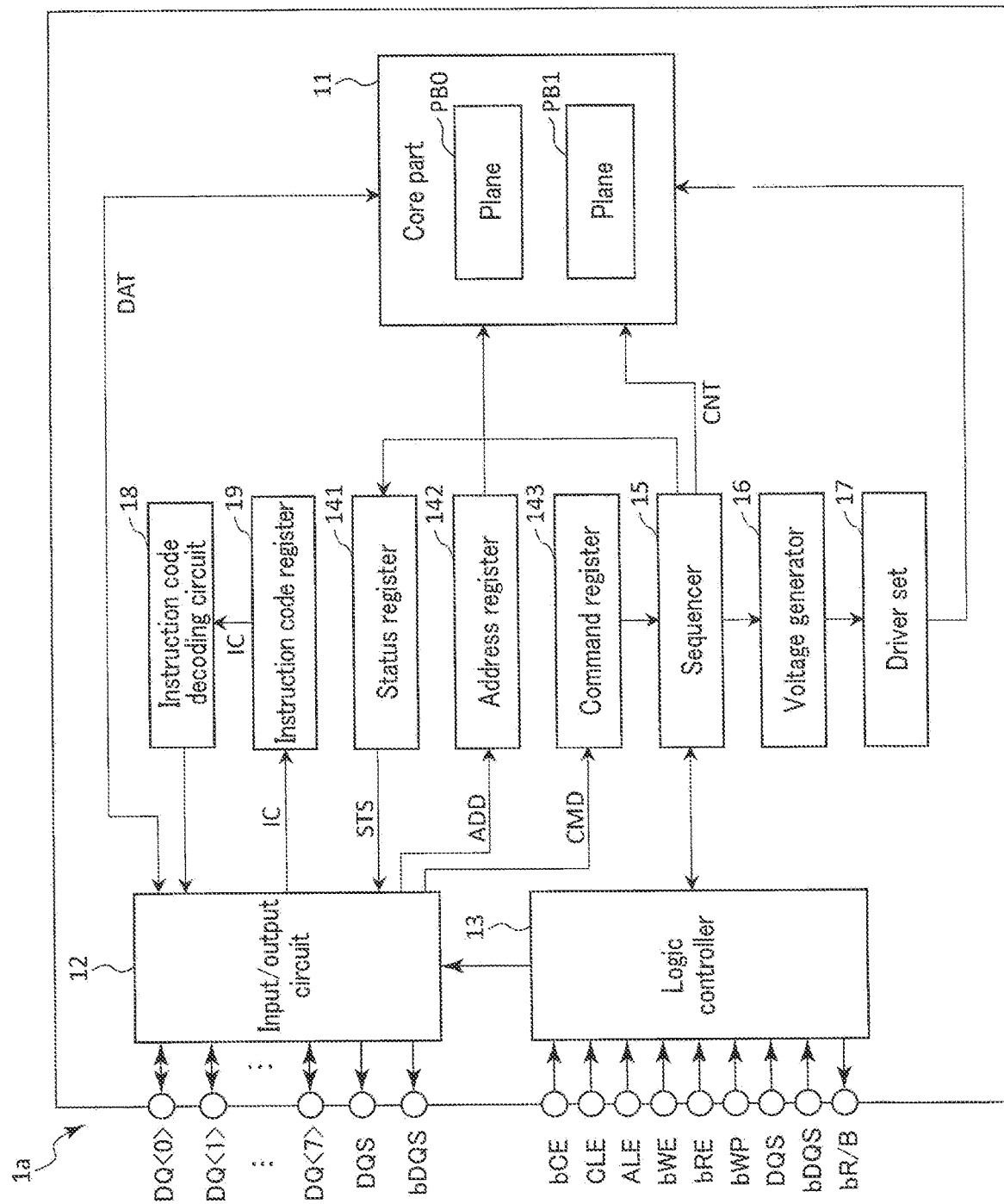
FIG. 26 is a block diagram showing an example of a configuration of a semiconductor memory device according to a second embodiment.

FIG. 26 is a block diagram showing an example of a configuration of the semiconductor memory device 1*a* according to the second embodiment.

The semiconductor memory device 1*a* includes, for example, an instruction code register 19 in addition to the configuration of the semiconductor memory device 1 according to the first embodiment.

The input/output circuit 12 receives an instruction code IC from the memory controller 2, and transfers the instruction code IC to the instruction code register 19 under control of, for example, the sequencer 15.

The instruction code register 19 retains the instruction code IC transferred from the input/output circuit 12. The instruction code register 19 can transfer the instruction code IC to the instruction code decoding circuit 18.

The instruction code decoding circuit 18 receives the instruction code IC from the instruction code register 19 and performs, based on the instruction code IC, the same processing as that described with reference to FIG. 2.

The descriptions of the configuration of the semiconductor memory device 1 with reference to FIGS. 3 to 9 apply to the configuration of the semiconductor memory device 1*a*, except that: the semiconductor memory device 1 is replaced with the semiconductor memory device 1*a*; instead of a data register DR, the instruction code register 19 retains an instruction code IC; and an instruction code IC is read from the instruction code register 19, instead of the data register DR. The descriptions of the operation of the semiconductor memory device 1 in the first embodiment apply to the operation of the semiconductor memory device 1a, except that the aforementioned similar replacements are made, and the command "80h" is replaced with, for example, a command "ZZh". The command "ZZh" is, for example, a command used for causing the instruction code register 19 to retain subsequent data. The semiconductor memory device 1a need not perform the operation of S11 described with reference to FIG. 14.

Described above is an example of the case where the command "ZZh" is used for transfer of an instruction code IC from the input/output circuit 12 to the instruction code register 19. However, the present embodiment is not limited to this. It is possible to have a command set CS include a prefix command before the command "80h", and to use the prefix command for the transfer. Alternatively, it is possible to first transfer an instruction code IC from the input/output circuit 12 to a data register DR, and then transfer the instruction code IC from the data register DR to the instruction code register 19. The transfer of an instruction code IC from the data register DR to the instruction code register 19 may be based on, for example, the command "XXh".

The semiconductor memory device 1a according to the second embodiment further produces the following advantageous effects.

The semiconductor memory device 1a according to the second embodiment causes the instruction code register 19 to retain an instruction code IC. The semiconductor memory device 1a sequentially executes operations based on the instruction code IC retained in the instruction code register 19. Each of these operations may be an operation involving an access to a plane PB, but not involving an access to the instruction code register 19. Therefore, these operations never cause corruption of the instruction code IC retained in the instruction code register 19. Accordingly, the semiconductor memory device 1a and/or memory controller 2 need not perform special control to prevent corruption of an instruction code IC. Namely, the semiconductor memory device 1a according to the second embodiment may facilitate system design.

In addition, the data bus for transfer of an information unit IU from the instruction code register 19 to the instruction code decoding circuit 18 is not used, for example, for an access to the core part 11 by the first control circuit 151 based on a command CMD. In such a case, the semiconductor memory device 1a may omit the operation of S11 in the example of FIG. 14. Accordingly, the semiconductor memory device 1a can shorten the wait time before reading an information unit IU. Thus, the semiconductor memory device 1a according to the second embodiment may be able to perform a higher-speed operation.

Other Embodiments

An example of the case where the semiconductor memory device sequentially executes operations based on an instruction code has been described. The semiconductor memory device can interrupt the operations. When interrupting the operations, information for identifying an information unit to be first processed after resuming the operations is retained.

The semiconductor memory device's operation to obtain various types of commands and the like from the information units in an instruction code and the configuration of each information unit are not limited to the above-described ones. For example, each information unit may be any information unit as long as the semiconductor memory device can operate based on a decoding result of the information unit. For example, the information unit may be an information unit that enables the semiconductor memory device to identify the existence of a program based on the decoding result. Address information that may be used for the program may be obtained from, for example, the information unit or a subsequent information unit.

Herein, the term "couple" refers to electrical coupling, and does not exclude intervention of another component.

Herein, expressions such as "the same", "match", "constant", and "maintain" are used with an intention of tolerating an error in a design range when the technique described in each embodiment is implemented. The same applies to the above expressions accompanied by "substantially", such as "substantially the same". Expressions such as a voltage being applied or supplied are used with an intention of including both control to apply or supply the voltage and actual application or supply of the voltage. Application or supply of a voltage may include application or supply of, for example, 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising a control circuit configured to:
receive a first command and execute, based on the first command, a first operation and a second operation, the second operation being executed after the first operation; and
output, from a start of the first operation to a start of the second operation, a first signal indicating that the semiconductor device is in a busy state in which the semiconductor device refrains from accepting, from an external controller, a second command for execution of the first operation and a third command for execution of the second operation.

2. The device according to claim 1, wherein
the control circuit is further configured to receive data, and
the first operation and the second operation are based on the data.

3. The device according to claim 2, wherein
the control circuit is further configured to receive a second signal indicating timing of transmission of a command or address information to the semiconductor device, and
while the data is being transmitted to the semiconductor device, the second signal indicates that a command or address information is not transmitted to the semiconductor device.

4. The device according to claim 2, wherein
the control circuit is further configured to receive a second signal indicating timing of presence of an input other than a command and address information to the semiconductor device, and while the data is being transmitted to the semiconductor device, the second signal indicates that an input other than a command and address information to the semiconductor device is present.

5. The device according to claim 1, wherein the second command differs from the third command.

6. The device according to claim 1, wherein the first command differs from the second command.

7. The device according to claim 1, wherein
the first command differs from both of the second command and the third command.

8. The device according to claim 1, wherein the control circuit is further configured to receive the second command, execute the first operation based on the second command, receive the third command, and execute the second operation based on the third command.

9. The device according to claim 1, further comprising a memory cell array, wherein
the first operation and the second operation target different blocks of the memory cell array.

10. The device according to claim 1, further comprising a memory cell array, wherein
the first operation and the second operation target different word lines of the memory cell array.

11. The device according to claim 1, wherein the control circuit is further configured to refrain from receiving a command from the controller from receipt of the first command to the start of the second operation.

12. The device according to claim 1, wherein
the control circuit is further configured to receive a second signal indicating timing of transmission of a command or address information to the semiconductor device, and
from the start of the first operation to the start of the second operation, the second signal indicates that a command or address information is not transmitted to the semiconductor device.

13. The device according to claim 1, wherein
the control circuit is further configured to receive a second signal indicating periods in which a command or address information is transmitted to the semiconductor device, and
from the start of the first operation to the start of the second operation, the second signal does not indicate a period in which a command or address information is transmitted to the semiconductor device.

14. The device according to claim 1, wherein
the control circuit is further configured to receive data, and obtain the third command based on the data while outputting the first signal, and
the execution of the second operation is based on the third command.

15. The device according to claim 1, wherein
the output of the first signal is started in response to the first command,
the control circuit is further configured to receive data, and obtain the second command based on the data while outputting the first signal, and
the execution of the first operation is based on the second command.

16. A system comprising:
a controller configured to output a first command; and
a semiconductor device configured to:
receive the first command and execute, based on the first command, a first operation and a second operation, the second operation being executed after the first operation; and
output, from a start of the first operation to a start of the second operation, a first signal to the controller, the first signal indicating that the semiconductor device is in a busy state in which the semiconductor device refrains from accepting, from the controller, a second command for execution of the first operation and a third command for execution of the second operation.

17. An operation control method executed by a semiconductor device, comprising:
receiving a first command;
executing a first operation based on the first command while outputting a first signal indicating that the semiconductor device is in a busy state; and
executing a second operation based on the first command after the first operation, wherein
while the semiconductor device is in the busy state, the semiconductor device refrains from accepting, from an external controller, a second command for execution of the first operation and a third command for execution of the second operation, and
the output of the first signal continues from a start of the first operation to a start of the second operation.

* * * * *